(12) United States Patent
Kim et al.

(10) Patent No.: US 9,891,283 B2
(45) Date of Patent: Feb. 13, 2018

(54) MULTI-BIT FLIP-FLOPS AND SCAN CHAIN CIRCUITS

(71) Applicant: Samsung Electronics Co., Ltd., Suwon-si, Gyeonggi-do (KR)

(72) Inventors: Min-Su Kim, Hwaseong-si (KR); Matthew Berzins, Hwaswung (KR); Jong-Woo Kim, Osan-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/281,998

(22) Filed: Sep. 30, 2016

(65) Prior Publication Data

US 2017/0016955 A1    Jan. 19, 2017

Related U.S. Application Data

(63) Continuation of application No. 14/622,531, filed on Feb. 13, 2015, now Pat. No. 9,473,117.

(51) Int. Cl.
| | |
|---|---|
| *G01R 31/3177* | (2006.01) |
| *H03K 19/21* | (2006.01) |
| *H03K 3/037* | (2006.01) |
| *G01R 31/3185* | (2006.01) |
| *H03K 3/3562* | (2006.01) |
| *G01R 31/317* | (2006.01) |

(52) U.S. Cl.
CPC ... *G01R 31/3177* (2013.01); *G01R 31/31723* (2013.01); *G01R 31/31727* (2013.01); *G01R 31/318541* (2013.01); *H03K 3/0372* (2013.01); *H03K 3/35625* (2013.01); *H03K 19/21* (2013.01)

(58) Field of Classification Search
CPC .......... G01R 31/3177; G01R 31/31723; G01R 31/31727; G01R 31/318541; H03K 3/0372; H03K 3/35625; H03K 19/21
USPC ................ 327/115, 116, 117, 118, 161, 185, 327/198–203, 208–218, 355–360; 377/47, 48
See application file for complete search history.

(56) References Cited

U.S. PATENT DOCUMENTS

| | | |
|---|---|---|
| 5,982,674 A | 11/1999 | Lines et al. |
| 6,242,957 B1 | 6/2001 | Uemura |

(Continued)

FOREIGN PATENT DOCUMENTS

| | | | |
|---|---|---|---|
| JP | 1999330917 A | 11/1999 | |
| JP | 2001127595 A | 5/2001 | |

(Continued)

*Primary Examiner* — Brandon S Cole
(74) *Attorney, Agent, or Firm* — Harness, Dickey & Pierce

(57) ABSTRACT

A multi-bit flip-flop includes a plurality of multi-bit flip-flop blocks that share a clock signal. Each of the multi-bit flip-flop blocks includes a single inverter and a plurality of flip-flops. The single inverter generates an inverted clock signal by inverting the clock signal. Each of the flip-flops includes a master latch part and a slave latch part and operates the master latch part and the slave latch part based on the clock signal and the inverted clock signal. Here, the flip-flops are triggered at rising edges of the clock signal. Thus, the multi-bit flip-flop operating as a master-slave flip-flop may minimize (or, reduce) power consumption occurring in a clock path through which the clock signal is transmitted.

19 Claims, 18 Drawing Sheets

(56) References Cited

U.S. PATENT DOCUMENTS

| | | | |
|---|---|---|---|
| 6,289,477 B1 * | 9/2001 | Gunadisastra | G01R 31/31854 324/750.3 |
| 6,304,123 B1 | 10/2001 | Bosshart | |
| 6,492,855 B1 | 12/2002 | Pasqualini | |
| 6,714,060 B2 | 3/2004 | Araki | |
| 7,391,250 B1 | 6/2008 | Chuang | |
| 7,443,218 B2 | 10/2008 | Onouchi et al. | |
| 7,539,915 B1 * | 5/2009 | Solt | G01R 31/31855 714/726 |
| 7,590,900 B2 | 9/2009 | Kim et al. | |
| 7,746,138 B2 | 6/2010 | Sekine et al. | |
| 8,471,597 B2 | 6/2013 | Wang et al. | |
| 8,908,449 B1 | 12/2014 | Ramaraju | |
| 2003/0160289 A1 | 8/2003 | Song et al. | |
| 2007/0280012 A1 | 12/2007 | Obayashi et al. | |
| 2008/0218235 A1 * | 9/2008 | Sekine | H03K 3/35625 327/212 |
| 2008/0297219 A1 | 12/2008 | Manohar et al. | |
| 2014/0070861 A1 | 3/2014 | Fujita | |
| 2015/0236676 A1 | 8/2015 | Cai et al. | |
| 2016/0097811 A1 | 4/2016 | Kim et al. | |

FOREIGN PATENT DOCUMENTS

| | | |
|---|---|---|
| JP | 3651659 B2 | 5/2005 |
| JP | 2008054275 A | 3/2008 |

* cited by examiner

MULTI-BIT FLIP-FLOPS AND SCAN CHAIN CIRCUITS

CROSS-REFERENCE TO RELATED APPLICATION(S)

This application is a Continuation application of U.S. application Ser. No. 14/622,531, filed Feb. 13, 2015, the entire contents of each of which are incorporated herein by reference.

BACKGROUND

1. Technical Field

Example embodiments relate generally to a logic circuit. More particularly, embodiments of the present inventive concepts relate to a multi-bit flip-flop that operates as a master-slave flip-flop and a scan chain circuit having a structure based on the multi-bit flip-flop.

2. Description of the Related Art

Recently, according to a mobile convergence trend, there is a rising interest on a low power technology for a mobile device (e.g., a smart phone, a smart pad, etc.). Generally, since the mobile device uses a limited power such as a battery, manufacturing (or, designing) the mobile device with low power chips including low power flip-flops is necessary as well as efficient power management for the mobile device to consume low power. A master-slave flip-flop has been used for a long time because a size of the master-slave flip-flop is relatively small and the mater-slave flip-flop has high reliability. However, since a conventional mater-slave flip-flop consumes much power in a clock path whenever a clock signal is toggled, the conventional mater-slave flip-flop cannot satisfy low power level that a recent mobile device of which an operating frequency is relatively high requires.

SUMMARY

Some example embodiments provide a multi-bit flip-flop capable of operating at low power by minimizing (or, reducing) power consumption occurring in a clock path through which a clock signal is transmitted (or, transferred), where the multi-bit flip-flop operates as a master-slave flip-flop.

Some example embodiments provide a scan chain circuit capable of facilitating a scan test to be efficiently performed for an integrated circuit including the scan chain circuit, where the scan chain circuit has a structure based on the multi-bit flip-flop.

According to an aspect of example embodiments, a multi-bit flip-flop may include a plurality of multi-bit flip-flop blocks configured to share a clock signal. Here, each of the multi-bit flip-flop blocks may include a single inverter configured to generate an inverted clock signal by inverting the clock signal, and a plurality of flip-flops each including a master latch part and a slave latch part and configured to operate the master latch part and the slave latch part based on the clock signal and the inverted clock signal, the flip-flops being triggered at rising edges of the clock signal.

In example embodiments, the flip-flops may include a first flip-flop and a second flip-flop, the first flip-flop may output a first input signal latched at the rising edges of the clock signal as a first output signal, and the second flip-flop may output a second input signal latched at the rising edges of the clock signal as a second output signal.

In example embodiments, the first flip-flop may include a first input tri-state inverter coupled to a first signal input terminal through which the first input signal is input and configured to invert the first input signal to output a first inverted input signal when the clock signal has a logic 'low' level and the inverted clock signal has a logic 'high' level, a first master inverter coupled to an output terminal of the first input tri-state inverter and configured to invert the first inverted input signal received from the first input tri-state inverter to output the first input signal, a first master latch tri-state inverter coupled between an output terminal of the first master inverter and the output terminal of the first input tri-state inverter and configured to invert the first input signal received from the first master inverter to output the first inverted input signal when the clock signal has the logic 'high' level and the inverted clock signal has the logic 'low' level, a first transmission gate coupled to the output terminal of the first master inverter and configured to transmit the first input signal received from the first master inverter when the clock signal has the logic 'high' level and the inverted clock signal has the logic 'low' level, a first slave inverter coupled to an output terminal of the first transmission gate and configured to invert the first input signal received from the first transmission gate to output the first inverted input signal, a first slave latch tri-state inverter coupled between an output terminal of the first slave inverter and the output terminal of the first transmission gate and configured to invert the first inverted input signal received from the first slave inverter to output the first input signal when the clock signal has the logic 'low' level and the inverted clock signal has the logic 'high' level, and a first output inverter coupled to the output terminal of the first slave inverter and configured to invert the first inverted input signal received from the first slave inverter to output the first input signal through a first signal output terminal as the first output signal.

In example embodiments, the second flip-flop may include a second input tri-state inverter coupled to a second signal input terminal through which the second input signal is input and configured to invert the second input signal to output a second inverted input signal when the clock signal has the logic 'low' level and the inverted clock signal has the logic 'high' level, a second master inverter coupled to an output terminal of the second input tri-state inverter and configured to invert the second inverted input signal received from the second input tri-state inverter to output the second input signal, a second master latch tri-state inverter coupled between an output terminal of the second master inverter and the output terminal of the second input tri-state inverter and configured to invert the second input signal received from the second master inverter to output the second inverted input signal when the clock signal has the logic 'high' level and the inverted clock signal has the logic 'low' level, a second transmission gate coupled to the output terminal of the second master inverter and configured to transmit the second input signal received from the second master inverter when the clock signal has the logic 'high' level and the inverted clock signal has the logic 'low' level, a second slave inverter coupled to an output terminal of the second transmission gate and configured to invert the second input signal received from the second transmission gate to output the second inverted input signal, a second slave latch tri-state inverter coupled between an output terminal of the second slave inverter and the output terminal of the second transmission gate and configured to invert the second inverted input signal received from the second slave inverter to output the second input signal when the clock signal has the logic 'low' level and the inverted clock signal has the logic 'high' level, and a second output inverter coupled to the output terminal of the second slave inverter and configured to invert the second inverted input signal received from the second slave inverter to output the second input signal through a second signal output terminal as the second output signal.

In example embodiments, the first flip-flop may include a reset function that resets the first output signal to have the logic 'low' level in response to a reset signal input through a reset terminal, and the second flip-flop may include a reset function that resets the second output signal to have the logic 'low' level in response to the reset signal input through the reset terminal.

In example embodiments, the first flip-flop may include a first input tri-state inverter coupled to a first signal input terminal through which the first input signal is input and configured to invert the first input signal to output a first inverted input signal when the clock signal has the logic 'low' level and the inverted clock signal has the logic 'high' level, a first logical XOR element coupled to the reset terminal and an output terminal of the first input tri-state inverter and configured to output a first operation signal by performing a logical XOR operation between the first inverted input signal received from the first input tri-state inverter and the reset signal input through the reset terminal, a first master latch tri-state inverter coupled between an output terminal of the first logical XOR element and the output terminal of the first input tri-state inverter and configured to invert the first operation signal received from the first logical XOR element to output a first inverted operation signal corresponding to the first inverted input signal when the clock signal has the logic 'high' level and the inverted clock signal has the logic 'low' level, a first transmission gate coupled to the output terminal of the first logical XOR element and configured to transmit the first operation signal received from the first logical XOR element when the clock signal has the logic 'high' level and the inverted clock signal has the logic 'low' level, a first slave inverter coupled to an output terminal of the first transmission gate and configured to invert the first operation signal received from the first transmission gate to output the first inverted operation signal, a first slave latch-reset tri-state inverter coupled between an output terminal of the first slave inverter and the output terminal of the first transmission gate, configured to invert the first inverted operation signal received from the first slave inverter to output the first operation signal when the reset signal has the logic 'low' level, the clock signal has the logic 'low' level, and the inverted clock signal has the logic 'high' level, and configured to reset the first operation signal to have the logic 'low' level when the reset signal has the logic 'high' level, and a first output inverter coupled to the output terminal of the first slave inverter and configured to invert the first inverted operation signal received from the first slave inverter to output the first operation signal through a first signal output terminal as the first output signal.

In example embodiments, the second flip-flop may include a second input tri-state inverter coupled to a second signal input terminal through which the second input signal is input and configured to invert the second input signal to output a second inverted input signal when the clock signal has the logic 'low' level and the inverted clock signal has the logic 'high' level, a second logical XOR element coupled to the reset terminal and an output terminal of the second input tri-state inverter and configured to output a second operation signal by performing a logical XOR operation between the second inverted input signal received from the second input tri-state inverter and the reset signal input through the reset terminal, a second master latch tri-state inverter coupled between an output terminal of the second logical XOR element and the output terminal of the second input tri-state inverter and configured to invert the second operation signal received from the second logical XOR element to output a second inverted operation signal corresponding to the second inverted input signal when the clock signal has the logic 'high' level and the inverted clock signal has the logic 'low' level, a second transmission gate coupled to the output terminal of the second logical XOR element and configured to transmit the second operation signal received from the second logical XOR element when the clock signal has the logic 'high' level and the inverted clock signal has the logic 'low' level, a second slave inverter coupled to an output terminal of the second transmission gate and configured to invert the second operation signal received from the second transmission gate to output the second inverted operation signal, a second slave latch-reset tri-state inverter coupled between an output terminal of the second slave inverter and the output terminal of the second transmission gate, configured to invert the second inverted operation signal received from the second slave inverter to output the second operation signal when the reset signal has the logic 'low' level, the clock signal has the logic 'low' level, and the inverted clock signal has the logic 'high' level, and configured to reset the second operation signal to have the logic 'low' level when the reset signal has the logic 'high' level, and a second output inverter coupled to the output terminal of the second slave inverter and configured to invert the second inverted operation signal received from the second slave inverter to output the second operation signal through a second signal output terminal as the second output signal.

In example embodiments, the first flip-flop may include a set function that sets the first output signal to have the logic 'high' level in response to an inverted set signal input through a set terminal, and the second flip-flop may include a set function that sets the second output signal to have the logic 'high' level in response to the inverted set signal input through the set terminal.

In example embodiments, the first flip-flop may include a first input tri-state inverter coupled to a first signal input terminal through which the first input signal is input and configured to invert the first input signal to output a first inverted input signal when the clock signal has the logic 'low' level and the inverted clock signal has the logic 'high' level, a first logical NAND element coupled to the set terminal and an output terminal of the first input tri-state inverter and configured to output a first operation signal by performing a logical NAND operation between the first inverted input signal received from the first input tri-state inverter and the inverted set signal input through the set terminal, a first master latch tri-state inverter coupled between an output terminal of the first logical NAND element and the output terminal of the first input tri-state inverter and configured to invert the first operation signal received from the first logical NAND element to output a first inverted operation signal corresponding to the first inverted input signal when the clock signal has the logic 'high' level and the inverted clock signal has the logic 'low' level, a first transmission gate coupled to the output terminal of the first logical NAND element and configured to transmit the first operation signal received from the first logical NAND element when the clock signal has the logic 'high' level and the inverted clock signal has the logic 'low' level, a first slave inverter coupled to an output terminal of the first transmission gate and configured to invert the first operation signal received from the first transmission gate to output the first inverted operation signal, a first slave latch-set tri-state inverter coupled between an output terminal of the first slave inverter and the output terminal of the first transmission gate, configured to invert the first inverted operation signal received from the first slave inverter to output the first operation signal when the inverted set signal has the logic 'high' level, the clock signal has the logic 'low' level, and the inverted clock signal has the logic 'high' level, and configured to set the first operation signal to have the logic 'high' level when the inverted set signal has the logic 'low' level, and a first output inverter coupled to the output terminal of the first slave inverter and configured to invert the first inverted operation signal received from the first slave inverter to output the first operation signal through a first signal output terminal as the first output signal.

In example embodiments, the second flip-flop may include a second input tri-state inverter coupled to a second signal input terminal through which the second input signal is input and configured to invert the second input signal to output a second inverted input signal when the clock signal has the logic 'low' level and the inverted clock signal has the logic 'high' level, a second logical NAND element coupled to the set terminal and an output terminal of the second input tri-state inverter and configured to output a second operation signal by performing a logical NAND operation between the second inverted input signal received from the second input tri-state inverter and the inverted set signal input through the set terminal, a second master latch tri-state inverter coupled between an output terminal of the second logical NAND element and the output terminal of the second input tri-state inverter and configured to invert the second operation signal received from the second logical NAND element to output a second inverted operation signal corresponding to the second inverted input signal when the clock signal has the logic 'high' level and the inverted clock signal has the logic 'low' level, a second transmission gate coupled to the output terminal of the second logical NAND element and configured to transmit the second operation signal received from the second logical NAND element when the clock signal has the logic 'high' level and the inverted clock signal has the logic 'low' level, a second slave inverter coupled to an output terminal of the second transmission gate and configured to invert the second operation signal received from the second transmission gate to output the second inverted operation signal, a second slave latch-set tri-state inverter coupled between an output terminal of the second slave inverter and the output terminal of the second transmission gate, configured to invert the second inverted operation signal received from the second slave inverter to output the second operation signal when the inverted set signal has the logic 'high' level, the clock signal has the logic 'low' level, and the inverted clock signal has the logic 'high' level, and configured to set the second operation signal to have the logic 'high' level when the inverted set signal has the logic 'low' level, and a second output inverter coupled to the output terminal of the second slave inverter and configured to invert the second inverted operation signal received from the second slave inverter to output the second operation signal through a second signal output terminal as the second output signal.

According to another aspect of example embodiments, a scan chain circuit may include a plurality of multi-bit flip-flop blocks configured to share a clock signal. Here, each of the multi-bit flip-flop blocks may include a single inverter configured to generate an inverted clock signal by inverting the clock signal, and a plurality of flip-flops each including a multiplexer part, a master latch part, and a slave latch part and configured to operate the master latch part and the slave latch part based on the clock signal and the inverted clock signal, the flip-flops being triggered at rising edges of the clock signal.

In example embodiments, the flip-flops may include a first flip-flop and a second flip-flop, the first flip-flop may output a first input signal or a first scan test signal latched at the rising edges of the clock signal as a first output signal, and the second flip-flop may output a second input signal or a second scan test signal latched at the rising edges of the clock signal as a second output signal.

In example embodiments, the first flip-flop may include a selection inverter coupled to a scan enable signal input terminal through which a scan enable signal is input and configured to invert the scan enable signal to output an inverted scan enable signal, a first input tri-state inverter coupled to a first signal input terminal through which the first input signal is input and configured to invert the first input signal to output a first inverted input signal when the scan enable signal has a logic 'low' level and the inverted scan enable signal has a logic 'high' level, a first scan tri-state inverter coupled to a first scan input terminal through which the first scan test signal is input and configured to invert the first scan test signal to output a first inverted scan test signal when the scan enable signal has the logic 'high' level and the inverted scan enable signal has the logic 'low' level, a first multiplexing transmission gate coupled to an output terminal of the first input tri-state inverter and an output terminal of the first scan tri-state inverter and configured to transmit the first inverted input signal or the first inverted scan test signal as a first multiplexing signal when the clock signal has the logic 'low' level and the inverted clock signal has the logic 'high' level, a first master inverter coupled to an output terminal of the first multiplexing transmission gate and configured to invert the first multiplexing signal received from the first multiplexing transmission gate to output a first inverted multiplexing signal, a first master latch tri-state inverter coupled between an output terminal of the first master inverter and the output terminal of the first multiplexing transmission gate and configured to invert the first inverted multiplexing signal received from the first master inverter to output the first multiplexing signal when the clock signal has the logic 'high' level and the inverted clock signal has the logic 'low' level, a first transmission gate coupled to the output terminal of the first master inverter and configured to transmit the first inverted multiplexing signal received from the first master inverter when the clock signal has the logic 'high' level and the inverted clock signal has the logic 'low' level, a first slave inverter coupled to an output terminal of the first transmission gate and configured to invert the first inverted multiplexing signal received from the first transmission gate to output the first multiplexing signal, a first slave latch tri-state inverter coupled between an output terminal of the first slave inverter and the output terminal of the first transmission gate and configured to invert the first multiplexing signal received from the first slave inverter to output the first inverted multiplexing signal when the clock signal has the logic 'low' level and the inverted clock signal has the logic 'high' level, and a first output inverter coupled to the output terminal of the first slave inverter and configured to invert the first multiplexing signal received from the first slave inverter to output the first inverted multiplexing signal through a first signal output terminal as the first output signal.

In example embodiments, the second flip-flop may include a second input tri-state inverter coupled to a second signal input terminal through which the second input signal is input and configured to invert the second input signal to output a second inverted input signal when the scan enable signal has the logic 'low' level and the inverted scan enable signal has the logic 'high' level, a second scan tri-state inverter coupled to a second scan input terminal through which the second scan test signal is input and configured to invert the second scan test signal to output a second inverted scan test signal when the scan enable signal has the logic 'high' level and the inverted scan enable signal has the logic 'low' level, a second multiplexing transmission gate coupled to an output terminal of the second input tri-state inverter and an output terminal of the second scan tri-state inverter and configured to transmit the second inverted input signal or the second inverted scan test signal as a second multiplexing signal when the clock signal has the logic 'low' level and the inverted clock signal has the logic 'high' level, a second master inverter coupled to an output terminal of the second multiplexing transmission gate and configured to invert the second multiplexing signal received from the second multiplexing transmission gate to output a second inverted multiplexing signal, a second master latch tri-state inverter coupled between an output terminal of the second master inverter and the output terminal of the second multiplexing transmission gate and configured to invert the second inverted multiplexing signal received from the second master inverter to output the second multiplexing signal when the clock signal has the logic 'high' level and the inverted clock signal has the logic 'low' level, a second transmission gate coupled to the output terminal of the second master inverter and configured to transmit the second inverted multiplexing signal received from the second master inverter when the clock signal has the logic 'high' level and the inverted clock signal has the logic 'low' level, a second slave inverter coupled to an output terminal of the second transmission gate and configured to invert the second inverted multiplexing signal received from the second transmission gate to output the second multiplexing signal, a second slave latch tri-state inverter coupled between an output terminal of the second slave inverter and the output terminal of the second transmission gate and configured to invert the second multiplexing signal received from the second slave inverter to output the second inverted multiplexing signal when the clock signal has the logic 'low' level and the inverted clock signal has the logic 'high' level, and a second output inverter coupled to the output terminal of the second slave inverter and configured to invert the second multiplexing signal received from the second slave inverter to output the second inverted multiplexing signal through a second signal output terminal as the second output signal.

In example embodiments, the second flip-flop may include a second input tri-state inverter coupled to a second signal input terminal through which the second input signal is input and configured to invert the second input signal to output a second inverted input signal when the scan enable signal has the logic 'low' level and the inverted scan enable signal has the logic 'high' level, a second scan transmission gate configured to output a connection signal corresponding to the first output signal or a first inverted output signal generated by inverting the first output signal when the scan enable signal has the logic 'high' level and the inverted scan enable signal has the logic 'low' level, a second multiplexing transmission gate coupled to an output terminal of the second input tri-state inverter and an output terminal of the second scan transmission gate and configured to transmit the second inverted input signal or the connection signal as a second multiplexing signal when the clock signal has the logic 'low' level and the inverted clock signal has the logic 'high' level, a second master inverter coupled to an output terminal of the second multiplexing transmission gate and configured to invert the second multiplexing signal received from the second multiplexing transmission gate to output a second inverted multiplexing signal, a second master latch tri-state inverter coupled between an output terminal of the second master inverter and the output terminal of the second multiplexing transmission gate and configured to invert the second inverted multiplexing signal received from the second master inverter to output the second multiplexing signal when the clock signal has the logic 'high' level and the inverted clock signal has the logic 'low' level, a second transmission gate coupled to the output terminal of the second master inverter and configured to transmit the second inverted multiplexing signal received from the second master inverter when the clock signal has the logic 'high' level and the inverted clock signal has the logic 'low' level, a second slave inverter coupled to an output terminal of the second transmission gate and configured to invert the second inverted multiplexing signal received from the second transmission gate to output the second multiplexing signal, a second slave latch tri-state inverter coupled between an output terminal of the second slave inverter and the output terminal of the second transmission gate and configured to invert the second multiplexing signal received from the second slave inverter to output the second inverted multiplexing signal when the clock signal has the logic 'low' level and the inverted clock signal has the logic 'high' level, and a second output inverter coupled to the output terminal of the second slave inverter and configured to invert the second multiplexing signal received from the second slave inverter to output the second inverted multiplexing signal through a second signal output terminal as the second output signal.

According to another aspect of example embodiments, a scan chain circuit may include a plurality of multi-bit flip-flop blocks configured to share a clock signal. Here, each of the multi-bit flip-flop blocks may include a single inverter configured to generate an inverted clock signal by inverting the clock signal, a first flip-flop including a first multiplexer part, a first master latch part, and a first slave latch part and configured to operate the first master latch part and the first slave latch part based on the clock signal and the inverted clock signal, the first flip-flop being triggered at rising edges of the clock signal, and a second flip-flop including a second master latch part and a second slave latch part and configured to operate the second master latch part and the second slave latch part based on the clock signal and the inverted clock signal, the second flip-flop being triggered at the rising edges of the clock signal.

In example embodiments, the first flip-flop may output a first input signal or a first scan test signal latched at the rising edges of the clock signal as a first output signal, and the second flip-flop may output the first output signal or a first inverted output signal latched at the rising edges of the clock signal as a second output signal, the first inverted output signal being generated by inverting the first output signal.

In example embodiments, the first flip-flop may be directly coupled to the second flip-flop or may be coupled to the second flip-flop via at least one buffer or at least one inverter located between the first flip-flop and the second flip-flop.

In example embodiments, the first flip-flop may include a selection inverter coupled to a scan enable signal input terminal through which a scan enable signal is input and configured to invert the scan enable signal to output an inverted scan enable signal, a first input tri-state inverter coupled to a first signal input terminal through which the first input signal is input and configured to invert the first input signal to output a first inverted input signal when the scan enable signal has a logic 'low' level and the inverted scan enable signal has a logic 'high' level, a first scan tri-state inverter coupled to a first scan input terminal through which the first scan test signal is input and configured to invert the first scan test signal to output a first inverted scan test signal when the scan enable signal has the logic 'high' level and the inverted scan enable signal has the logic 'low' level, a first multiplexing transmission gate coupled to an output terminal of the first input tri-state inverter and an output terminal of the first scan tri-state inverter and configured to transmit the first inverted input signal or the first inverted scan test signal as a first multiplexing signal when the clock signal has the logic 'low' level and the inverted clock signal has the logic 'high' level, a first master inverter coupled to an output terminal of the first multiplexing transmission gate and configured to invert the first multiplexing signal received from the first multiplexing transmission gate to output a first inverted multiplexing signal, a first master latch tri-state inverter coupled between an output terminal of the first master inverter and the output terminal of the first multiplexing transmission gate and configured to invert the first inverted multiplexing signal received from the first master inverter to output the first multiplexing signal when the clock signal has the logic 'high' level and the inverted clock signal has the logic 'low' level, a first transmission gate coupled to the output terminal of the first master inverter and configured to transmit the first inverted multiplexing signal received from the first master inverter when the clock signal has the logic 'high' level and the inverted clock signal has the logic 'low' level, a first slave inverter coupled to an output terminal of the first transmission gate and configured to invert the first inverted multiplexing signal received from the first transmission gate to output the first multiplexing signal, a first slave latch tri-state inverter coupled between an output terminal of the first slave inverter and the output terminal of the first transmission gate and configured to invert the first multiplexing signal received from the first slave inverter to output the first inverted multiplexing signal when the clock signal has the logic 'low' level and the inverted clock signal has the logic 'high' level, and a first output inverter coupled to the output terminal of the first slave inverter and configured to invert the first multiplexing signal received from the first slave inverter to output the first inverted multiplexing signal through a first signal output terminal as the first output signal.

In example embodiments, the second flip-flop may include a second connection tri-state inverter configured to invert a connection signal corresponding to the first output signal or the first inverted output signal to output an inverted connection signal when the clock signal has the logic 'low' level and the inverted clock signal has the logic 'high' level, a second master inverter coupled to an output terminal of the second connection tri-state inverter and configured to invert the inverted connection signal received from the second connection tri-state inverter to output the connection signal, a second master latch tri-state inverter coupled between an output terminal of the second master inverter and the output terminal of the second connection tri-state inverter and configured to invert the connection signal received from the second master inverter to output the inverted connection signal when the clock signal has the logic 'high' level and the inverted clock signal has the logic 'low' level, a second transmission gate coupled to the output terminal of the second master inverter and configured to transmit the connection signal received from the second master inverter when the clock signal has the logic 'high' level and the inverted clock signal has the logic 'low' level, a second slave inverter coupled to an output terminal of the second transmission gate and configured to invert the connection signal received from the second transmission gate to output the inverted connection signal, a second slave latch tri-state inverter coupled between an output terminal of the second slave inverter and the output terminal of the second transmission gate and configured to invert the inverted connection signal received from the second slave inverter to output the connection signal when the clock signal has the logic 'low' level and the inverted clock signal has the logic 'high' level, and a second output inverter coupled to the output terminal of the second slave inverter and configured to invert the inverted connection signal received from the second slave inverter to output the connection signal through a second signal output terminal as the second output signal.

Therefore, a multi-bit flip-flop according to example embodiments may minimize (or, reduce) power consumption occurring in a clock path through which a clock signal is transmitted (or, transferred) by including multi-bit flip-flop blocks each including a single inverter that inverts the clock signal to generate an inverted clock signal and a plurality of flip-flops that are triggered at rising edges of the clock signal, where each of the flip-flops includes a master latch part and a slave latch part, and by controlling the multi-bit flip-flop blocks to share the clock signal. As a result, the multi-bit flip-flop may operate as a master-slave flip-flop at low power.

In addition, a scan chain circuit according to example embodiments may facilitate a scan test to be efficiently performed for an integrated circuit including the scan chain circuit, where the scan chain circuit has a structure based on the multi-bit flip-flop.

BRIEF DESCRIPTION OF THE DRAWINGS

Illustrative, non-limiting example embodiments will be more clearly understood from the following detailed description in conjunction with the accompanying drawings.

DETAILED DESCRIPTION OF EXAMPLE EMBODIMENTS

Figure 1:
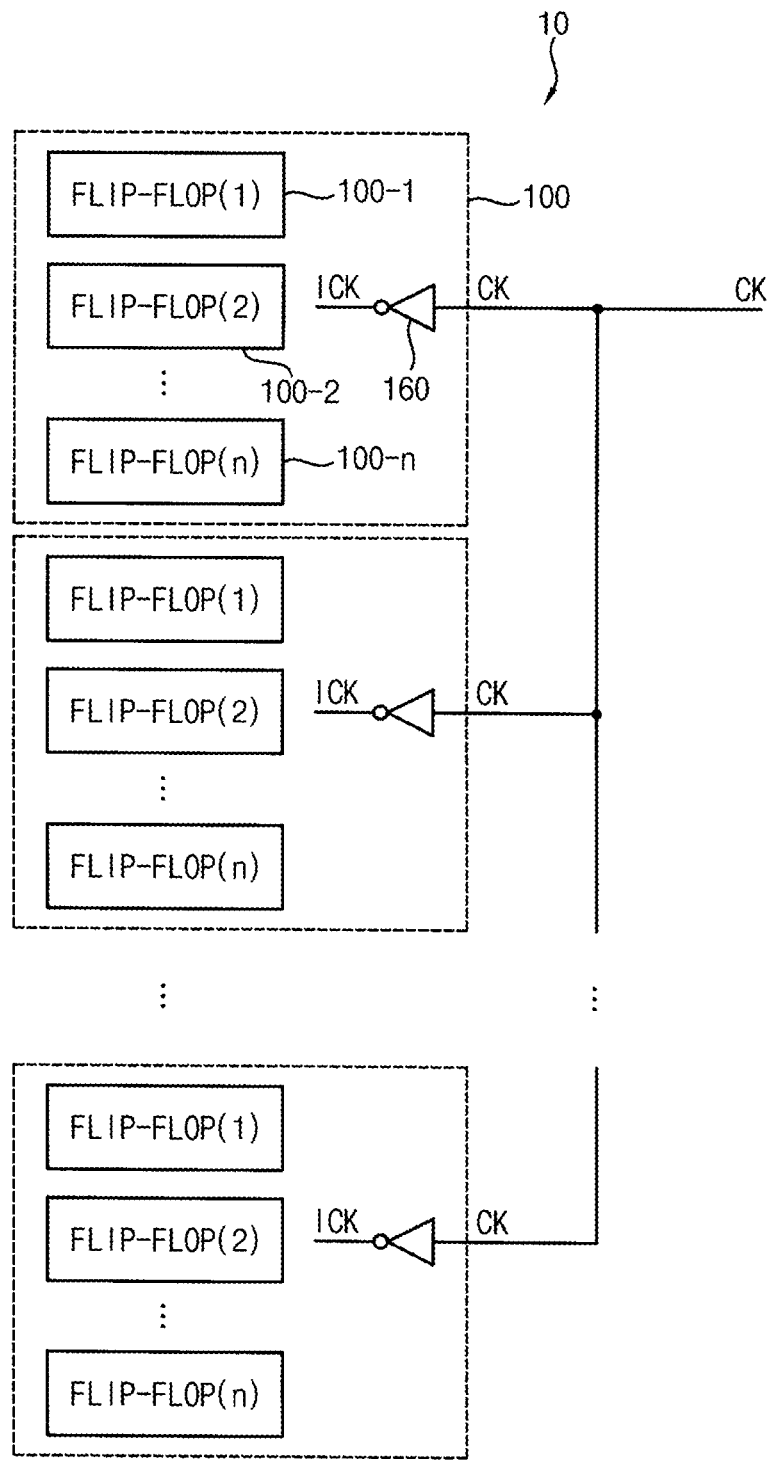
FIG. 1 is a block diagram illustrating a multi-bit flip-flop according to example embodiments.

Various example embodiments will be described more fully with reference to the accompanying drawings, in which some example embodiments are shown. The present inventive concepts may, however, be embodied in many different forms and should not be construed as limited to the example embodiments set forth herein. Rather, these example embodiments are provided so that this disclosure will be thorough and complete, and will fully convey the scope of the present inventive concepts to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments and is not intended to be limiting of the inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
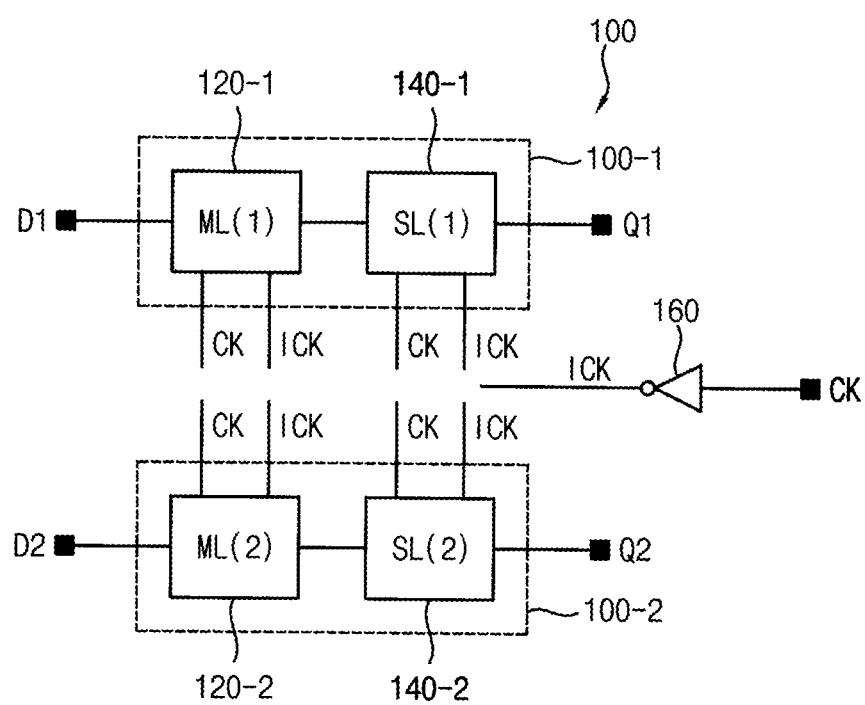
FIG. 2 is a block diagram for describing a multi-bit flip-flop block included in the multi-bit flip-flop of FIG. 1.

FIG. 1 is a block diagram illustrating a multi-bit flip-flop according to example embodiments. FIG. 2 is a block diagram for describing a multi-bit flip-flop block included in the multi-bit flip-flop of FIG. 1.

Referring to FIGS. 1 and 2, the multi-bit flip-flop 10 may include a plurality of multi-bit flip-flop blocks 100 that share a clock signal CK. Here, each of the multi-bit flip-flop blocks 100 may include a single inverter 160 and first through (n)th flip-flops 100-1 through 100-n, where n is an integer greater than or equal to 2. As illustrated in FIG. 1, each of the first through (n)th flip-flops 100-1 through 100-n may be coupled to the single inverter 160. In addition, each of the first through (n)th flip-flops 100-1 through 100-n may receive the clock signal CK and an inverted clock signal ICK that is generated by inverting the clock signal CK. Here, the first through (n)th flip-flops 100-1 through 100-n may output first through (n)th input signals D1 through Dn latched at rising edges of the clock signal CK (i.e., at falling edges of the inverted clock signal ICK) as first through (n)th output signals Q1 through Qn, respectively. That is, the first through (n)th flip-flops 100-1 through 100-n may be triggered at the rising edges of the clock signal CK. Hereinafter, as illustrated in FIG. 2, for convenience of description, it is assumed that the multi-bit flip-flop block 100 includes the single inverter 160, the first flip-flop 100-1, and the second flip-flop 100-2 (i.e., 2-bit flip-flop block).

The first flip-flop 100-1 may include a first master latch part 120-1 and a first slave latch part 140-1. The first flip-flop 100-1 may operate the first master latch part 120-1 and the first slave latch part 140-1 based on the clock signal CK and the inverted clock signal ICK. As illustrated in FIG. 2, the first master latch part 120-1 and the first slave latch part 140-1 may receive the clock signal CK and the inverted clock signal ICK. In addition, the first master latch part 120-1 and the first slave latch part 140-1 may be controlled by the clock signal CK and the inverted clock signal ICK. Here, the first master latch part 120-1 may include at least one inverter, at least one tri-state inverter, and/or at least one transmission gate, and the first slave latch part 140-1 may include at least one inverter, at least one tri-state inverter, and/or at least one transmission gate. Thus, the first master latch part 120-1 and the first slave latch part 140-1 may operate in a way that the tri-state inverter and/or the transmission gate are controlled by the clock signal CK and the inverted clock signal ICK. Specifically, the first master latch part 120-1 may latch the first input signal D1 at the rising edges of the clock signal CK (i.e., at the falling edges of the inverted clock signal ICK) to transmit a transmission signal corresponding to the first input signal D1 to the first slave latch part 140-1, and the first slave latch part 140-1 may latch the transmission signal transmitted from the first master latch part 120-1 to output the first output signal Q1 based on the latched transmission signal. In other words, the first flip-flop 100-1 may be triggered at the rising edges of the clock signal CK. In an example embodiment, the first flip-flop 100-1 may include a reset function that resets the first output signal Q1 to have a first logic level (e.g., a logic 'low' level). In another example embodiment, the first flip-flop 100-1 may include a set function that sets the first output signal Q1 to have a second logic level (e.g., a logic 'high' level). In still another example embodiment, the first flip-flop 100-1 may include the reset function that resets the first output signal Q1 to have the first logic level and the set function that sets the first output signal Q1 to have the second logic level. In some example embodiments, the first flip-flop 100-1 may include other functions. For example, the first flip-flop 100-1 may include a retention function that retains (or, maintains) data.

The second flip-flop 100-2 may include a second master latch part 120-2 and a second slave latch part 140-2. The second flip-flop 100-2 may operate the second master latch part 120-2 and the second slave latch part 140-2 based on the clock signal CK and the inverted clock signal ICK. As illustrated in FIG. 2, the second master latch part 120-2 and the second slave latch part 140-2 may receive the clock signal CK and the inverted clock signal ICK. In addition, the second master latch part 120-2 and the second slave latch part 140-2 may be controlled by the clock signal CK and the inverted clock signal ICK. Here, the second master latch part 120-2 may include at least one inverter, at least one tri-state inverter, and/or at least one transmission gate, and the second slave latch part 140-2 may include at least one inverter, at least one tri-state inverter, and/or at least one transmission gate. Thus, the second master latch part 120-2 and the second slave latch part 140-2 may operate in a way that the tri-state inverter and/or the transmission gate are controlled by the clock signal CK and the inverted clock signal ICK. Specifically, the second master latch part 120-2 may latch the second input signal D2 at the rising edges of the clock signal CK (i.e., at the falling edges of the inverted clock signal ICK) to transmit a transmission signal corresponding to the second input signal D2 to the second slave latch part 140-2, and the second slave latch part 140-2 may latch the transmission signal transmitted from the second master latch part 120-2 to output the second output signal Q2 based on the latched transmission signal. In other words, the second flip-flop 100-2 may be triggered at the rising edges of the clock signal CK. In an example embodiment, the second flip-flop 100-2 may include a reset function that resets the second output signal Q2 to have a first logic level (e.g., a logic 'low' level). In another example embodiment, the second flip-flop 100-2 may include a set function that sets the second output signal Q2 to have a second logic level (e.g., a logic 'high' level). In still another example embodiment, the second flip-flop 100-2 may include the reset function that resets the second output signal Q2 to have the first logic level and the set function that sets the second output signal Q2 to have the second logic level. In some example embodiments, the second flip-flop 100-2 may include other functions. For example, the second flip-flop 100-2 may include a retention function that retains (or, maintains) data.

The single inverter 160 may invert the clock signal CK to generate the inverted clock signal ICK and may provide the clock signal CK and the inverted clock signal ICK to the first flip-flop 100-1 and the second flip-flop 100-2. Since the multi-bit flip-flop block 100 has a structure including only the single inverter 160, the multi-bit flip-flop 10 may reduce power consumption compared to a conventional multi-bit flip-flop that has a structure including a plurality of inverters, where the power consumption occurs in a clock path including the inverters as the inverters operate whenever the clock signal CK transmitted through the clock path is changed from a logic 'low' level to a logic 'high' level or from a logic 'high' level to a logic 'low' level (i.e., toggled). That is, since power consumption of the multi-bit flip-flop 10 increases less than that of the conventional multi-bit flip-flop as an operating frequency (e.g., a frequency of the clock signal CK) increases, the multi-bit flip-flop 10 may satisfy low power level that a recent mobile device of which the operating frequency is relatively high requires. As described above, the flip-flops 100-1 through 100-n included in the multi-bit flip-flop block 100 (e.g., the first flip-flop 100-1 and the second flip-flop 100-2 in FIG. 2) may have the same structure. Thus, the flip-flops 100-1 through 100-n included in the multi-bit flip-flop block 100 may be controlled based on the clock signal CK and the inverted clock signal ICK provided from the single inverter 160. Here, the flip-flops 100-1 through 100-n included in the multi-bit flip-flop block 100 may be triggered at the rising edges of the clock signal CK (i.e., at the falling edges of the inverted clock signal ICK). As a result, the first master latch part 120-1 included in the first flip-flop 100-1 and the second master latch part 120-2 included in the second flip-flop 100-2 may be in a lock-state when the clock signal CK has a logic 'high' level and may be in a pass-state when the clock signal CK has a logic 'low' level. In addition, the first slave latch part 140-1 included in the first flip-flop 100-1 and the second slave latch part 140-2 included in the second flip-flop 100-2 may be in a pass-state when the clock signal CK has a logic 'high' level and may be in a lock-state when the clock signal CK has a logic 'low' level.

In brief, the multi-bit flip-flop 10 may minimize (or, reduce) power consumption occurring in a clock path through which the clock signal CK is transmitted (or, transferred) by including the multi-bit flip-flop blocks 100 each including the single inverter 160 that inverts the clock signal CK to generate the inverted clock signal ICK and the flip-flops 100-1 through 100-n that are triggered at the rising edges of the clock signal CK, where each of the flip-flops 100-1 through 100-n includes the master latch part 120-1 through 120-n and the slave latch part 140-1 through 140-n, and by controlling the multi-bit flip-flop blocks 100 to share the clock signal CK. As a result, the multi-bit flip-flop 10 may operate as a master-slave flip-flop at low power. In addition, since the multi-bit flip-flop 10 operates at low power, the multi-bit flip-flop 10 may be applied to low power and high performance chips for low power and high performance mobile devices.

Figure 3:
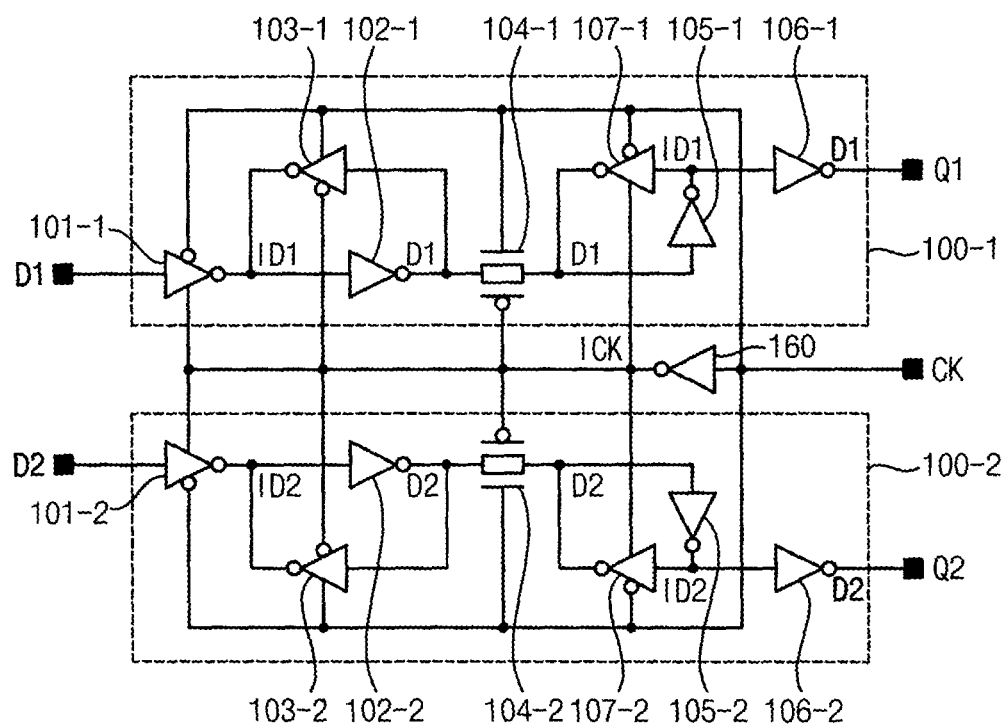
FIG. 3 is a diagram illustrating an example of the multi-bit flip-flop block of FIG. 2.
Figure 4:
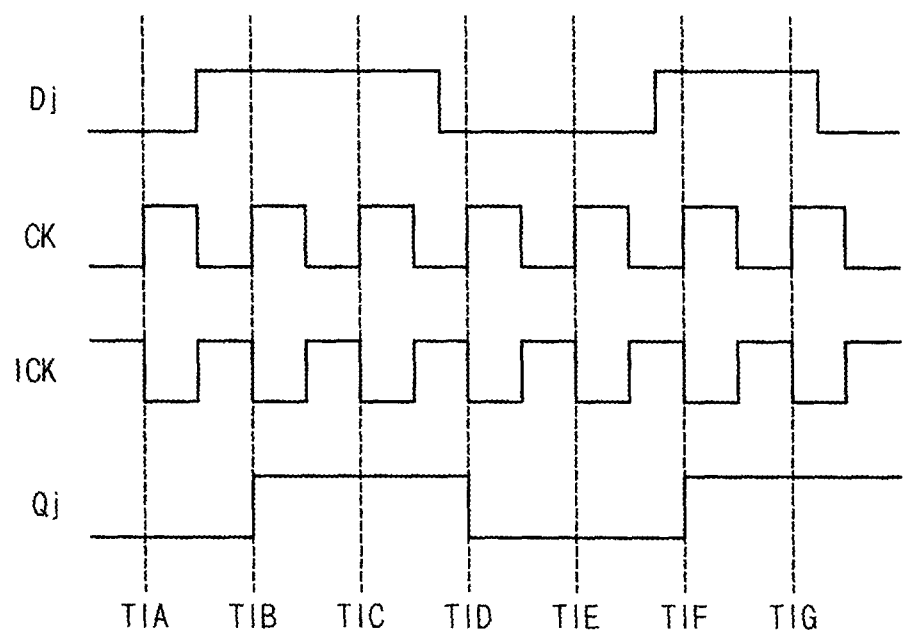
FIG. 4 is a timing diagram illustrating an example in which the multi-bit flip-flop block of FIG. 3 operates.

FIG. 3 is a diagram illustrating an example of the multi-bit flip-flop block of FIG. 2. FIG. 4 is a timing diagram illustrating an example in which the multi-bit flip-flop block of FIG. 3 operates.

Referring to FIGS. 3 and 4, the multi-bit flip-flop block 100 may include a single inverter 160, a first flip-flop 100-1, and a second flip-flop 100-2. Here, the first flip-flop 100-1 may latch a first input signal D1 at rising edges of a clock signal CK (i.e., at falling edges of an inverted clock signal ICK) to output the first input signal D1 as a first output signal Q1, and the second flip-flop 100-2 may latch a second input signal D2 at the rising edges of the clock signal CK (i.e., at the falling edges of the inverted clock signal ICK) to output the second input signal D2 as a second output signal Q2. However, since a structure of the multi-bit flip-flop block 100 illustrated in FIG. 3 is an example, a structure of the multi-bit flip-flop block 100 is not limited thereto.

The first flip-flop 100-1 may include a first input tri-state inverter 101-1, a first master inverter 102-1, a first master latch tri-state inverter 103-1, a first transmission gate 104-1, a first slave inverter 105-1, a first output inverter 106-1, and a first slave latch tri-state inverter 107-1. The first input tri-state inverter 101-1 may be coupled to a first signal input terminal through which the first input signal D1 is input. That is, the first input tri-state inverter 101-1 may be coupled between the first signal input terminal and the first master inverter 102-1. Here, the first input tri-state inverter 101-1 may invert the first input signal D1 to output a first inverted input signal ID1 when the clock signal CK has a logic 'low' level and the inverted clock signal ICK has a logic 'high' level. On the other hand, the first input tri-state inverter 101-1 may separate the first master inverter 102-1 from the first signal input terminal when the clock signal CK has a logic 'high' level and the inverted clock signal ICK has a logic 'low' level. The first master inverter 102-1 may be coupled to an output terminal of the first input tri-state inverter 101-1. That is, the first master inverter 102-1 may be coupled between the first input tri-state inverter 101-1 and the first transmission gate 104-1. Here, the first master inverter 102-1 may invert the first inverted input signal ID1 received from the first input tri-state inverter 101-1 to output the first input signal D1. The first master latch tri-state inverter 103-1 may be coupled between an output terminal of the first master inverter 102-1 and an output terminal of the first input tri-state inverter 101-1. Here, the first master latch tri-state inverter 103-1 may invert the first input signal D1 received from the first master inverter 102-1 to output the first inverted input signal ID1 when the clock signal CK has a logic 'high' level and the inverted clock signal ICK has a logic 'low' level. On the other hand, the first master latch tri-state inverter 103-1 may separate the output terminal of the first input tri-state inverter 101-1 from the output terminal of the first master inverter 102-1 when the clock signal CK has a logic 'low' level and the inverted clock signal ICK has a logic 'high' level.

The first transmission gate 104-1 may be coupled to the output terminal of the first master inverter 102-1. That is, the first transmission gate 104-1 may be coupled between the first master inverter 102-1 and the first slave inverter 105-1. The first transmission gate 104-1 may transmit the first input signal D1 received from the first master inverter 102-1 when the clock signal CK has a logic 'high' level and the inverted clock signal ICK has a logic 'low' level. On the other hand, the first transmission gate 104-1 may separate the first slave inverter 105-1 from the first master inverter 102-1 when the clock signal CK has a logic 'low' level and the inverted clock signal ICK has a logic 'high' level. The first slave inverter 105-1 may be coupled to an output terminal of the first transmission gate 104-1. That is, the first slave inverter 105-1 may be coupled between the first transmission gate 104-1 and the first output inverter 106-1. The first slave inverter 105-1 may invert the first input signal D1 received from the first transmission gate 104-1 to output the first inverted input signal ID1. The first output inverter 106-1 may be coupled to an output terminal of the first slave inverter 105-1. That is, the first output inverter 106-1 may be coupled between the first slave inverter 105-1 and a first signal output terminal through which the first output signal Q1 is output. The first output inverter 106-1 may invert the first inverted input signal ID1 received from the first slave inverter 105-1 to output the first input signal D1 as the first output signal Q1 through the first signal output terminal. The first slave latch tri-state inverter 107-1 may be coupled between an output terminal of the first slave inverter 105-1 and an output terminal of the first transmission gate 104-1. Here, the first slave latch tri-state inverter 107-1 may invert the first inverted input signal ID1 received from the first slave inverter 105-1 to output the first input signal D1 when the clock signal CK has a logic 'low' level and the inverted clock signal ICK has a logic 'high' level. On the other hand, the first slave latch tri-state inverter 107-1 may separate the output terminal of the first transmission gate 104-1 from the output terminal of the first slave inverter 105-1 when the clock signal CK has a logic 'high' level and the inverted clock signal ICK has a logic 'low' level.

The second flip-flop 100-2 may include a second input tri-state inverter 101-2, a second master inverter 102-2, a second master latch tri-state inverter 103-2, a second transmission gate 104-2, a second slave inverter 105-2, a second output inverter 106-2, and a second slave latch tri-state inverter 107-2. The second input tri-state inverter 101-2 may be coupled to a second signal input terminal through which the second input signal D2 is input. That is, the second input tri-state inverter 101-2 may be coupled between the second signal input terminal and the second master inverter 102-2. Here, the second input tri-state inverter 101-2 may invert the second input signal D2 to output a second inverted input signal ID2 when the clock signal CK has a logic 'low' level and the inverted clock signal ICK has a logic 'high' level. On the other hand, the second input tri-state inverter 101-2 may separate the second master inverter 102-2 from the second signal input terminal when the clock signal CK has a logic 'high' level and the inverted clock signal ICK has a logic 'low' level. The second master inverter 102-2 may be coupled to an output terminal of the second input tri-state inverter 101-2. That is, the second master inverter 102-2 may be coupled between the second input tri-state inverter 101-2 and the second transmission gate 104-2. Here, the second master inverter 102-2 may invert the second inverted input signal ID2 received from the second input tri-state inverter 101-2 to output the second input signal D2. The second master latch tri-state inverter 103-2 may be coupled between an output terminal of the second master inverter 102-2 and an output terminal of the second input tri-state inverter 101-2. Here, the second master latch tri-state inverter 103-2 may invert the second input signal D2 received from the second master inverter 102-2 to output the second inverted input signal ID2 when the clock signal CK has a logic 'high' level and the inverted clock signal ICK has a logic 'low' level. On the other hand, the second master latch tri-state inverter 103-2 may separate the output terminal of the second input tri-state inverter 101-2 from the output terminal of the second master inverter 102-2 when the clock signal CK has a logic 'low' level and the inverted clock signal ICK has a logic 'high' level.

The second transmission gate 104-2 may be coupled to the output terminal of the second master inverter 102-2. That is, the second transmission gate 140-2 may be coupled between the second master inverter 102-2 and the second slave inverter 105-2. The second transmission gate 104-2 may transmit the second input signal D2 received from the second master inverter 102-2 when the clock signal CK has a logic 'high' level and the inverted clock signal ICK has a logic 'low' level. On the other hand, the second transmission gate 104-2 may separate the second slave inverter 105-2 from the second master inverter 102-2 when the clock signal CK has a logic 'low' level and the inverted clock signal ICK has a logic 'high' level. The second slave inverter 105-2 may be coupled to an output terminal of the second transmission gate 104-2. That is, the second slave inverter 105-2 may be coupled between the second transmission gate 104-2 and the second output inverter 106-2. The second slave inverter 105-2 may invert the second input signal D2 received from the second transmission gate 104-2 to output the second inverted input signal ID2. The second output inverter 106-2 may be coupled to an output terminal of the second slave inverter 105-2. That is, the second output inverter 106-2 may be coupled between the second slave inverter 105-2 and a second signal output terminal through which the second output signal Q2 is output. The second output inverter 106-2 may invert the second inverted input signal ID2 received from the second slave inverter 105-2 to output the second input signal D2 as the second output signal Q2 through the second signal output terminal. The second slave latch tri-state inverter 107-2 may be coupled between an output terminal of the second slave inverter 105-2 and an output terminal of the second transmission gate 104-2. Here, the second slave latch tri-state inverter 107-2 may invert the second inverted input signal ID2 received from the second slave inverter 105-2 to output the second input signal D2 when the clock signal CK has a logic 'low' level and the inverted clock signal ICK has a logic 'high' level. On the other hand, the second slave latch tri-state inverter 107-2 may separate the output terminal of the second transmission gate 104-2 from the output terminal of the second slave inverter 105-2 when the clock signal CK has a logic 'high' level and the inverted clock signal ICK has a logic 'low' level.

Specifically, when the clock signal CK has a logic 'low' level, the first input tri-state inverter 101-1 of the first flip-flop 100-1 and the second input tri-state inverter 101-2 of the second flip-flop 100-2 may operate, but the first transmission gate 104-1 and the first master latch tri-state inverter 103-1 of the first flip-flop 100-1 and the second transmission gate 104-2 and the second master latch tri-state inverter 103-2 of the second flip-flop 100-2 may not operate. In this situation, when a logic level of the clock signal CK is changed from a logic 'low' level to a logic 'high' level (i.e., the rising edges of the clock signal CK), the first input tri-state inverter 101-1 of the first flip-flop 100-1 and the second input tri-state inverter 101-2 of the second flip-flop 100-2 may not operate, but the first master latch tri-state inverter 103-1 of the first flip-flop 100-1 and the second master latch tri-state inverter 103-2 of the second flip-flop 100-2 may operate. Thus, the first input signal D1 applied to the first signal input terminal and the second input signal D2 applied to the second signal input terminal may be latched. Meanwhile, when the logic level of the clock signal CK is changed from a logic 'low' level to a logic 'high' level, the first transmission gate 104-1 of the first flip-flop 100-1 and the second transmission gate 104-2 of the second flip-flop 100-2 may operate. Thus, the latched first input signal D1 may be output as the first output signal Q1 via the first transmission gate 104-1, the first slave inverter 105-1, and the first output inverter 106-1 of the first flip-flop 100-1, and the latched second input signal D2 may be output as the second output signal Q2 via the second transmission gate 104-2, the second slave inverter 105-2, and the second output inverter 106-2 of the second flip-flop 100-2. Subsequently, when the logic level of the clock signal CK is changed from a logic 'high' level to a logic 'low' level (i.e., the falling edges of the clock signal CK), the first input tri-state inverter 101-1 of the first flip-flop 100-1 and the second input tri-state inverter 101-2 of the second flip-flop 100-2 may operate, but the first transmission gate 104-1 of the first flip-flop 100-1 and the second transmission gate 104-2 of the second flip-flop 100-2 may not operate. Thus, the first slave inverter 105-1 may be separated (or, blocked) from the first master inverter 102-1 in the first flip-flop 100-1, and the second slave inverter 105-2 may be separated (or, blocked) from the second master inverter 102-2 in the second flip-flop 100-2. Meanwhile, when the logic level of the clock signal CK is changed from a logic 'high' level to a logic 'low' level, the first slave latch tri-state inverter 107-1 of the first flip-flop 100-1 and the second slave latch tri-state inverter 107-2 of the second flip-flop 100-2 may operate. Thus, the first flip-flop 100-1 may output the latched first input signal D1 as the first output signal Q1 through the first signal output terminal and the second flip-flop 100-2 may output the latched second input signal D2 as the second output signal Q2 through the second signal output terminal until the logic level of the clock signal CK is changed from a logic 'low' level to a logic 'high' level (i.e., the rising edges of the clock signal CK).

FIG. 4 shows an example in which the multi-bit flip-flop block 100 operates. For convenience of description, an operation of the multi-bit flip-flop block 100 will be described by focusing on the (j)th flip-flop 100-j among the flip-flops 100-1 through 100-1 included in the multi-bit flip-flop block 100, where j is an integer between 1 and n. For example, as illustrated in FIG. 3, the (j)th flip-flop 100-j may output a (j)th output signal Qj by latching a (j)th input signal Dj (i.e., indicated as TIA) at the rising edges of the clock signal CK (i.e., at the falling edges of the inverted clock signal ICK). Here, since the latched (j)th input signal Dj has a logic 'low' level, the (j)th flip-flop 100-j may output the (j)th output signal Qj having a logic 'low' level. Meanwhile, since the (j)th flip-flop 100-j is triggered only at the rising edges of the clock signal CK, the (j)th output signal Qj output from the (j)th flip-flop 100-j may not be changed until a next rising edge of the clock signal CK. Subsequently, since the (j)th input signal Dj latched at a next rising edge of the clock signal CK (i.e., indicated as TIB) has a logic 'high' level, a logic level of the (j)th output signal Qj output from the (j)th flip-flop 100-j may be changed from a logic 'low' level to a logic 'high' level. Next, since the (j)th input signal Dj latched at a next rising edge of the clock signal CK (i.e., indicated as TIC) has a logic 'high' level, the (j)th flip-flop 100-j may output the (j)th output signal Qj having a logic 'high' level. Subsequently, since the (j)th input signal Dj latched at a next rising edge of the clock signal CK (i.e., indicated as TID) has a logic 'low' level, the logic level of the (j)th output signal Qj output from the (j)th flip-flop 100-j may be changed from a logic 'high' level to a logic 'low' level. Next, since the (j)th input signal Dj latched at a next rising edge of the clock signal CK (i.e., indicated as TIE) has a logic 'low' level, the (j)th flip-flop 100-j may output the (j)th output signal Qj having a logic 'low' level. Subsequently, since the (j)th input signal Dj latched at a next rising edge of the clock signal CK (i.e., indicated as TIF) has a logic 'high' level, the logic level of the (j)th output signal Qj output from the (j)th flip-flop 100-j may be changed from a logic 'low' level to a logic 'high' level. Next, since the (j)th input signal Dj latched at a next rising edge of the clock signal CK (i.e., indicated as TIG) has a logic 'high' level, the (j)th flip-flop 100-*j* may output the (j)th output signal Qj having a logic 'high' level.

Figure 5A:
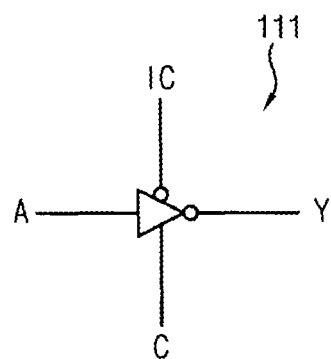
FIG. 5A is a diagram illustrating a tri-state inverter included in the multi-bit flip-flop block of FIG. 3.
Figure 5B:
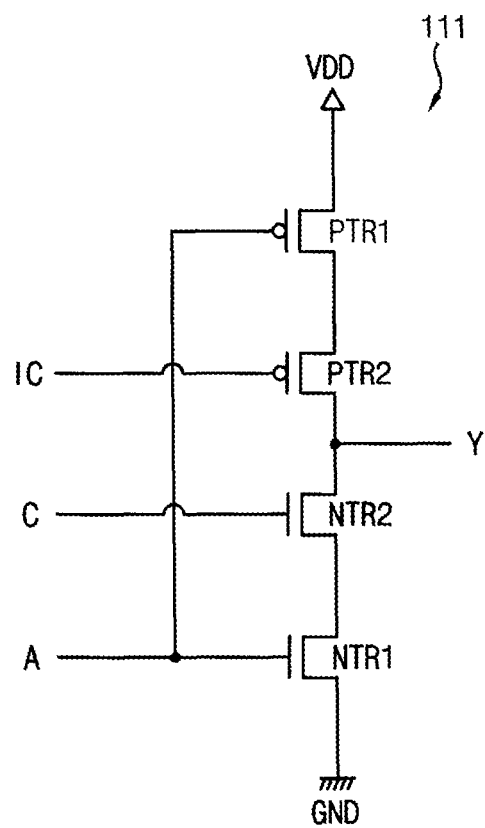
FIG. 5B is a circuit diagram illustrating an example of a tri-state inverter included in the multi-bit flip-flop block of FIG. 3.

FIG. 5A is a diagram illustrating a tri-state inverter included in the multi-bit flip-flop block of FIG. 3. FIG. 5B is a circuit diagram illustrating an example of a tri-state inverter included in the multi-bit flip-flop block of FIG. 3.

Referring to FIGS. 5A and 5B, the tri-state inverter 111 included in the multi-bit flip-flop block 100 may be controlled by a control signal C and an inverted control signal IC that is generated by inverting the control signal C. Here, the control signal C may be a clock signal CK that is applied to the multi-bit flip-flop block 100 or an inverted clock signal ICK that is generated by inverting the clock signal CK. Thus, the inverted control signal IC may be the inverted clock signal ICK or the clock signal CK.

As illustrated in FIG. 5A, the tri-state inverter 111 may perform an operation that inverts an input signal A to output an output signal Y when the control signal C has a logic 'high' level and the inverted control signal IC has a logic 'low' level. On the other hand, the tri-state inverter 111 may not perform the operation that inverts the input signal A to output the output signal Y when the control signal C has a logic 'low' level and the inverted control signal IC has a logic 'high' level. For this operation, as illustrated in FIG. 5B, the tri-state inverter 111 may include a first p-channel metal-oxide semiconductor (PMOS) transistor PTR1, a second PMOS transistor PTR2, a first n-channel metal-oxide semiconductor (NMOS) transistor NTR1, and a second NMOS transistor NTR2. The first PMOS transistor PTR1 may be coupled between the second PMOS transistor PTR2 and a first power voltage VDD corresponding to a logic 'high' level. Here, a gate electrode of the first PMOS transistor PTR1 may receive the input signal A. The second PMOS transistor PTR2 may be coupled between the first PMOS transistor PTR1 and the second NMOS transistor NTR2. Here, a gate electrode of the second PMOS transistor PTR2 may receive the inverted control signal IC. The first NMOS transistor NTR1 may be coupled between the second NMOS transistor NTR2 and a second power voltage GND corresponding to a logic 'low' level. Here, a gate electrode of the first NMOS transistor NTR1 may receive the input signal A. The second NMOS transistor NTR2 may be coupled between the first NMOS transistor NTR1 and the second PMOS transistor PTR2. Here, a gate electrode of the second NMOS transistor NTR2 may receive the control signal C. A node coupled to one electrode of the second PMOS transistor PTR2 and one electrode of the second NMOS transistor NTR2 may be an output node, and thus the output signal Y may be output through the output node. Thus, when the control signal C has a logic 'high' level and the inverted control signal IC has a logic 'low' level, the second PMOS transistor PTR2 and the second NMOS transistor NTR2 may be turned on. Here, when the input signal A has a logic 'high' level, the first NMOS transistor NTR1 may be turned on, so that the output signal Y having a logic 'low' level may be output. On the other hand, when the input signal A has a logic 'low' level, the first PMOS transistor PTR1 may be turned on, so that the output signal Y having a logic 'high' level may be output. Since the tri-state inverter 111 illustrated in FIGS. 5A and 5B is an example, the tri-state inverter 111 included in the multi-bit flip-flop block 100 is not limited thereto.

Figure 6A:
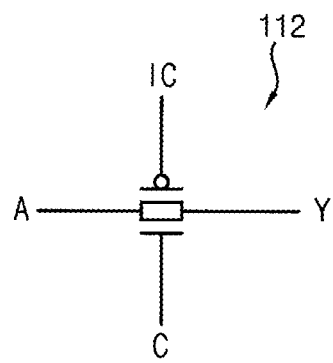
FIG. 6A is a diagram illustrating a transmission gate included in the multi-bit flip-flop block of FIG. 3.
Figure 6B:
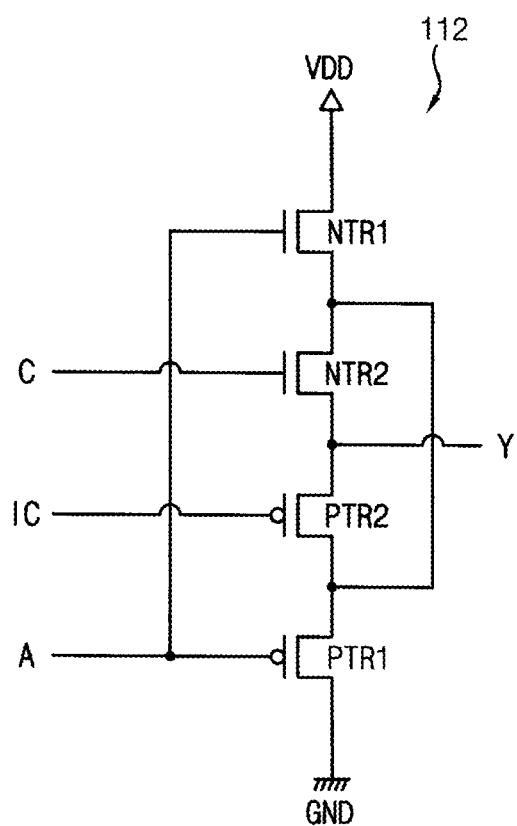
FIG. 6B is a circuit diagram illustrating an example of a transmission gate included in the multi-bit flip-flop block of FIG. 3.

FIG. 6A is a diagram illustrating a transmission gate included in the multi-bit flip-flop block of FIG. 3. FIG. 6B is a circuit diagram illustrating an example of a transmission gate included in the multi-bit flip-flop block of FIG. 3.

Referring to FIGS. 6A and 6B, the transmission gate 112 included in the multi-bit flip-flop block 100 may be controlled by a control signal C and an inverted control signal IC that is generated by inverting the control signal C. Here, the control signal C may be a clock signal CK that is applied to the multi-bit flip-flop block 100 or an inverted clock signal ICK that is generated by inverting the clock signal CK. Thus, the inverted control signal IC may be the inverted clock signal ICK or the clock signal CK.

As illustrated in FIG. 6A, the transmission gate 112 may perform an operation that outputs an input signal A as an output signal Y when the control signal C has a logic 'high' level and the inverted control signal IC has a logic 'low' level. On the other hand, the transmission gate 112 may not perform the operation that outputs the input signal A as the output signal Y when the control signal C has a logic 'low' level and the inverted control signal IC has a logic 'high' level. For this operation, as illustrated in FIG. 6B, the transmission gate 112 may include a first PMOS transistor PTR1, a second PMOS transistor PTR2, a first NMOS transistor NTR1, and a second NMOS transistor NTR2. The first NMOS transistor NTR1 may be coupled between the second NMOS transistor NTR2 and a first power voltage VDD corresponding to a logic 'high' level. Here, a gate electrode of the first NMOS transistor NTR1 may receive the input signal A. The second NMOS transistor NTR2 may be coupled between the first NMOS transistor NTR1 and the second PMOS transistor PTR2. Here, a gate electrode of the second NMOS transistor NTR2 may receive the control signal C. The first PMOS transistor PTR1 may be coupled between the second PMOS transistor PTR2 and a second power voltage GND corresponding to a logic 'low' level. Here, a gate electrode of the first PMOS transistor PTR1 may receive the input signal A. The second PMOS transistor PTR2 may be coupled between the first PMOS transistor PTR1 and the second NMOS transistor NTR2. Here, a gate electrode of the second PMOS transistor PTR2 may receive the inverted control signal IC. A node coupled to one electrode of the second PMOS transistor PTR2 and one electrode of the second NMOS transistor NTR2 may be an output node, and thus the output signal Y may be output through the output node. In some example embodiments, the other electrode of the second PMOS transistor PTR2 may be coupled to the other electrode of the second NMOS transistor NTR2. Thus, when the control signal C has a logic 'high' level and the inverted control signal IC has a logic 'low' level, the second NMOS transistor NTR2 and the second PMOS transistor PTR2 may be turned on. Here, when the input signal A has a logic 'high' level, the first NMOS transistor NTR1 may be turned on, so that the output signal Y having a logic 'high' level may be output. On the other hand, when the input signal A has a logic 'low' level, the first PMOS transistor PTR1 may be turned on, so that the output signal Y having a logic 'low' level may be output. Since the transmission gate 112 illustrated in FIGS. 6A and 6B is an example, the transmission gate 112 included in the multi-bit flip-flop block 100 is not limited thereto.

Figure 7:
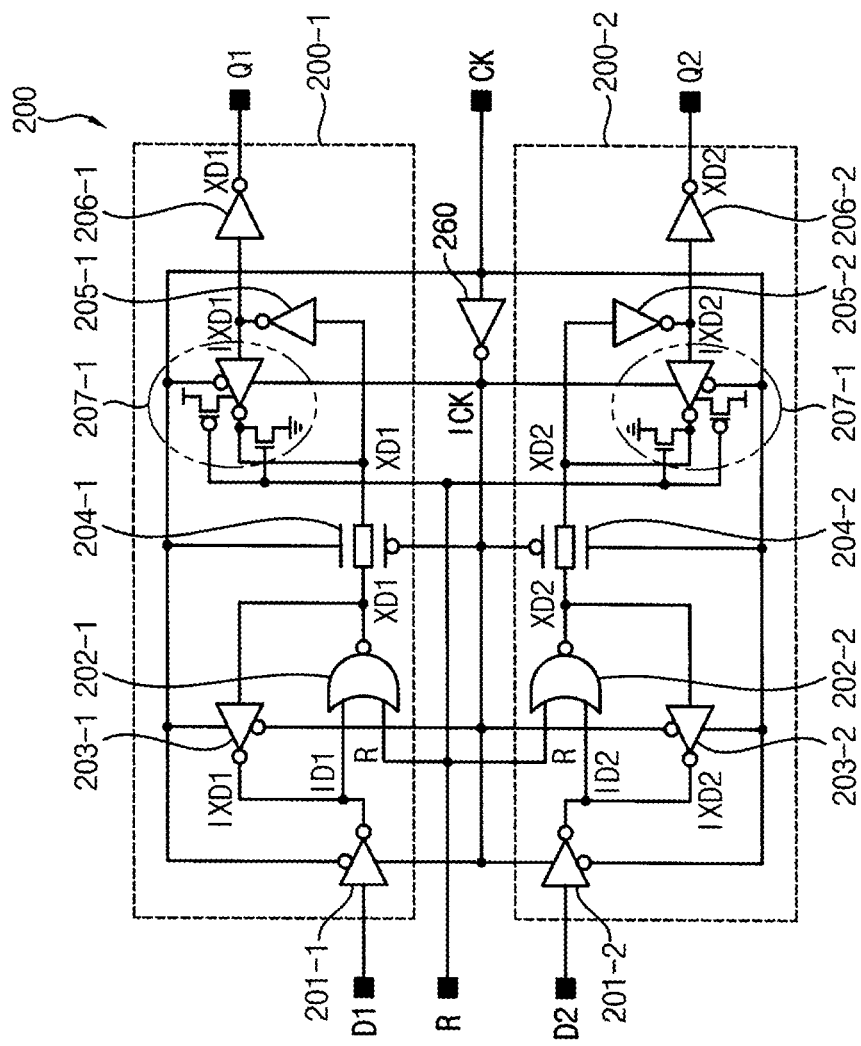
FIG. 7 is a diagram illustrating another example of the multi-bit flip-flop block of FIG. 2.

FIG. 7 is a diagram illustrating another example of the multi-bit flip-flop block of FIG. 2.

Referring to FIG. 7, the multi-bit flip-flop block 200 may include a single inverter 260, a first flip-flop 200-1, and a second flip-flop 200-2. Here, the first flip-flop 200-1 may latch a first input signal D1 at rising edges of a clock signal CK (i.e., at falling edges of an inverted clock signal ICK) to output the first input signal D1 as a first output signal Q1, and the second flip-flop 200-2 may latch a second input signal D2 at the rising edges of the clock signal CK (i.e., at the falling edges of the inverted clock signal ICK) to output the second input signal D2 as a second output signal Q2. However, since a structure of the multi-bit flip-flop block 200 illustrated in FIG. 7 is an example, a structure of the multi-bit flip-flop block 200 is not limited thereto.

The first flip-flop 200-1 may include a first input tri-state inverter 201-1, a first logical XOR element 202-1, a first master latch tri-state inverter 203-1, a first transmission gate 204-1, a first slave inverter 205-1, a first output inverter 206-1, and a first slave latch-reset tri-state inverter 207-1. The first input tri-state inverter 201-1 may be coupled to a first signal input terminal through which the first input signal D1 is input. That is, the first input tri-state inverter 201-1 may be coupled between the first signal input terminal and the first logical XOR element 202-1. Here, the first input tri-state inverter 201-1 may invert the first input signal D1 to output a first inverted input signal ID1 when the clock signal CK has a logic 'low' level and the inverted clock signal ICK has a logic 'high' level. On the other hand, the first input tri-state inverter 201-1 may separate the first logical XOR element 202-1 from the first signal input terminal when the clock signal CK has a logic 'high' level and the inverted clock signal ICK has a logic 'low' level. The first logical XOR element 202-1 may be coupled to a reset terminal through which a reset signal R is input and an output terminal of the first input tri-state inverter 201-1. Here, the first logical XOR element 202-1 may output a first operation signal XD1 by performing a logical XOR operation between the first inverted input signal ID1 received from the first input tri-state inverter 201-1 and the reset signal R input through the reset terminal. Thus, when the reset signal R has a logic 'high' level, the first logical XOR element 202-1 may output the first operation signal XD1 having a logic 'low' level regardless of the first inverted input signal ID1. On the other hand, when the reset signal R has a logic 'low' level, the first logical XOR element 202-1 may output the first input signal D1 as the first operation signal XD1 by inverting the first inverted input signal ID1. The first master latch tri-state inverter 203-1 may be coupled between an output terminal of the first logical XOR element 202-1 and an output terminal of the first input tri-state inverter 201-1. Here, the first master latch tri-state inverter 203-1 may invert the first operation signal XD1 received from the first logical XOR element 202-1 to output a first inverted operation signal IXD1 corresponding to the first inverted input signal ID1 when the clock signal CK has a logic 'high' level and the inverted clock signal ICK has a logic 'low' level. On the other hand, the first master latch tri-state inverter 203-1 may separate the output terminal of the first input tri-state inverter 201-1 from the output terminal of the first logical XOR element 202-1 when the clock signal CK has a logic 'low' level and the inverted clock signal ICK has a logic 'high' level.

The first transmission gate 204-1 may be coupled to the output terminal of the first logical XOR element 202-1. That is, the first transmission gate 204-1 may be coupled between the first logical XOR element 202-1 and the first slave inverter 205-1. The first transmission gate 204-1 may transmit the first operation signal XD1 received from the first logical XOR element 202-1 when the clock signal CK has a logic 'low' level and the inverted clock signal ICK has a logic 'high' level. On the other hand, the first transmission gate 204-1 may separate the first slave inverter 205-1 from the first logical XOR element 202-1 when the clock signal CK has a logic 'low' level and the inverted clock signal ICK has a logic 'high' level. The first slave inverter 205-1 may be coupled to an output terminal of the first transmission gate 204-1. That is, the first slave inverter 205-1 may be coupled between the first transmission gate 204-1 and the first output inverter 206-1. The first slave inverter 205-1 may invert the first operation signal XD1 received from the first transmission gate 204-1 to output the first inverted operation signal IXD1. The first output inverter 206-1 may be coupled to an output terminal of the first slave inverter 205-1. That is, the first output inverter 206-1 may be coupled between the first slave inverter 205-1 and a first signal output terminal through which the first output signal Q1 is output. The first output inverter 206-1 may invert the first inverted operation signal IXD1 received from the first slave inverter 205-1 to output the first operation signal XD1 as the first output signal Q1 through the first signal output terminal. The first slave latch-reset tri-state inverter 207-1 may be coupled between an output terminal of the first slave inverter 205-1 and an output terminal of the first transmission gate 204-1. Here, the first slave latch-reset tri-state inverter 207-1 may invert the first inverted operation signal IXD1 received from the first slave inverter 205-1 to output the first operation signal XD1 when the reset signal R has a logic 'low' level, the clock signal CK has a logic 'low' level, and the inverted clock signal ICK has a logic 'high' level. On the other hand, the first slave latch-reset tri-state inverter 207-1 may separate the output terminal of the first transmission gate 204-1 from the output terminal of the first slave inverter 205-1 when the reset signal R has a logic 'low' level, the clock signal CK has a logic 'high' level, and the inverted clock signal ICK has a logic 'low' level. In addition, the first slave latch-reset tri-state inverter 207-1 may reset the first operation signal XD1 to have a logic 'low' level when the reset signal R has a logic 'high' level. As a result, when the reset signal R has a logic 'high' level, the first flip-flop 200-1 may output the first output signal Q1 having a logic 'low' level.

The second flip-flop 200-2 may include a second input tri-state inverter 201-2, a second logical XOR element 202-2, a second master latch tri-state inverter 203-2, a second transmission gate 204-2, a second slave inverter 205-2, a second output inverter 206-2, and a second slave latch-reset tri-state inverter 207-2. The second input tri-state inverter 201-2 may be coupled to a second signal input terminal through which the second input signal D2 is input. That is, the second input tri-state inverter 201-2 may be coupled between the second signal input terminal and the second logical XOR element 202-2. Here, the second input tri-state inverter 201-2 may invert the second input signal D2 to output a second inverted input signal ID2 when the clock signal CK has a logic 'low' level and the inverted clock signal ICK has a logic 'high' level. On the other hand, the second input tri-state inverter 201-2 may separate the second logical XOR element 202-2 from the second signal input terminal when the clock signal CK has a logic 'high' level and the inverted clock signal ICK has a logic 'low' level. The second logical XOR element 202-2 may be coupled to the reset terminal through which the reset signal R is input and an output terminal of the second input tri-state inverter 201-2. Here, the second logical XOR element 202-2 may output a second operation signal XD2 by performing a logical XOR operation between the second inverted input signal ID2 received from the second input tri-state inverter 201-2 and the reset signal R input through the reset terminal. Thus, when the reset signal R has a logic 'high' level, the second logical XOR element 202-2 may output the second operation signal XD2 having a logic 'low' level regardless of the second inverted input signal ID2. On the other hand, when the reset signal R has a logic 'low' level, the second logical XOR element 202-2 may output the second input signal D2 as the second operation signal XD2 by inverting the second inverted input signal ID2. The second master latch tri-state inverter 203-2 may be coupled between an output terminal of the second logical XOR element 202-2 and an output terminal of the second input tri-state inverter 201-2. Here, the second master latch tri-state inverter 203-2 may invert the second operation signal XD2 received from the second logical XOR element 202-2 to output a second inverted operation signal IXD2 corresponding to the second inverted input signal ID2 when the clock signal CK has a logic 'high' level and the inverted clock signal ICK has a logic 'low' level. On the other hand, the second master latch tri-state inverter 203-2 may separate the output terminal of the second input tri-state inverter 201-2 from the output terminal of the second logical XOR element 202-2 when the clock signal CK has a logic 'low' level and the inverted clock signal ICK has a logic 'high' level.

The second transmission gate 204-2 may be coupled to the output terminal of the second logical XOR element 202-2. That is, the second transmission gate 204-2 may be coupled between the second logical XOR element 202-2 and the second slave inverter 205-2. The second transmission gate 204-2 may transmit the second operation signal XD2 received from the second logical XOR element 202-2 when the clock signal CK has a logic 'high' level and the inverted clock signal ICK has a logic 'low' level. On the other hand, the second transmission gate 204-2 may separate the second slave inverter 205-2 from the second logical XOR element 202-2 when the clock signal CK has a logic 'low' level and the inverted clock signal ICK has a logic 'high' level. The second slave inverter 205-2 may be coupled to an output terminal of the second transmission gate 204-2. That is, the second slave inverter 205-2 may be coupled between the second transmission gate 204-2 and the second output inverter 206-2. The second slave inverter 205-2 may invert the second operation signal XD2 received from the second transmission gate 204-2 to output the second inverted operation signal IXD2. The second output inverter 206-2 may be coupled to an output terminal of the second slave inverter 205-2. That is, the second output inverter 206-2 may be coupled between the second slave inverter 205-2 and a second signal output terminal through which the second output signal Q2 is output. The second output inverter 206-2 may invert the second inverted operation signal IXD2 received from the second slave inverter 205-2 to output the second operation signal XD2 as the second output signal Q2 through the second signal output terminal. The second slave latch-reset tri-state inverter 207-2 may be coupled between an output terminal of the second slave inverter 205-2 and an output terminal of the second transmission gate 204-2. Here, the second slave latch-reset tri-state inverter 207-2 may invert the second inverted operation signal IXD2 received from the second slave inverter 205-2 to output the second operation signal XD2 when the reset signal R has a logic 'low' level, the clock signal CK has a logic 'low' level, and the inverted clock signal ICK has a logic 'high' level. On the other hand, the second slave latch-reset tri-state inverter 207-2 may separate the output terminal of the second transmission gate 204-2 from the output terminal of the second slave inverter 205-2 when the reset signal R has a logic 'low' level, the clock signal CK has a logic 'high' level, and the inverted clock signal ICK has a logic 'low' level. In addition, the second slave latch-reset tri-state inverter 207-2 may reset the second operation signal XD2 to have a logic 'low' level when the reset signal R has a logic 'high' level.

As a result, when the reset signal R has a logic 'high' level, the second flip-flop 200-2 may output the second output signal Q2 having a logic 'low' level.

Specifically, when the clock signal CK has a logic 'low' level, the first input tri-state inverter 201-1 of the first flip-flop 200-1 and the second input tri-state inverter 201-2 of the second flip-flop 200-2 may operate, but the first transmission gate 204-1 and the first master latch tri-state inverter 203-1 of the first flip-flop 200-1 and the second transmission gate 204-2 and the second master latch tri-state inverter 203-2 of the second flip-flop 200-2 may not operate. In this situation, when a logic level of the clock signal CK is changed from a logic 'low' level to a logic 'high' level (i.e., the rising edges of the clock signal CK), the first input tri-state inverter 201-1 of the first flip-flop 200-1 and the second input tri-state inverter 201-2 of the second flip-flop 200-2 may not operate, but the first master latch tri-state inverter 203-1 of the first flip-flop 200-1 and the second master latch tri-state inverter 203-2 of the second flip-flop 200-2 may operate. Thus, the first input signal D1 applied to the first signal input terminal and the second input signal D2 applied to the second signal input terminal may be latched. Meanwhile, when the logic level of the clock signal CK is changed from a logic 'low' level to a logic 'high' level, the first transmission gate 204-1 of the first flip-flop 200-1 and the second transmission gate 204-2 of the second flip-flop 200-2 may operate. Thus, the latched first input signal D1 may be output as the first output signal Q1 via the first transmission gate 204-1, the first slave inverter 205-1, and the first output inverter 206-1 of the first flip-flop 200-1, and the latched second input signal D2 may be output as the second output signal Q2 via the second transmission gate 204-2, the second slave inverter 205-2, and the second output inverter 206-2 of the second flip-flop 200-2. Subsequently, when the logic level of the clock signal CK is changed from a logic 'high' level to a logic 'low' level (i.e., the falling edges of the clock signal CK), the first input tri-state inverter 201-1 of the first flip-flop 200-1 and the second input tri-state inverter 201-2 of the second flip-flop 200-2 may operate, but the first transmission gate 204-1 of the first flip-flop 200-1 and the second transmission gate 204-2 of the second flip-flop 200-2 may not operate. Thus, the first slave inverter 205-1 may be separated (or, blocked) from the first logical XOR element 202-1 in the first flip-flop 200-1, and the second slave inverter 205-2 may be separated (or, blocked) from the second logical XOR element 202-2 in the second flip-flop 200-2. Meanwhile, when the logic level of the clock signal CK is changed from a logic 'high' level to a logic 'low' level, the first slave latch-reset tri-state inverter 207-1 of the first flip-flop 200-1 and the second slave latch-reset tri-state inverter 207-2 of the second flip-flop 200-2 may operate. Thus, the first flip-flop 200-1 may output the latched first input signal D1 as the first output signal Q1 through the first signal output terminal, and the second flip-flop 200-2 may output the latched second input signal D2 as the second output signal Q2 through the second signal output terminal until the logic level of the clock signal CK is changed from a logic 'low' level to a logic 'high' level (i.e., the rising edges of the clock signal CK). However, when the reset signal R having a logic 'high' level is applied to the first and second flip-flops 200-1 and 200-2, the first flip-flop 200-1 may output the first output signal Q1 having a logic 'low' level, and the second flip-flop 200-2 may output the second output signal Q2 having a logic 'low' level.

Figure 8A:
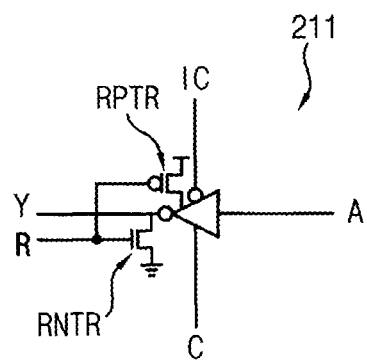
FIG. 8A is a diagram illustrating a slave latch-reset tri-state inverter included in the multi-bit flip-flop block of FIG. 7.
Figure 8B:
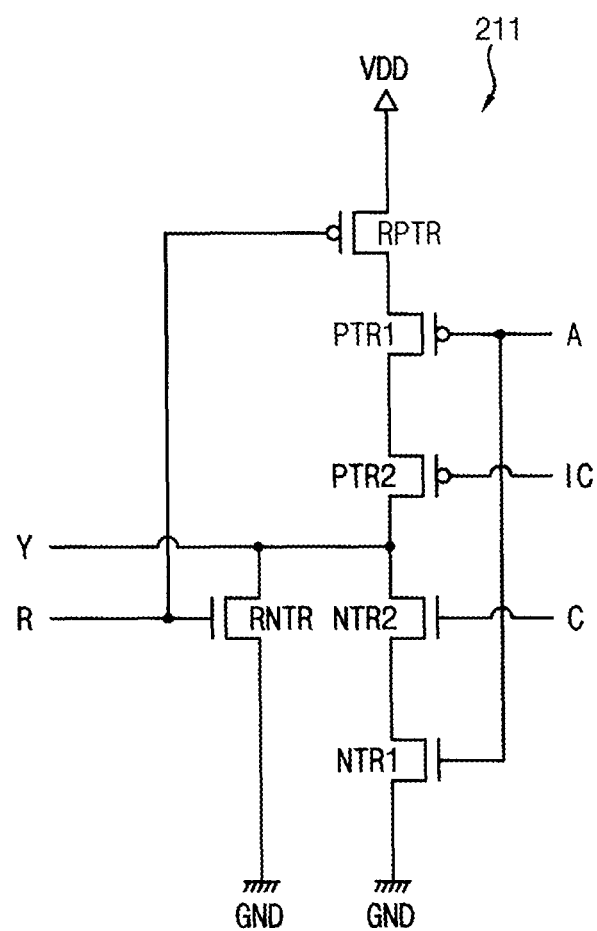
FIG. 8B is a circuit diagram illustrating an example of a slave latch-reset tri-state inverter included in the multi-bit flip-flop block of FIG. 7.

FIG. 8A is a diagram illustrating a slave latch-reset tri-state inverter included in the multi-bit flip-flop block of FIG. 7. FIG. 8B is a circuit diagram illustrating an example of a slave latch-reset tri-state inverter included in the multi-bit flip-flop block of FIG. 7.

Referring to FIGS. 8A and 8B, the slave latch-reset tri-state inverter 211 included in the multi-bit flip-flop block 200 may be controlled by a control signal C, an inverted control signal IC that is generated by inverting the control signal C, and a reset signal R. Here, the control signal C may be an inverted clock signal ICK that is generated by inverting a clock signal CK applied to the multi-bit flip-flop block 200, and the inverted control signal IC may be the clock signal CK.

As illustrated in FIG. 8A, the slave latch-reset tri-state inverter 211 may perform an operation that inverts an input signal A to output an inverted input signal as an output signal Y when the reset signal R has a logic 'low' level, the control signal C has a logic 'high' level, and the inverted control signal IC has a logic 'low' level. On the other hand, the slave latch-reset tri-state inverter 211 may not perform the operation that inverts the input signal A to output the inverted input signal as the output signal Y when the reset signal R has a logic 'low' level, the control signal C has a logic 'low' level, and the inverted control signal IC has a logic 'high' level. In addition, the slave latch-reset tri-state inverter 211 may reset the output signal Y to have a logic 'low' level when the reset signal R has a logic 'high' level. For this operation, as illustrated in FIG. 8B, the slave latch-reset tri-state inverter 211 may include a first PMOS transistor PTR1, a second PMOS transistor PTR2, a first NMOS transistor NTR1, a second NMOS transistor NTR2, a reset PMOS transistor RPTR, and a reset NMOS transistor RNTR. The reset PMOS transistor RPTR may be coupled between the first PMOS transistor PTR1 and a first power voltage VDD corresponding to a logic 'high' level. Here, a gate electrode of the reset PMOS transistor RPTR may receive the reset signal R. The reset NMOS transistor RNTR may be coupled between an output node and a second power voltage GND corresponding to a logic 'low' level. For example, the output node may be a node coupled to one electrode of the second PMOS transistor PTR2 and one electrode of the second NMOS transistor NTR2, and thus the output signal Y may be output through the output node. Here, a gate electrode of the reset NMOS transistor RNTR may receive the reset signal R. The first PMOS transistor PTR1 may be coupled between the second PMOS transistor PTR2 and the reset PMOS transistor RPTR. Here, a gate electrode of the first PMOS transistor PTR1 may receive the input signal A. The second PMOS transistor PTR2 may be coupled between the first PMOS transistor PTR1 and the second NMOS transistor NTR2. Here, a gate electrode of the second PMOS transistor PTR2 may receive the inverted control signal IC. The first NMOS transistor NTR1 may be coupled between the second NMOS transistor NTR2 and the second power voltage GND corresponding to a logic 'low' level. Here, a gate electrode of the first NMOS transistor NTR1 may receive the input signal A. The second NMOS transistor NTR2 may be coupled between the first NMOS transistor NTR1 and the second PMOS transistor PTR2. Here, a gate electrode of the second NMOS transistor NTR2 may receive the control signal C. Thus, when the control signal C has a logic 'high' level and the inverted control signal IC has a logic 'low' level, the second NMOS transistor NTR2 and the second PMOS transistor PTR2 may be turned on. Here, when the reset signal R has a logic 'low' level and the input signal A has a logic 'high' level, the reset PMOS transistor RPTR and the first NMOS transistor NTR1 may be turned on, so that the output signal Y having a logic 'low' level may be output. On the other hand, when the reset signal R has a logic 'low' level and the input signal A has a logic 'low' level, the reset PMOS transistor RPTR and the first PMOS transistor PTR1 may be turned on, so that the output signal Y having a logic 'high' level may be output. In addition, when the reset signal R has a logic 'high' level, the reset NMOS transistor RNTR may be turned on, so that the output signal Y may be reset to have a logic 'low' level. Since the slave latch-reset tri-state inverter 211 illustrated in FIGS. 8A and 8B is an example, the slave latch-reset tri-state inverter 211 included in the multi-bit flip-flop block 200 is not limited thereto.

Figure 9:
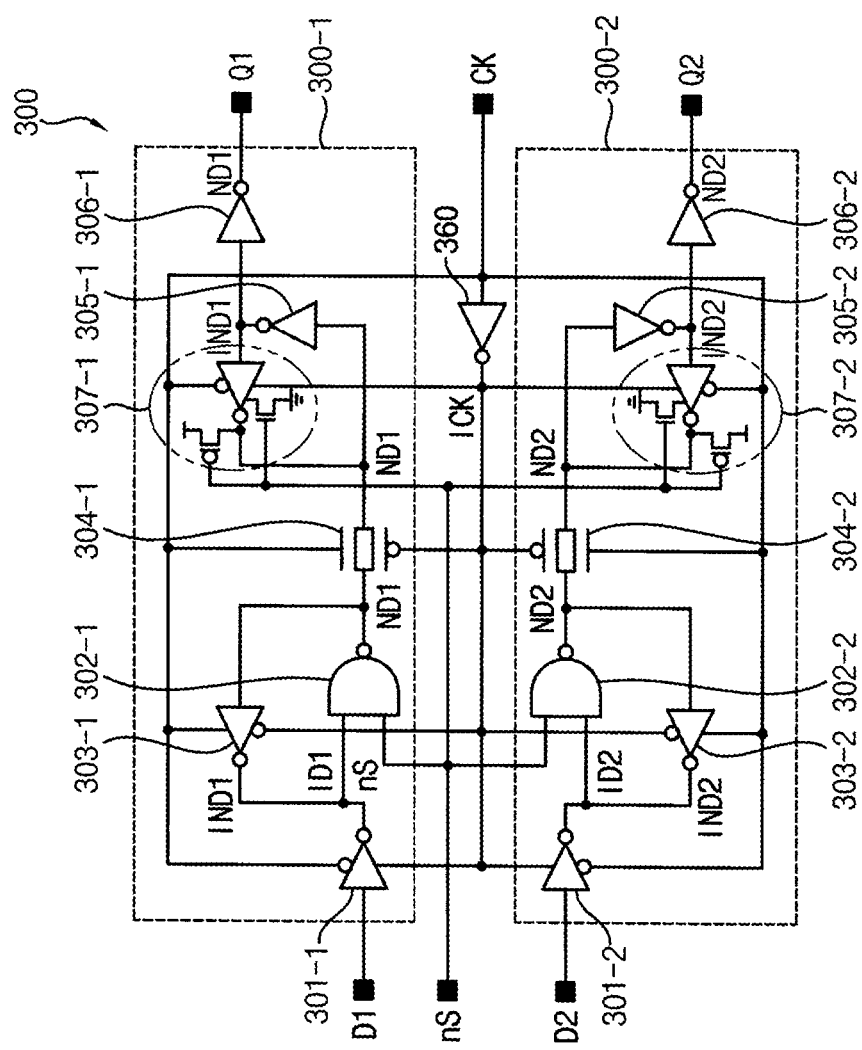
FIG. 9 is a diagram illustrating still another example of the multi-bit flip-flop block of FIG. 2.

FIG. 9 is a diagram illustrating still another example of the multi-bit flip-flop block of FIG. 2.

Referring to FIG. 9, the multi-bit flip-flop block 300 may include a single inverter 360, a first flip-flop 300-1, and a second flip-flop 300-2. Here, the first flip-flop 300-1 may latch a first input signal D1 at rising edges of a clock signal CK (i.e., at falling edges of an inverted clock signal ICK) to output the first input signal D1 as a first output signal Q1, and the second flip-flop 300-2 may latch a second input signal D2 at the rising edges of the clock signal CK (i.e., at the falling edges of the inverted clock signal ICK) to output the second input signal D2 as a second output signal Q2. However, since a structure of the multi-bit flip-flop block 300 illustrated in FIG. 9 is an example, a structure of the multi-bit flip-flop block 300 is not limited thereto.

The first flip-flop 300-1 may include a first input tri-state inverter 301-1, a first logical NAND element 302-1, a first master latch tri-state inverter 303-1, a first transmission gate 304-1, a first slave inverter 305-1, a first output inverter 306-1, and a first slave latch-set tri-state inverter 307-1. The first input tri-state inverter 301-1 may be coupled to a first signal input terminal through which the first input signal D1 is input. That is, the first input tri-state inverter 301-1 may be coupled between the first signal input terminal and the first logical NAND element 302-1. Here, the first input tri-state inverter 301-1 may invert the first input signal D1 to output a first inverted input signal ID1 when the clock signal CK has a logic 'low' level and the inverted clock signal ICK has a logic 'high' level. On the other hand, the first input tri-state inverter 301-1 may separate the first logical NAND element 302-1 from the first signal input terminal when the clock signal CK has a logic 'high' level and the inverted clock signal ICK has a logic 'low' level. The first logical NAND element 302-1 may be coupled to a set terminal through which an inverted set signal nS is input and an output terminal of the first input tri-state inverter 301-1. Here, the inverted set signal nS may be generated by inverting a set signal. Although it is illustrated in FIG. 9 that the inverted set signal nS is input through the set terminal, in some example embodiments, the set signal may be input through the set terminal. In this case, the inverted set signal nS may be generated by inverting the set signal using a specific inverter. The first logical NAND element 302-1 may output a first operation signal ND1 by performing a logical NAND operation between the first inverted input signal ID1 received from the first input tri-state inverter 301-1 and the inverted set signal nS input through the set terminal. Thus, when the inverted set signal nS has a logic 'low' level (i.e., when the set signal has a logic 'high' level), the first logical NAND element 302-1 may output the first operation signal ND1 having a logic 'high' level regardless of the first inverted input signal ID1. On the other hand, when the inverted set signal nS has a logic 'high' level (i.e., when the set signal has a logic 'low' level), the first logical NAND element 302-1 may output the first input signal D1 as the first operation signal ND1 by inverting the first inverted input signal ID1. The first master latch tri-state inverter 303-1 may be coupled between an output terminal of the first logical NAND element 302-1 and an output terminal of the first input tri-state inverter 301-1. Here, the first master latch tri-state inverter 303-1 may invert the first operation signal ND1 received from the first logical NAND element 302-1 to output a first inverted operation signal IND1 corresponding to the first inverted input signal ID1 when the clock signal CK has a logic 'high' level and the inverted clock signal ICK has a logic 'low' level. On the other hand, the first master latch tri-state inverter 303-1 may separate the output terminal of the first input tri-state inverter 301-1 from the output terminal of the first logical NAND element 302-1 when the clock signal CK has a logic 'low' level and the inverted clock signal ICK has a logic 'high' level.

The first transmission gate 304-1 may be coupled to the output terminal of the first logical NAND element 302-1. That is, the first transmission gate 304-1 may be coupled between the first logical NAND element 302-1 and the first slave inverter 305-1. The first transmission gate 304-1 may transmit the first operation signal ND1 received from the first logical NAND element 302-1 when the clock signal CK has a logic 'high' level and the inverted clock signal ICK has a logic 'low' level. On the other hand, the first transmission gate 304-1 may separate the first slave inverter 305-1 from the first logical NAND element 302-1 when the clock signal CK has a logic 'low' level and the inverted clock signal ICK has a logic 'high' level. The first slave inverter 305-1 may be coupled to an output terminal of the first transmission gate 304-1. That is, the first slave inverter 305-1 may be coupled between the first transmission gate 304-1 and the first output inverter 306-1. The first slave inverter 305-1 may invert the first operation signal ND1 received from the first transmission gate 304-1 to output the first inverted operation signal IND1. The first output inverter 306-1 may be coupled to an output terminal of the first slave inverter 305-1. That is, the first output inverter 306-1 may be coupled between the first slave inverter 305-1 and a first signal output terminal through which the first output signal Q1 is output. The first output inverter 306-1 may invert the first inverted operation signal IND1 received from the first slave inverter 305-1 to output the first operation signal ND1 as the first output signal Q1 through the first signal output terminal. The first slave latch-set tri-state inverter 307-1 may be coupled between an output terminal of the first slave inverter 305-1 and an output terminal of the first transmission gate 304-1. Here, the first slave latch-set tri-state inverter 307-1 may invert the first inverted operation signal IND1 received from the first slave inverter 305-1 to output the first operation signal ND1 when the inverted set signal nS has a logic 'high' level, the clock signal CK has a logic 'low' level, and the inverted clock signal ICK has a logic 'high' level. On the other hand, the first slave latch-set tri-state inverter 307-1 may separate the output terminal of the first transmission gate 304-1 from the output terminal of the first slave inverter 305-1 when the inverted set signal nS has a logic 'high' level, the clock signal CK has a logic 'high' level, and the inverted clock signal ICK has a logic 'low' level. In addition, the first slave latch-set tri-state inverter 307-1 may set the first operation signal ND1 to have a logic 'high' level when the inverted set signal nS has a logic 'low' level. As a result, when the inverted set signal nS has a logic 'low' level (i.e., when the set signal has a logic 'high' level), the first flip-flop 300-1 may output the first output signal Q1 having a logic 'high' level.

The second flip-flop 300-2 may include a second input tri-state inverter 301-2, a second logical NAND element 302-2, a second master latch tri-state inverter 303-2, a second transmission gate 304-2, a second slave inverter 305-2, a second output inverter 306-2, and a second slave latch-set tri-state inverter 307-2. The second input tri-state inverter 301-2 may be coupled to a second signal input terminal through which the second input signal D2 is input. That is, the second input tri-state inverter 301-2 may be coupled between the second signal input terminal and the second logical NAND element 302-2. Here, the second input tri-state inverter 301-2 may invert the second input signal D2 to output a second inverted input signal ID2 when the clock signal CK has a logic 'low' level and the inverted clock signal ICK has a logic 'high' level. On the other hand, the second input tri-state inverter 301-2 may separate the second logical NAND element 302-2 from the second signal input terminal when the clock signal CK has a logic 'high' level and the inverted clock signal ICK has a logic 'low' level. The second logical NAND element 302-2 may be coupled to the set terminal through which the inverted set signal nS is input and an output terminal of the second input tri-state inverter 301-2. The second logical NAND element 302-2 may output a second operation signal ND2 by performing a logical NAND operation between the second inverted input signal ID2 received from the second input tri-state inverter 301-2 and the inverted set signal nS input through the set terminal. Thus, when the inverted set signal nS has a logic 'low' level (i.e., when the set signal has a logic 'high' level), the second logical NAND element 302-2 may output the second operation signal ND2 having a logic 'high' level regardless of the second inverted input signal ID2. On the other hand, when the inverted set signal nS has a logic 'high' level (i.e., when the set signal has a logic 'low' level), the second logical NAND element 302-2 may output the second input signal D2 as the second operation signal ND2 by inverting the second inverted input signal ID2. The second master latch tri-state inverter 303-2 may be coupled between an output terminal of the second logical NAND element 302-2 and an output terminal of the second input tri-state inverter 301-2. Here, the second master latch tri-state inverter 303-2 may invert the second operation signal ND2 received from the second logical NAND element 302-2 to output a second inverted operation signal IND2 corresponding to the second inverted input signal ID2 when the clock signal CK has a logic 'high' level and the inverted clock signal ICK has a logic 'low' level. On the other hand, the second master latch tri-state inverter 303-2 may separate the output terminal of the second input tri-state inverter 301-2 from the output terminal of the second logical NAND element 302-2 when the clock signal CK has a logic 'low' level and the inverted clock signal ICK has a logic 'high' level.

The second transmission gate 304-2 may be coupled to the output terminal of the second logical NAND element 302-2. That is, the second transmission gate 304-2 may be coupled between the second logical NAND element 302-2 and the second slave inverter 305-2. The second transmission gate 304-2 may transmit the second operation signal ND2 received from the second logical NAND element 302-2 when the clock signal CK has a logic 'high' level and the inverted clock signal ICK has a logic 'low' level. On the other hand, the second transmission gate 304-2 may separate the second slave inverter 305-2 from the second logical NAND element 302-2 when the clock signal CK has a logic 'low' level and the inverted clock signal ICK has a logic 'high' level. The second slave inverter 305-2 may be coupled to an output terminal of the second transmission gate 304-2. That is, the second slave inverter 305-2 may be coupled between the second transmission gate 304-2 and the second output inverter 306-2. The second slave inverter 305-2 may invert the second operation signal ND2 received from the second transmission gate 304-2 to output the second inverted operation signal IND2. The second output inverter 306-2 may be coupled to an output terminal of the second slave inverter 305-2. That is, the second output inverter 306-2 may be coupled between the second slave inverter 305-2 and a second signal output terminal through which the second output signal Q2 is output. The second output inverter 306-2 may invert the second inverted operation signal IND2 received from the second slave inverter 305-2 to output the second operation signal ND2 as the second output signal Q2 through the second signal output terminal. The second slave latch-set tri-state inverter 307-2 may be coupled between an output terminal of the second slave inverter 305-2 and an output terminal of the second transmission gate 304-2. Here, the second slave latch-set tri-state inverter 307-2 may invert the second inverted operation signal IND2 received from the second slave inverter 305-2 to output the second operation signal ND2 when the inverted set signal nS has a logic 'high' level, the clock signal CK has a logic 'low' level, and the inverted clock signal ICK has a logic 'high' level. On the other hand, the second slave latch-set tri-state inverter 307-2 may separate the output terminal of the second transmission gate 304-2 from the output terminal of the second slave inverter 305-2 when the inverted set signal nS has a logic 'high' level, the clock signal CK has a logic 'high' level, and the inverted clock signal ICK has a logic 'low' level. In addition, the second slave latch-set tri-state inverter 307-2 may set the second operation signal ND2 to have a logic 'high' level when the inverted set signal nS has a logic 'low' level. As a result, when the inverted set signal nS has a logic 'low' level (i.e., when the set signal has a logic 'high' level), the second flip-flop 300-2 may output the second output signal Q2 having a logic 'high' level.

Specifically, when the clock signal CK has a logic 'low' level, the first input tri-state inverter 301-1 of the first flip-flop 300-1 and the second input tri-state inverter 301-2 of the second flip-flop 300-2 may operate, but the first transmission gate 304-1 and the first master latch tri-state inverter 303-1 of the first flip-flop 300-1 and the second transmission gate 304-2 and the second master latch tri-state inverter 303-2 of the second flip-flop 300-2 may not operate. In this situation, when a logic level of the clock signal CK is changed from a logic 'low' level to a logic 'high' level (i.e., the rising edges of the clock signal CK), the first input tri-state inverter 301-1 of the first flip-flop 300-1 and the second input tri-state inverter 301-2 of the second flip-flop 300-2 may not operate, but the first master latch tri-state inverter 303-1 of the first flip-flop 300-1 and the second master latch tri-state inverter 303-2 of the second flip-flop 300-2 may operate. Thus, the first input signal D1 applied to the first signal input terminal and the second input signal D2 applied to the second signal input terminal may be latched. Meanwhile, when the logic level of the clock signal CK is changed from a logic 'low' level to a logic 'high' level, the first transmission gate 304-1 of the first flip-flop 300-1 and the second transmission gate 304-2 of the second flip-flop 300-2 may operate. Thus, the latched first input signal D1 may be output as the first output signal Q1 via the first transmission gate 304-1, the first slave inverter 305-1, and the first output inverter 306-1 of the first flip-flop 300-1, and the latched second input signal D2 may be output as the second output signal Q2 via the second transmission gate 304-2, the second slave inverter 305-2, and the second output inverter 306-2 of the second flip-flop 300-2. Subsequently, when the logic level of the clock signal CK is changed from a logic 'high' level to a logic 'low' level (i.e., the falling edges of the clock signal CK), the first input tri-state inverter 301-1 of the first flip-flop 300-1 and the second input tri-state inverter 301-2 of the second flip-flop 300-2 may operate, but the first transmission gate 304-1 of the first flip-flop 300-1 and the second transmission gate 304-2 of the second flip-flop 300-2 may not operate. Thus, the first slave inverter 305-1 may be separated (or, blocked) from the first logical NAND element 302-1 in the first flip-flop 300-1, and the second slave inverter 305-2 may be separated (or, blocked) from the second logical NAND element 302-2 in the second flip-flop 300-2. Meanwhile, when the logic level of the clock signal CK is changed from a logic 'high' level to a logic 'low' level, the first slave latch-set tri-state inverter 307-1 of the first flip-flop 300-1 and the second slave latch-set tri-state inverter 307-2 of the second flip-flop 300-2 may operate. Thus, the first flip-flop 300-1 may output the latched first input signal D1 as the first output signal Q1 through the first signal output terminal, and the second flip-flop 300-2 may output the latched second input signal D2 as the second output signal Q2 through the second signal output terminal until the logic level of the clock signal CK is changed from a logic 'low' level to a logic 'high' level (i.e., the rising edges of the clock signal CK). However, when the inverted set signal nS having a logic 'low' level is applied to the first and second flip-flops 300-1 and 300-2, the first flip-flop 300-1 may output the first output signal Q1 having a logic 'high' level, and the second flip-flop 300-2 may output the second output signal Q2 having a logic 'high' level.

Figure 10A:
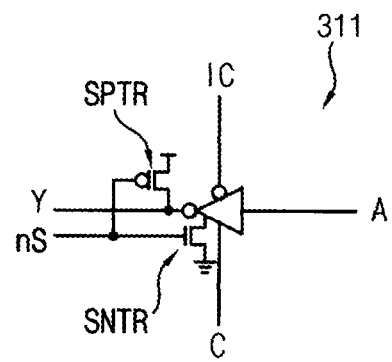
FIG. 10A is a diagram illustrating a slave latch-set tri-state inverter included in the multi-bit flip-flop block of FIG. 9.
Figure 10B:
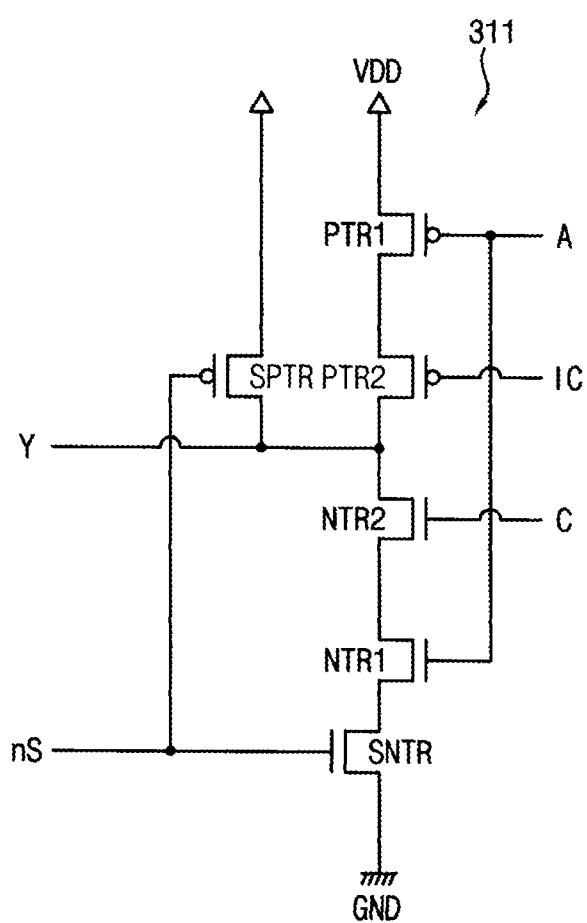
FIG. 10B is a circuit diagram illustrating an example of a slave latch-set tri-state inverter included in the multi-bit flip-flop block of FIG. 9.

FIG. 10A is a diagram illustrating a slave latch-set tri-state inverter included in the multi-bit flip-flop block of FIG. 9. FIG. 10B is a circuit diagram illustrating an example of a slave latch-set tri-state inverter included in the multi-bit flip-flop block of FIG. 9.

Referring to FIGS. 10A and 10B, the slave latch-set tri-state inverter 311 included in the multi-bit flip-flop block 300 may be controlled by a control signal C, an inverted control signal IC that is generated by inverting the control signal C, and an inverted set signal nS. Here, the control signal C may be an inverted clock signal ICK that is generated by inverting a clock signal CK applied to the multi-bit flip-flop block 300, and the inverted control signal IC may be the clock signal CK.

As illustrated in FIG. 10A, the slave latch-set tri-state inverter 311 may perform an operation that inverts an input signal A to output an inverted input signal as an output signal Y when the inverted set signal nS has a logic 'high' level, the control signal C has a logic 'high' level, and the inverted control signal IC has a logic 'low' level. On the other hand, the slave latch-set tri-state inverter 311 may not perform the operation that inverts the input signal A to output the inverted input signal as the output signal Y when the inverted set signal nS has a logic 'high' level, the control signal C has a logic 'low' level, and the inverted control signal IC has a logic 'high' level. In addition, the slave latch-set tri-state inverter 311 may set the output signal Y to have a logic 'high' level when the inverted set signal nS has a logic 'low' level. For this operation, as illustrated in FIG. 10B, the slave latch-set tri-state inverter 311 may include a first PMOS transistor PTR1, a second PMOS transistor PTR2, a first NMOS transistor NTR1, a second NMOS transistor NTR2, a set PMOS transistor SPTR, and a set NMOS transistor SNTR. The set PMOS transistor SPTR may be coupled between an output node and a first power voltage VDD corresponding to a logic 'high' level. For example, the output node may be a node coupled to one electrode of the second PMOS transistor PTR2 and one electrode of the second NMOS transistor NTR2, and thus the output signal Y may be output through the output node. Here, a gate electrode of the set PMOS transistor SPTR may receive the inverted set signal nS. The set NMOS transistor SNTR may be coupled between the first NMOS transistor NTR1 and a second power voltage GND corresponding to a logic 'low' level. Here, a gate electrode of the set NMOS transistor SNTR may receive the inverted set signal nS. The first PMOS transistor PTR1 may be coupled between the second PMOS transistor PTR2 and the first power voltage VDD corresponding to a logic 'high' level. Here, a gate electrode of the first PMOS transistor PTR1 may receive the input signal A. The second PMOS transistor PTR2 may be coupled between the first PMOS transistor PTR1 and the second NMOS transistor NTR2. Here, a gate electrode of the second PMOS transistor PTR2 may receive the inverted control signal IC. The first NMOS transistor NTR1 may be coupled between the second NMOS transistor NTR2 and the set NMOS transistor SNTR. Here, a gate electrode of the first NMOS transistor NTR1 may receive the input signal A. The second NMOS transistor NTR2 may be coupled between the first NMOS transistor NTR1 and the second PMOS transistor PTR2. Here, a gate electrode of the second NMOS transistor NTR2 may receive the control signal C. Thus, when the control signal C has a logic 'high' level and the inverted control signal IC has a logic 'low' level, the second NMOS transistor NTR2 and the second PMOS transistor PTR2 may be turned on. Here, when the inverted set signal nS has a logic 'high' level and the input signal A has a logic 'high' level, the set NMOS transistor SNTR and the first NMOS transistor NTR1 may be turned on, so that the output signal Y having a logic 'low' level may be output. On the other hand, when the inverted set signal nS has a logic 'high' level and the input signal A has a logic 'low' level, the set NMOS transistor SNTR and the first PMOS transistor PTR1 may be turned on, so that the output signal Y having a logic 'high' level may be output. In addition, when the inverted set signal nS has a logic 'low' level, the set PMOS transistor SPTR may be turned on, so that the output signal Y may be set to have a logic 'high' level. Since the slave latch-set tri-state inverter 311 illustrated in FIGS. 10A and 10B is an example, the slave latch-set tri-state inverter 311 included in the multi-bit flip-flop block 300 is not limited thereto.

Figure 11:
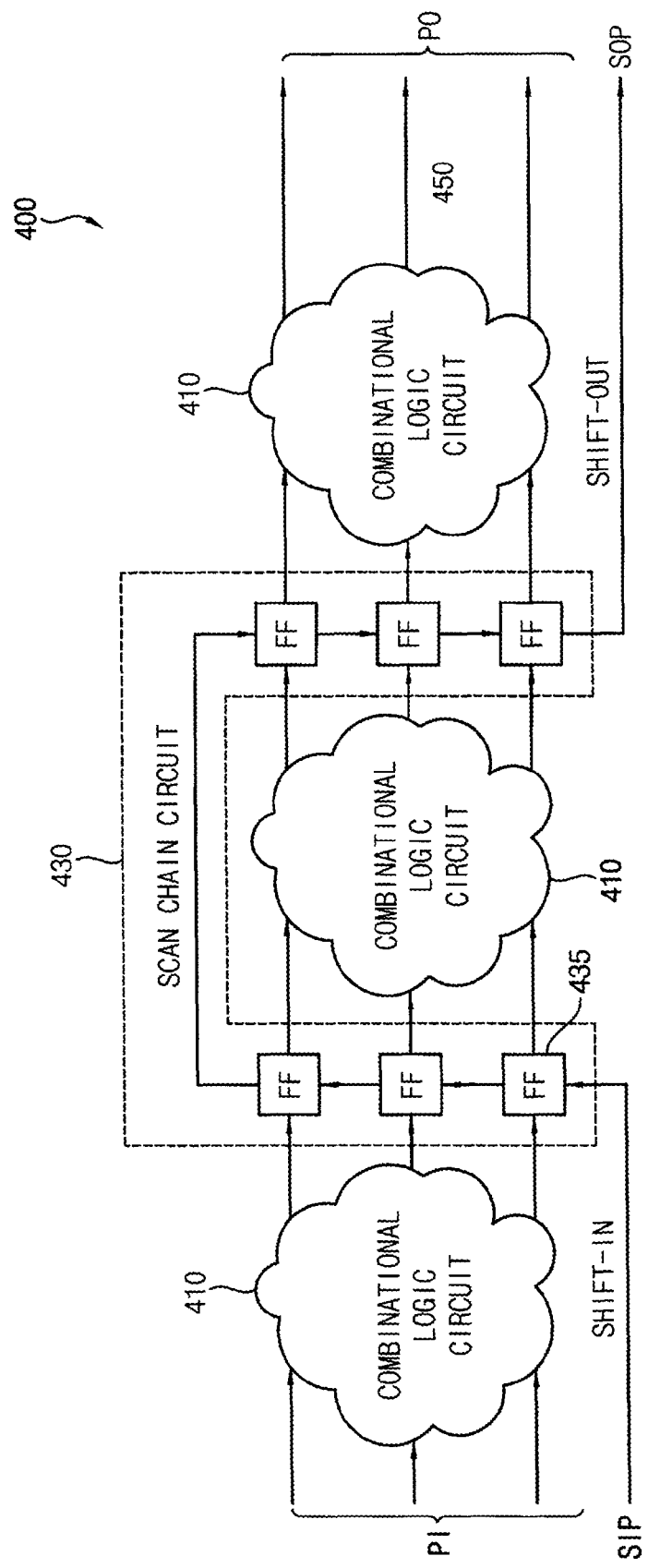
FIG. 11 is a block diagram illustrating an integrated circuit including a scan chain circuit according to example embodiments.
Figure 12:
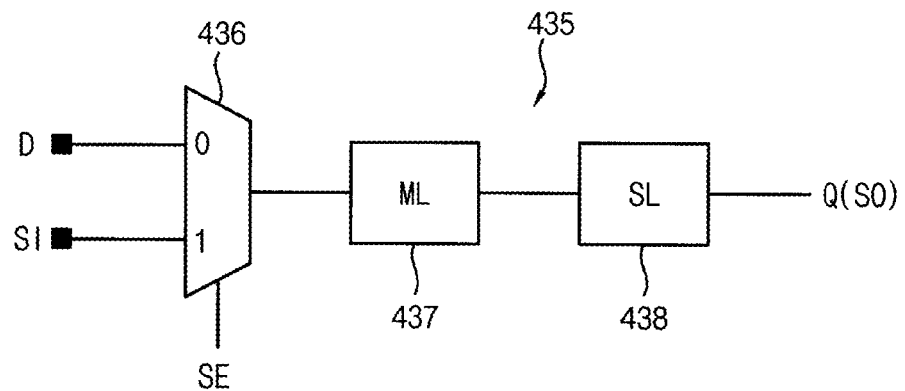
FIG. 12 is a block diagram for describing an operation of a flip-flop included in the scan chain circuit of the integrated circuit of FIG. 11.
Figure 13:
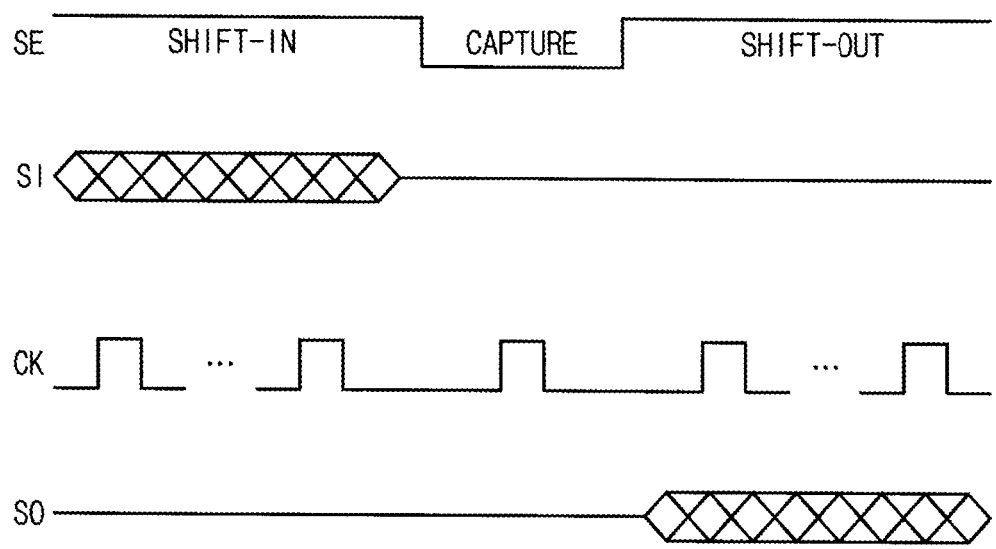
FIG. 13 is a timing diagram for describing an operation of a flip-flop included in the scan chain circuit of the integrated circuit of FIG. 11.

FIG. 11 is a block diagram illustrating an integrated circuit including a scan chain circuit according to example embodiments. FIG. 12 is a block diagram for describing an operation of a flip-flop included in the scan chain circuit of the integrated circuit of FIG. 11. FIG. 13 is a timing diagram for describing an operation of a flip-flop included in the scan chain circuit of the integrated circuit of FIG. 11.

Referring to FIGS. 11 through 13, the integrated circuit 400 may include a combinational logic circuit 410 and a scan chain circuit 430. Here, the combinational logic circuit 410 may include a plurality of flip-flops 435, and the flip-flops 435 may form a scan path by being coupled to the combinational logic circuit 410. Although it is illustrated in FIG. 11 that all combinational logic circuits 410 are coupled to the scan chain circuit 430 in the integrated circuit 400, some combinational logic circuits 410 for which a scan test is not performed may not be coupled to the scan chain circuit 430 in the integrated circuit 400. In some example embodiments, the integrated circuit 400 may be implemented as a system on-chip (SOC).

The combinational logic circuit 410 may include logic cones, multiplexers, etc. Here, the combinational logic circuit 410 may be coupled to the scan chain circuit 430 in order that a scan test is performed for the combinational logic circuit 410. Generally, a scan test may be performed for the integrated circuit 400 by performing a shift-in operation that sequentially loads a test pattern SI on the scan chain circuit 430 (i.e., indicated as SHIFT-IN), by performing a capture operation that stores an observation value SO of the combinational logic circuit 410 in the scan chain circuit 430 (i.e., indicated as CAPTURE), where the observation value SO is generated based on the test pattern SI loaded on the scan chain circuit 430, and by performing a shift-out operation that sequentially outputs the observation value SO stored in the scan chain circuit 430 (i.e., indicated as SHIFT-OUT). To this end, the scan chain circuit 430 may include a plurality of multi-bit flip-flop blocks that share a clock signal CK, and each of the multi-bit flip-flop blocks may include a plurality of flip-flops 435 and a single inverter that provides the clock signal CK and an inverted clock signal for driving (or, operating) the flip-flops 435, where the inverted clock signal is generated by inverting the clock signal CK. Here, the flip-flops 435 included in the scan chain circuit 430 may be triggered at rising edges of the clock signal CK (i.e., at falling edges of the inverted clock signal). In an example embodiment, each of the flip-flops 435 included in the scan chain circuit 430 may include a multiplexer part 436, a master latch part 437, and a slave latch part 438. In this case, the flip-flops 435 included in the scan chain circuit 430 may have the same structure. For example, as illustrated in FIGS. 12 and 13, when a scan enable signal SE has a logic 'high' level, the flip-flop 435 may output a scan test signal SI as an output signal Q via the master latch part 437 and the slave latch part 438. On the other hand, when the scan enable signal SE has a logic 'low' level, the flip-flop 435 may output an input signal D (i.e., input data) as the output signal Q via the master latch part 437 and the slave latch part 438. Thus, each of the flip-flops 435 may selectively operate in a normal operation mode or in a scan test mode based on the scan enable signal SE applied to each of the flip-flops 435. In another example embodiment, each of first flip-flops of the flip-flops 435 included in the scan chain circuit 430 may include the multiplexer part 436, the master latch part 437, and the slave latch part 438, and each of second flip-flops of the flip-flops 435 included in the scan chain circuit 430 may include the multiplexer part 436, the master latch part 437, and the slave latch part 438. In this case, a structure of each of the first flip-flops may be different from a structure of each of the second flip-flops. In still another example embodiment, each of first flip-flops of the flip-flops 435 included in the scan chain circuit 430 may include the multiplexer part 436, the master latch part 437, and the slave latch part 438, and each of second flip-flops of the flip-flops 435 included in the scan chain circuit 430 may include the master latch part 437 and the slave latch part 438. In this case, a structure of each of the first flip-flops may be different from a structure of each of the second flip-flops. The above example embodiments will be described in detail with reference to FIGS. 14 through 19.

As illustrated in FIGS. 11 through 13, while the scan enable signal SE applied to the integrated circuit 400 has a logic 'high' level, the shift-in operation that sequentially applying a specific test pattern SI (i.e., scan test signals) to the scan chain circuit 430 through a scan test input terminal SIP of the integrated circuit 400 may be performed (i.e., indicated as SHIFT-IN). Next, the capture operation that stores the observation value SO of the combinational logic circuit 410 in the scan chain circuit 430 may be performed (i.e., indicated as CAPTURE), where the observation value SO is generated based on the test pattern SI loaded on the scan chain circuit 430. Here, the scan enable signal SE applied to the integrated circuit 400 may have a logic 'low' level. Subsequently, while the scan enable signal SE applied to the integrated circuit 400 has a logic 'high' level again, the shift-out operation that sequentially outputs the observation value SO stored in the scan chain circuit 430 through a scan test output terminal SOP of the integrated circuit 400 may be performed (i.e., indicated as SHIFT-OUT). As described above, the flip-flops 435 included in the scan chain circuit 430 may operate based on the clock signal CK (i.e., may be triggered at the rising edges of the clock signal CK). In some example embodiments, a plurality of test patterns SI may be used for the scan test. In this case, the shift-out operation that outputs the observation value SO generated based on a test pattern SI may be concurrently performed with the shift-in operation that inputs a next test pattern SI. Although it is illustrated in FIG. 11 that a specific test pattern SI is sequentially applied through the scan test input terminal SIP, and then the observation value SO stored in the scan chain circuit 430 is sequentially output through the scan test output terminal SOP, a way of performing the scan test for the integrated circuit 400 is not limited thereto. For example, a specific test pattern SI may be sequentially applied through one of main input terminals PI of the combinational logic circuit 410, and then the observation value SO stored in the scan chain circuit 430 may be sequentially output through one of main output terminals PO of the combinational logic circuit 410. In this case, the integrated circuit 400 may further include a multiplexer by which one of the main input terminals PI is used as the scan test input terminal SIP while the scan test is performed, a multiplexer by which one of the main output terminals PO is used as the scan test output terminal SOP while the scan test is performed, etc. However, the scan test input terminal SIP and the scan test output terminal SOP of the integrated circuit 400 may be determined in various ways.

Figure 14:
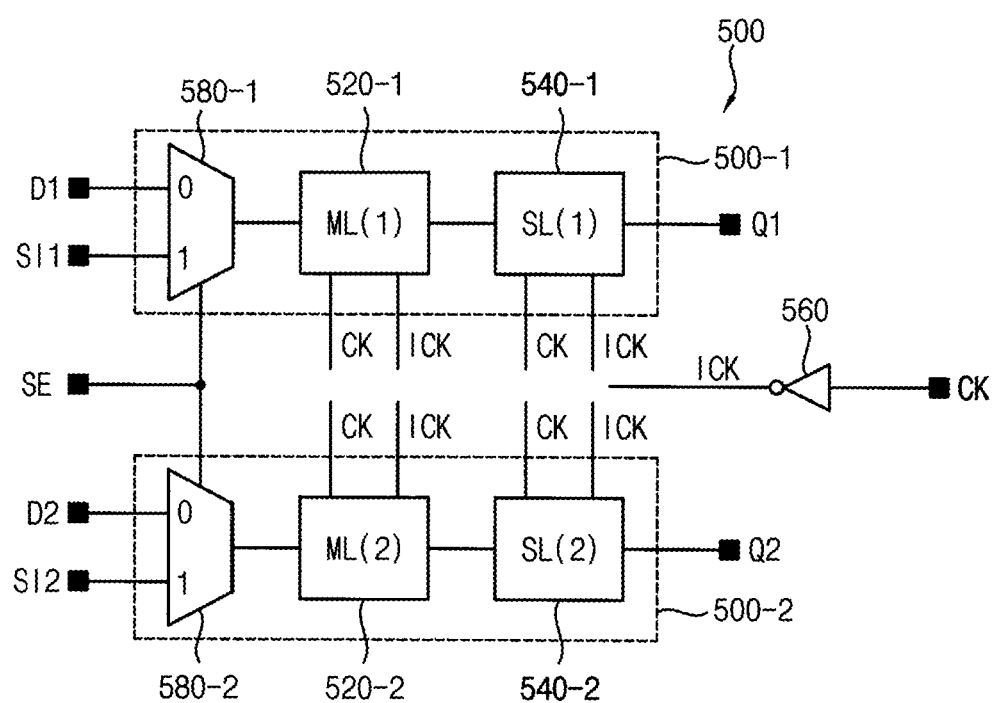
FIG. 14 is a block diagram illustrating an example of a multi-bit flip-flop block included in the scan chain circuit of the integrated circuit of FIG. 11.

FIG. 14 is a block diagram illustrating an example of a multi-bit flip-flop block included in the scan chain circuit of the integrated circuit of FIG. 11.

Referring to FIG. 14, the scan chain circuit 430 may include a plurality of multi-bit flip-flop blocks 500. Here, each of the multi-bit flip-flop blocks 500 may include a single inverter 560 and a plurality of flip-flops 500-1 through 500-n. In FIG. 14, only one multi-bit flip-flop block 500 is illustrated. The flip-flops 500-1 through 500-n may be triggered at rising edges of a clock signal CK. For convenience of description, it is illustrated in FIG. 14 that the multi-bit flip-flop block 500 includes the single inverter 560, the first flip-flop 500-1, and the second flip-flop 500-2. As illustrated in FIG. 14, each of the first and second flip-flops 500-1 and 500-2 may be coupled to the single inverter 560, and thus each of the first and second flip-flops 500-1 and 500-2 may receive the clock signal CK and an inverted clock signal ICK that is generated by inverting the clock signal CK. Here, when a scan enable signal SE has a logic 'low' level, the first flip-flop 500-1 may output a first input signal D1 latched at rising edges of the clock signal CK (i.e., at falling edges of the inverted clock signal ICK) as a first output signal Q1, and the second flip-flop 500-2 may output a second input signal D2 latched at the rising edges of the clock signal CK (i.e., at the falling edges of the inverted clock signal ICK) as a second output signal Q2. On the other hand, when the scan enable signal SE has a logic 'high' level, the first flip-flop 500-1 may output a first scan test signal SI1 latched at the rising edges of the clock signal CK (i.e., at the falling edges of the inverted clock signal ICK) as the first output signal Q1, and the second flip-flop 500-2 may output a second scan test signal SI2 latched at the rising edges of the clock signal CK (i.e., at the falling edges of the inverted clock signal ICK) as the second output signal Q2.

The first flip-flop 500-1 may include a first master latch part 520-1, a first slave latch part 540-1, and a first multiplexer part 580-1. The first flip-flop 500-1 may operate the first master latch part 520-1 and the first slave latch part 540-1 based on the clock signal CK and the inverted clock signal ICK. As illustrated in FIG. 14, the first master latch part 520-1 and the first slave latch part 540-1 may receive the clock signal CK and the inverted clock signal ICK. In addition, the first master latch part 520-1 and the first slave latch part 540-1 may be controlled by the clock signal CK and the inverted clock signal ICK. Specifically, when the scan enable signal SE has a logic 'low' level (i.e., a normal operation mode), the first master latch part 520-1 may latch the first input signal D1 at the rising edges of the clock signal CK (i.e., at the falling edges of the inverted clock signal ICK) to transmit a transmission signal corresponding to the first input signal D1 to the first slave latch part 540-1, and the first slave latch part 540-1 may latch the transmission signal transmitted from the first master latch part 520-1 to output the first output signal Q1 based on the latched transmission signal. In addition, when the scan enable signal SE has a logic 'high' level (i.e., a scan test mode), the first master latch part 520-1 may latch the first scan test signal SI1 at the rising edges of the clock signal CK (i.e., at the falling edges of the inverted clock signal ICK) to transmit a transmission signal corresponding to the first scan test signal SI1 to the first slave latch part 540-1, and the first slave latch part 540-1 may latch the transmission signal transmitted from the first master latch part 520-1 to output the first output signal Q1 based on the latched transmission signal. In other words, the first flip-flop 500-1 may be triggered at the rising edges of the clock signal CK. In an example embodiment, the first flip-flop 500-1 may include a reset function that resets the first output signal Q1 to have a first logic level (e.g., a logic 'low' level). In another example embodiment, the first flip-flop 500-1 may include a set function that sets the first output signal Q1 to have a second logic level (e.g., a logic 'high' level). In still another example embodiment, the first flip-flop 500-1 may include the reset function that resets the first output signal Q1 to have the first logic level and the set function that sets the first output signal Q1 to have the second logic level. In some example embodiments, the first flip-flop 500-1 may include other functions. For example, the first flip-flop 500-1 may include a retention function that retains (or, maintains) data.

The second flip-flop 500-2 may include a second master latch part 520-2, a second slave latch part 540-2, and a second multiplexer part 580-2. The second flip-flop 500-2 may operate the second master latch part 520-2 and the second slave latch part 540-2 based on the clock signal CK and the inverted clock signal ICK. As illustrated in FIG. 14, the second master latch part 520-2 and the second slave latch part 540-2 may receive the clock signal CK and the inverted clock signal ICK. In addition, the second master latch part 520-2 and the second slave latch part 540-2 may be controlled by the clock signal CK and the inverted clock signal ICK. Specifically, when the scan enable signal SE has a logic 'low' level (i.e., the normal operation mode), the second master latch part 520-2 may latch the second input signal D2 at the rising edges of the clock signal CK (i.e., at the falling edges of the inverted clock signal ICK) to transmit a transmission signal corresponding to the second input signal D2 to the second slave latch part 540-2, and the second slave latch part 540-2 may latch the transmission signal transmitted from the second master latch part 520-2 to output the second output signal Q2 based on the latched transmission signal. In addition, when the scan enable signal SE has a logic 'high' level (i.e., the scan test mode), the second master latch part 520-2 may latch the second scan test signal SI2 at the rising edges of the clock signal CK (i.e., at the falling edges of the inverted clock signal ICK) to transmit a transmission signal corresponding to the second scan test signal SI2 to the second slave latch part 540-2, and the second slave latch part 540-2 may latch the transmission signal transmitted from the second master latch part 520-2 to output the second output signal Q2 based on the latched transmission signal. In other words, the second flip-flop 500-2 may be triggered at the rising edges of the clock signal CK. In an example embodiment, the second flip-flop 500-2 may include a reset function that resets the second output signal Q2 to have a first logic level (e.g., a logic 'low' level). In another example embodiment, the second flip-flop 500-2 may include a set function that sets the second output signal Q2 to have a second logic level (e.g., a logic 'high' level). In still another example embodiment, the second flip-flop 500-2 may include the reset function that resets the second output signal Q2 to have the second logic level and the set function that sets the second output signal Q2 to have the second logic level. In some example embodiments, the second flip-flop 500-2 may include other functions. For example, the second flip-flop 500-2 may include a retention function that retains (or, maintains) data.

The single inverter 560 may invert the clock signal CK to generate the inverted clock signal ICK and may provide the clock signal CK and the inverted clock signal ICK to the first flip-flop 500-1 and the second flip-flop 500-2. Since the multi-bit flip-flop block 500 has a structure including only the single inverter 560, the scan chain circuit 430 may reduce power consumption compared to a conventional scan chain circuit that has a structure including a plurality of inverters, where the power consumption occurs in a clock path including the inverters as the inverters operate whenever the clock signal CK transmitted through the clock path is changed from a logic 'low' level to a logic 'high' level or from a logic 'high' level to a logic 'low' level (i.e., toggled). In brief, the scan chain circuit 430 may minimize (or, reduce) power consumption occurring in a clock path through which the clock signal CK is transmitted (or, transferred) by including the multi-bit flip-flop blocks 500 each including the single inverter 560 that inverts the clock signal CK to generate the inverted clock signal ICK and the flip-flops 500-1 through 500-n that are triggered at the rising edges of the clock signal CK, where each of the flip-flops 500-1 through 500-n includes the master latch part 520-1 through 520-n, the slave latch part 540-1 through 540-n, and the multiplexer part 580-1 through 580-n, and by controlling the multi-bit flip-flop blocks 500 to share the clock signal CK. As a result, the scan chain circuit 430 may operate at low power, so that the scan chain circuit 430 may be applied to low power and high performance chips for low power and high performance mobile devices. In addition, since the multi-bit flip-flop block 500 of the scan chain circuit 430 includes the flip-flops 500-1 through 500-n and the single inverter 560 that provides the clock signal CK and the inverted clock signal ICK for controlling the flip-flops 500-1 through 500-n, the multi-bit flip-flop block 500 of the scan chain circuit 430 may trigger the flip-flops 500-1 through 500-n based on the clock signal CK and the inverted clock signal ICK. Thus, the scan chain circuit 430 may facilitate a scan test to be efficiently performed for an integrated circuit including the scan chain circuit 430.

Figure 15:
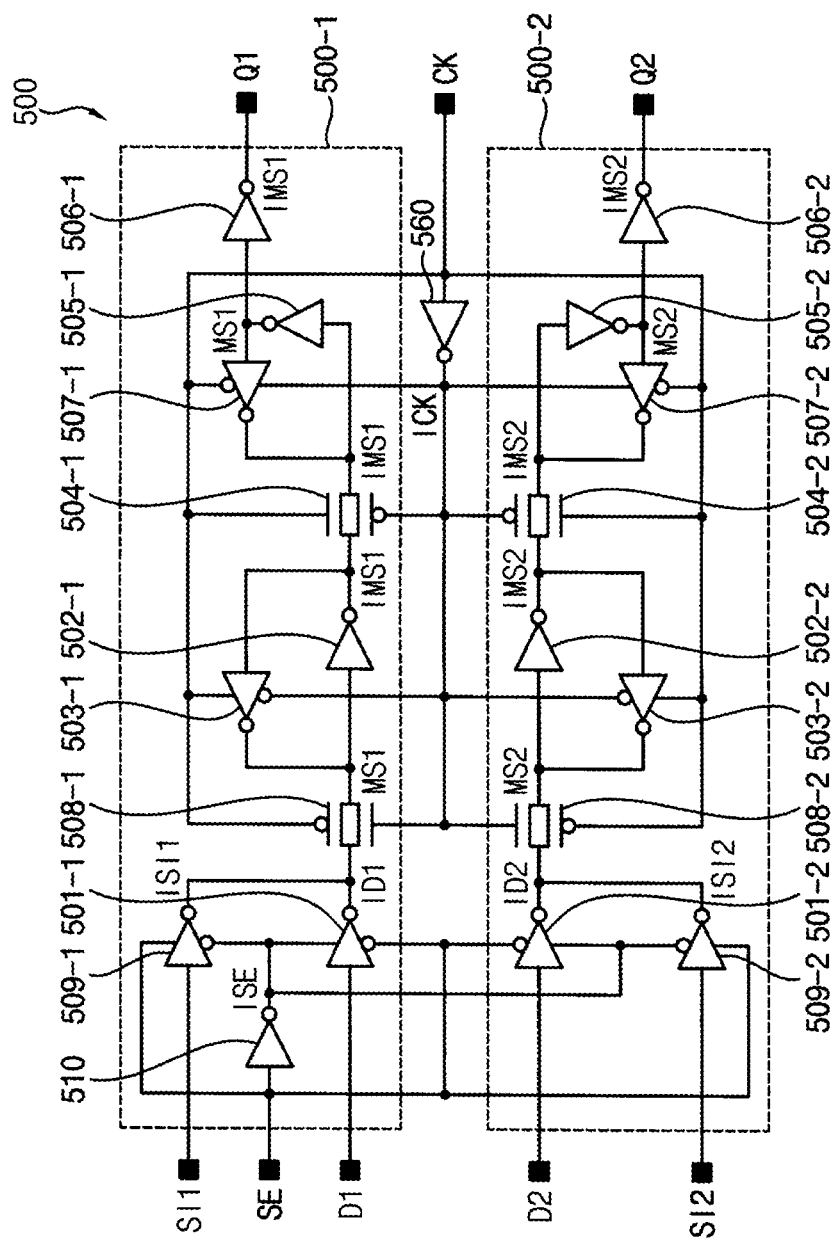
FIG. 15 is a circuit diagram illustrating an example of a multi-bit flip-flop block included in the scan chain circuit of the integrated circuit of FIG. 11.

FIG. 15 is a circuit diagram illustrating an example of a multi-bit flip-flop block included in the scan chain circuit of the integrated circuit of FIG. 11.

Referring to FIG. 15, the scan chain circuit 430 may include a plurality of multi-bit flip-flop blocks 500. Here, each of the multi-bit flip-flop blocks 500 may include a single inverter 560, a first flip-flop 500-1, and a second flip-flop 500-2. For convenience of description, only one multi-bit flip-flop block 500 is illustrated in FIG. 15. Here, the first flip-flop 500-1 may latch a first input signal D1 or a first scan test signal SI1 at rising edges of a clock signal CK (i.e., at falling edges of an inverted clock signal ICK) to output the first input signal D1 or the first scan test signal SI1 as a first output signal Q1, and the second flip-flop 500-2 may latch a second input signal D2 or a second scan test signal SI2 at the rising edges of the clock signal CK (i.e., at the falling edges of the inverted clock signal ICK) to output the second input signal D2 or the second scan test signal SI2 as a second output signal Q2. However, since a structure of the multi-bit flip-flop block 500 illustrated in FIG. 15 is an example, a structure of the multi-bit flip-flop block 500 is not limited thereto. Meanwhile, since an operation (or, interaction) between the master latch part and the slave latch part in the flip-flops 500-1 through 500-n is described above, duplicated description will not be repeated.

The first flip-flop 500-1 may include a selection inverter 510, a first input tri-state inverter 501-1, a first scan tri-state inverter 509-1, a first multiplexing transmission gate 508-1, a first master inverter 502-1, a first master latch tri-state inverter 503-1, a first transmission gate 504-1, a first slave inverter 505-1, a first output inverter 506-1, and a first slave latch tri-state inverter 507-1. The selection inverter 510 may be coupled to a scan enable signal input terminal through which the scan enable signal SE is input. The selection inverter 510 may invert the scan enable signal SE to output an inverted scan enable signal ISE. The first input tri-state inverter 501-1 may be coupled to a first signal input terminal through which the first input signal D1 is input. That is, the first input tri-state inverter 501-1 may be coupled between the first signal input terminal and the first multiplexing transmission gate 508-1. Here, the first input tri-state inverter 501-1 may invert the first input signal D1 to output a first inverted input signal ID1 when the inverted scan enable signal ISE has a logic 'high' level and the scan enable signal SE has a logic 'low' level. On the other hand, the first input tri-state inverter 501-1 may separate the first multiplexing transmission gate 508-1 from the first signal input terminal when the inverted scan enable signal ISE has a logic 'low' level and the scan enable signal SE has a logic 'high' level. The first scan tri-state inverter 509-1 may be coupled to the first scan input terminal through which the first scan test signal SI1 is input. That is, the first scan tri-state inverter 509-1 may be coupled between the first scan input terminal and the first multiplexing transmission gate 508-1. Here, the first scan tri-state inverter 509-1 may invert the first scan test signal SI1 to output the first inverted scan test signal ISI1 when the scan enable signal SE has a logic 'high' level and the inverted scan enable signal ISE has a logic 'low' level. On the other hand, the first scan tri-state inverter 509-1 may separate the first multiplexing transmission gate 508-1 from the first scan input terminal when the scan enable signal SE has a logic 'low' level and the inverted scan enable signal ISE has a logic 'high' level. The first multiplexing transmission gate 508-1 may be coupled to an output terminal of the first input tri-state inverter 501-1 and an output terminal of the first scan tri-state inverter 509-1. The first multiplexing transmission gate 508-1 may transmit the first inverted input signal ID1 or the first inverted scan test signal ISI1 as a first multiplexing signal MS1 when the clock signal CK has a logic 'low' level and the inverted clock signal ICK has a logic 'high' level. On the other hand, the first multiplexing transmission gate 508-1 may separate the first master inverter 502-1 from the first input tri-state inverter 501-1 and the first scan tri-state inverter 509-1 when the clock signal CK has a logic 'high' level and the inverted clock signal ICK has a logic 'low' level. The first master inverter 502-1 may be coupled to an output terminal of the first multiplexing transmission gate 508-1. That is, the first master inverter 502-1 may be coupled between the first multiplexing transmission gate 508-1 and the first transmission gate 504-1. Here, the first master inverter 502-1 may invert the first multiplexing signal MS1 received from the first multiplexing transmission gate 508-1 to output a first inverted multiplexing signal IMS1. The first master latch tri-state inverter 503-1 may be coupled between an output terminal of the first master inverter 502-1 and an output terminal of the first multiplexing transmission gate 508-1. Here, the first master latch tri-state inverter 503-1 may invert the first inverted multiplexing signal IMS1 received from the first master inverter 502-1 to output the first multiplexing signal MS1 when the clock signal CK has a logic 'high' level and the inverted clock signal ICK has a logic 'low' level. On the other hand, the first master latch tri-state inverter 503-1 may separate the output terminal of the first multiplexing transmission gate 508-1 from the output terminal of the first master inverter 502-1 when the clock signal CK has a logic 'low' level and the inverted clock signal ICK has a logic 'high' level.

The first transmission gate 504-1 may be coupled to the output terminal of the first master inverter 502-1. That is, the first transmission gate 504-1 may be coupled between the first master inverter 502-1 and the first slave inverter 505-1. The first transmission gate 504-1 may transmit the first inverted multiplexing signal IMS1 received from the first master inverter 502-1 when the clock signal CK has a logic 'high' level and the inverted clock signal ICK has a logic 'low' level. On the other hand, the first transmission gate 504-1 may separate the first slave inverter 505-1 from the first master inverter 502-1 when the clock signal CK has a logic 'low' level and the inverted clock signal ICK has a logic 'high' level. The first slave inverter 505-1 may be coupled to an output terminal of the first transmission gate 504-1. That is, the first slave inverter 505-1 may be coupled between the first transmission gate 504-1 and the first output inverter 506-1. The first slave inverter 505-1 may invert the first inverted multiplexing signal IMS1 received from the first transmission gate 504-1 to output the first multiplexing signal MS1. The first output inverter 506-1 may be coupled to an output terminal of the first slave inverter 505-1. That is, the first output inverter 506-1 may be coupled between the first slave inverter 505-1 and a first signal output terminal through which the first output signal Q1 is output. The first output inverter 506-1 may invert the first multiplexing signal MS1 received from the first slave inverter 505-1 to output the first inverted multiplexing signal IMS1 as the first output signal Q1 through the first signal output terminal. The first slave latch tri-state inverter 507-1 may be coupled between an output terminal of the first slave inverter 505-1 and an output terminal of the first transmission gate 504-1. Here, the first slave latch tri-state inverter 507-1 may invert the first multiplexing signal MS1 received from the first slave inverter 505-1 to output the first inverted multiplexing signal IMS1 when the clock signal CK has a logic 'low' level and the inverted clock signal ICK has a logic 'high' level. On the other hand, the first slave latch tri-state inverter 507-1 may separate the output terminal of the first transmission gate 504-1 from the output terminal of the first slave inverter 505-1 when the clock signal CK has a logic 'high' level and the inverted clock signal ICK has a logic 'low' level.

The second flip-flop 500-2 may include a second input tri-state inverter 501-2, a second scan tri-state inverter 509-2, a second multiplexing transmission gate 508-2, a second master inverter 502-2, a second master latch tri-state inverter 503-2, a second transmission gate 504-2, a second slave inverter 505-2, a second output inverter 506-2, and a second slave latch tri-state inverter 507-2. The second input tri-state inverter 501-2 may be coupled to a second signal input terminal through which the second input signal D2 is input. That is, the second input tri-state inverter 501-2 may be coupled between the second signal input terminal and the second multiplexing transmission gate 508-2. Here, the second input tri-state inverter 501-2 may invert the second input signal D2 to output a second inverted input signal ID2 when the inverted scan enable signal ISE has a logic 'high' level and the scan enable signal SE has a logic 'low' level. On the other hand, the second input tri-state inverter 501-2 may separate the second multiplexing transmission gate 508-2 from the second signal input terminal when the inverted scan enable signal ISE has a logic 'low' level and the scan enable signal SE has a logic 'high' level. The second scan tri-state inverter 509-2 may be coupled to the second scan input terminal through which the second scan test signal SI2 is input. That is, the second scan tri-state inverter 509-2 may be coupled between the second scan input terminal and the second multiplexing transmission gate 508-2. Here, the second scan tri-state inverter 509-2 may invert the second scan test signal SI2 to output the second inverted scan test signal ISI2 when the scan enable signal SE has a logic 'high' level and the inverted scan enable signal ISE has a logic 'low' level. On the other hand, the second scan tri-state inverter 509-2 may separate the second multiplexing transmission gate 508-2 from the second scan input terminal when the scan enable signal SE has a logic 'low' level and the inverted scan enable signal ISE has a logic 'high' level. The second multiplexing transmission gate 508-2 may be coupled to an output terminal of the second input tri-state inverter 501-2 and an output terminal of the second scan tri-state inverter 509-2. The second multiplexing transmission gate 508-2 may transmit the second inverted input signal ID2 or the second inverted scan test signal ISI2 as a second multiplexing signal MS2 when the clock signal CK has a logic 'low' level and the inverted clock signal ICK has a logic 'high' level. On the other hand, the second multiplexing transmission gate 508-2 may separate the second master inverter 502-2 from the second input tri-state inverter 501-2 and the second scan tri-state inverter 509-2 when the clock signal CK has a logic 'high' level and the inverted clock signal ICK has a logic 'low' level. The second master inverter 502-2 may be coupled to an output terminal of the second multiplexing transmission gate 508-2. That is, the second master inverter 502-2 may be coupled between the second multiplexing transmission gate 508-2 and the second transmission gate 504-2. Here, the second master inverter 502-2 may invert the second multiplexing signal MS2 received from the second multiplexing transmission gate 508-2 to output a second inverted multiplexing signal IMS2. The second master latch tri-state inverter 503-2 may be coupled between an output terminal of the second master inverter 502-2 and an output terminal of the second multiplexing transmission gate 508-2. Here, the second master latch tri-state inverter 503-2 may invert the second inverted multiplexing signal IMS2 received from the second master inverter 502-2 to output the second multiplexing signal MS2 when the clock signal CK has a logic 'high' level and the inverted clock signal ICK has a logic 'low' level. On the other hand, the second master latch tri-state inverter 503-2 may separate the output terminal of the second multiplexing transmission gate 508-2 from the output terminal of the second master inverter 502-2 when the clock signal CK has a logic 'low' level and the inverted clock signal ICK has a logic 'high' level.

The second transmission gate 504-2 may be coupled to the output terminal of the second master inverter 502-2. That is, the second transmission gate 504-2 may be coupled between the second master inverter 502-2 and the second slave inverter 505-2. The second transmission gate 504-2 may transmit the second inverted multiplexing signal IMS2 received from the second master inverter 502-2 when the clock signal CK has a logic 'high' level and the inverted clock signal ICK has a logic 'low' level. On the other hand, the second transmission gate 504-2 may separate the second slave inverter 505-2 from the second master inverter 502-2 when the clock signal CK has a logic 'low' level and the inverted clock signal ICK has a logic 'high' level. The second slave inverter 505-2 may be coupled to an output terminal of the second transmission gate 504-2. That is, the second slave inverter 505-2 may be coupled between the second transmission gate 504-2 and the second output inverter 506-2. The second slave inverter 505-2 may invert the second inverted multiplexing signal IMS2 received from the second transmission gate 504-2 to output the second multiplexing signal MS2. The second output inverter 506-2 may be coupled to an output terminal of the second slave inverter 505-2. That is, the second output inverter 506-2 may be coupled between the second slave inverter 505-2 and a second signal output terminal through which the second output signal Q2 is output. The second output inverter 506-2 may invert the second multiplexing signal MS2 received from the second slave inverter 505-2 to output the second inverted multiplexing signal IMS2 as the second output signal Q2 through the second signal output terminal. The second slave latch tri-state inverter 507-2 may be coupled between an output terminal of the second slave inverter 505-2 and an output terminal of the second transmission gate 504-2. Here, the second slave latch tri-state inverter 507-2 may invert the second multiplexing signal MS2 received from the second slave inverter 505-2 to output the second inverted multiplexing signal IMS2 when the clock signal CK has a logic 'low' level and the inverted clock signal ICK has a logic 'high' level. On the other hand, the second slave latch tri-state inverter 507-2 may separate the output terminal of the second transmission gate 504-2 from the output terminal of the second slave inverter 505-2 when the clock signal CK has a logic 'high' level and the inverted clock signal ICK has a logic 'low' level. Although it is illustrated in FIG. 15 that the selection inverter 510 is located in the first flip-flop 500-1, in some example embodiments, the selection inverter 510 may be located in the second flip-flop 500-2.

Figure 16:
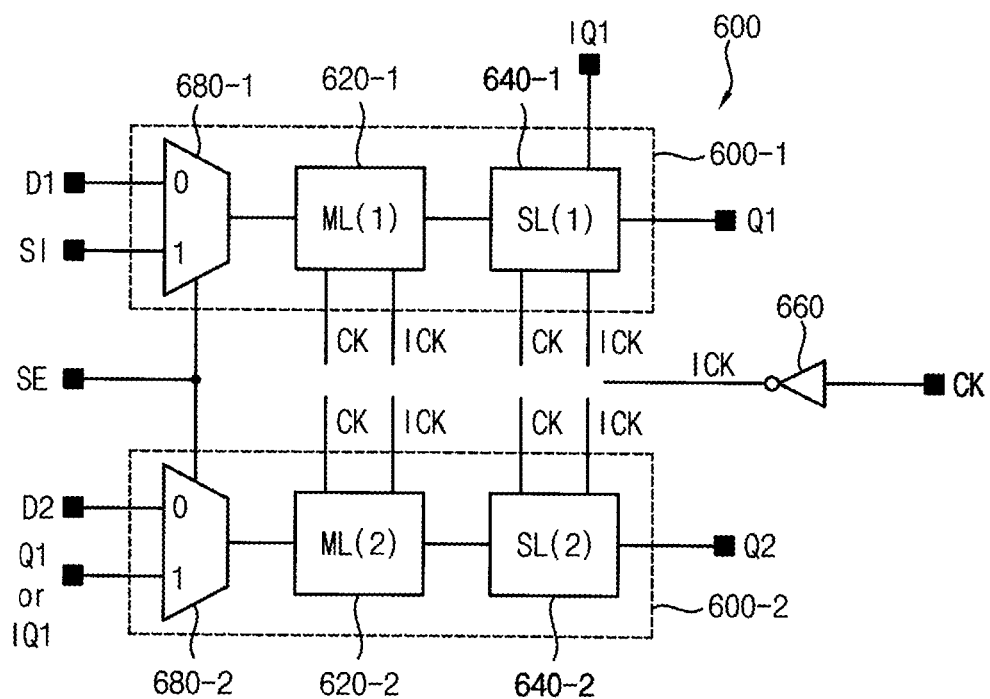
FIG. 16 is a block diagram illustrating another example of a multi-bit flip-flop block included in the scan chain circuit of the integrated circuit of FIG. 11.

FIG. 16 is a block diagram illustrating another example of a multi-bit flip-flop block included in the scan chain circuit of the integrated circuit of FIG. 11.

Referring to FIG. 16, the scan chain circuit 430 may include a plurality of multi-bit flip-flop blocks 600. Here, each of the multi-bit flip-flop blocks 600 may include a single inverter 660 and a plurality of flip-flops 600-1 through 600-n. In FIG. 16, only one multi-bit flip-flop block 600 is illustrated. The flip-flops 600-1 through 600-n may be triggered at rising edges of a clock signal CK. For convenience of description, it is illustrated in FIG. 16 that the multi-bit flip-flop block 600 includes the single inverter 660, the first flip-flop 600-1, and the second flip-flop 600-2. As illustrated in FIG. 16, each of the first and second flip-flops 600-1 and 600-2 may be coupled to the single inverter 660, and thus each of the first and second flip-flops 600-1 and 600-2 may receive the clock signal CK and an inverted clock signal ICK that is generated by inverting the clock signal CK. Here, when a scan enable signal SE has a logic 'low' level, the first flip-flop 600-1 may output a first input signal D1 latched at rising edges of the clock signal CK (i.e., at falling edges of the inverted clock signal ICK) as a first output signal Q1. On the other hand, when the scan enable signal SE has a logic 'high' level, the first flip-flop 600-1 may output a scan test signal SI latched at the rising edges of the clock signal CK (i.e., at the falling edges of the inverted clock signal ICK) as the first output signal Q1. In addition, when the scan enable signal SE has a logic 'low' level, the second flip-flop 600-2 may output a second input signal D2 latched at the rising edges of the clock signal CK (i.e., at the falling edges of the inverted clock signal ICK) as a second output signal Q2. On the other hand, when the scan enable signal SE has a logic 'high' level, the second flip-flop 600-2 may output the first output signal Q1 or a first inverted output signal IQ1 latched at the rising edges of the clock signal CK (i.e., at the falling edges of the inverted clock signal ICK) as the second output signal Q2. That is, the multi-bit flip-flop block 600 may operate the first flip-flop 600-1 and the second flip-flop 600-2 independently in a normal operation mode, but may operate the first flip-flop 600-1 and the second flip-flop 600-2 dependently in a scan test mode by directly coupling the first flip-flop 600-1 to the second flip-flop 600-2 or by coupling the first flip-flop 600-1 to the second flip-flop 600-2 via elements such as a buffer, an inverter, etc. As illustrated in FIG. 16, the first flip-flop 600-1 may include a first master latch part 620-1, a first slave latch part 640-1, and a first multiplexer part 680-1. The first flip-flop 600-1 may operate the first master latch part 620-1 and the first slave latch part 640-1 based on the clock signal CK and the inverted clock signal ICK. In addition, the second flip-flop 600-2 may include a second master latch part 620-2, a second slave latch part 640-2, and a second multiplexer part 680-2. The second flip-flop 600-2 may operate the second master latch part 620-2 and the second slave latch part 640-2 based on the clock signal CK and the inverted clock signal ICK. Since an operation (or, interaction) between the master latch part and the slave latch part in the flip-flops 600-1 through 600-n is described above, duplicated description will not be repeated. In example embodiments, the first and second flip-flops 600-1 and 600-2 may include a reset function and/or a set function. In some example embodiments, the first and second flip-flops 600-1 and 600-2 may further include a retention function.

Figure 17:
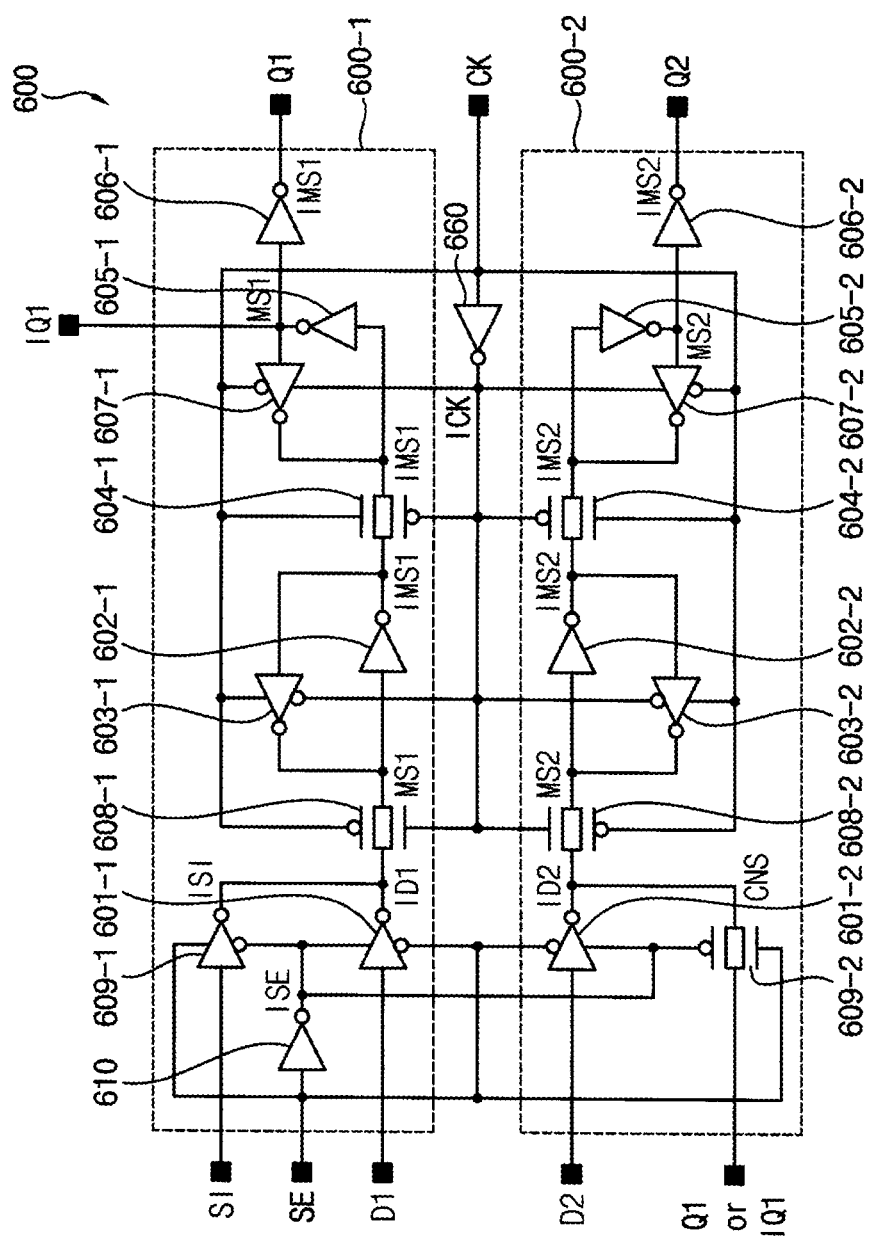
FIG. 17 is a circuit diagram illustrating another example of a multi-bit flip-flop block included in the scan chain circuit of the integrated circuit of FIG. 11.

FIG. 17 is a circuit diagram illustrating another example of a multi-bit flip-flop block included in the scan chain circuit of the integrated circuit of FIG. 11.

Referring to FIG. 17, the scan chain circuit 430 may include a plurality of multi-bit flip-flop blocks 600. Here, each of the multi-bit flip-flop blocks 600 may include a single inverter 660, a first flip-flop 600-1, and a second flip-flop 600-2. For convenience of description, only one multi-bit flip-flop block 600 is illustrated in FIG. 17. Here, the first flip-flop 600-1 may latch a first input signal D1 or a scan test signal SI at rising edges of a clock signal CK (i.e., at falling edges of an inverted clock signal ICK) to output the first input signal D1 or the scan test signal SI as a first output signal Q1, and the second flip-flop 600-2 may latch the first output signal Q1 or a first inverted output signal IQ1 at the rising edges of the clock signal CK (i.e., at the falling edges of the inverted clock signal ICK) to output the first output signal Q1 or the first inverted output signal IQ1 as a second output signal Q2. However, since a structure of the multi-bit flip-flop block 600 illustrated in FIG. 17 is an example, a structure of the multi-bit flip-flop block 600 is not limited thereto. Meanwhile, since an operation (or, interaction) between the first master latch part 620-1 and the first slave latch part 640-1 in the first flip-flop 600-1 and an operation between the second master latch part 620-2 and the second slave latch part 640-2 in the second flip-flop 600-2 are described above, duplicated description will not be repeated.

The first flip-flop 600-1 may include a selection inverter 610, a first input tri-state inverter 601-1, a first scan inverter 609-1, a first multiplexing transmission gate 608-1, a first master inverter 602-1, a first master latch tri-state inverter 603-1, a first transmission gate 604-1, a first slave inverter 605-1, a first output inverter 606-1, and a first slave latch tri-state inverter 607-1. The selection inverter 610 may be coupled to a scan enable signal input terminal through which the scan enable signal SE is input. The selection inverter 610 may invert the scan enable signal SE to output an inverted scan enable signal ISE. The first input tri-state inverter 601-1 may be coupled to a first signal input terminal through which the first input signal D1 is input. That is, the first input tri-state inverter 601-1 may be coupled between the first signal input terminal and the first multiplexing transmission gate 608-1. Here, the first input tri-state inverter 601-1 may invert the first input signal D1 to output a first inverted input signal ID1 when the inverted scan enable signal ISE has a logic 'high' level and the scan enable signal SE has a logic 'low' level. On the other hand, the first input tri-state inverter 601-1 may separate the first multiplexing transmission gate 608-1 from the first signal input terminal when the inverted scan enable signal ISE has a logic 'low' level and the scan enable signal SE has a logic 'high' level. The first scan tri-state inverter 609-1 may be coupled to the scan input terminal through which the scan test signal SI is input. That is, the first scan tri-state inverter 609-1 may be coupled between the scan input terminal and the first multiplexing transmission gate 608-1. Here, the first scan tri-state inverter 609-1 may invert the scan test signal SI to output the inverted scan test signal ISI when the scan enable signal SE has a logic 'high' level and the inverted scan enable signal ISE has a logic 'low' level. On the other hand, the first scan tri-state inverter 609-1 may separate the first multiplexing transmission gate 608-1 from the scan input terminal when the scan enable signal SE has a logic 'low' level and the inverted scan enable signal ISE has a logic 'high' level. The first multiplexing transmission gate 608-1 may be coupled to an output terminal of the first input tri-state inverter 601-1 and an output terminal of the first scan tri-state inverter 609-1. The first multiplexing transmission gate 608-1 may transmit the first inverted input signal ID1 or the inverted scan test signal ISI as a first multiplexing signal MS1 when the clock signal CK has a logic 'low' level and the inverted clock signal ICK has a logic 'high' level. On the other hand, the first multiplexing transmission gate 608-1 may separate the first master inverter 602-1 from the first input tri-state inverter 601-1 and the first scan tri-state inverter 609-1 when the clock signal CK has a logic 'high' level and the inverted clock signal ICK has a logic 'low' level. The first master inverter 602-1 may be coupled to an output terminal of the first multiplexing transmission gate 608-1. That is, the first master inverter 602-1 may be coupled between the first multiplexing transmission gate 608-1 and the first transmission gate 604-1. Here, the first master inverter 602-1 may invert the first multiplexing signal MS1 received from the first multiplexing transmission gate 608-1 to output a first inverted multiplexing signal IMS1. The first master latch tri-state inverter 603-1 may be coupled between an output terminal of the first master inverter 602-1 and an output terminal of the first multiplexing transmission gate 608-1. Here, the first master latch tri-state inverter 603-1 may invert the first inverted multiplexing signal IMS1 received from the first master inverter 602-1 to output the first multiplexing signal MS1 when the clock signal CK has a logic 'high' level and the inverted clock signal ICK has a logic 'low' level. On the other hand, the first master latch tri-state inverter 603-1 may separate the output terminal of the first multiplexing transmission gate 608-1 from the output terminal of the first master inverter 602-1 when the clock signal CK has a logic 'low' level and the inverted clock signal ICK has a logic 'high' level.

The first transmission gate 604-1 may be coupled to the output terminal of the first master inverter 602-1. That is, the first transmission gate 604-1 may be coupled between the first master inverter 602-1 and the first slave inverter 605-1. The first transmission gate 604-1 may transmit the first inverted multiplexing signal IMS1 received from the first master inverter 602-1 when the clock signal CK has a logic 'high' level and the inverted clock signal ICK has a logic 'low' level. On the other hand, the first transmission gate 604-1 may separate the first slave inverter 605-1 from the first master inverter 602-1 when the clock signal CK has a logic 'low' level and the inverted clock signal ICK has a logic 'high' level. The first slave inverter 605-1 may be coupled to an output terminal of the first transmission gate 604-1. That is, the first slave inverter 605-1 may be coupled between the first transmission gate 604-1 and the first output inverter 606-1. The first slave inverter 605-1 may invert the first inverted multiplexing signal IMS1 received from the first transmission gate 604-1 to output the first multiplexing signal MS1. The first output inverter 606-1 may be coupled to an output terminal of the first slave inverter 605-1. That is, the first output inverter 606-1 may be coupled between the first slave inverter 605-1 and a first signal output terminal through which the first output signal Q1 is output. The first output inverter 606-1 may invert the first multiplexing signal MS1 received from the first slave inverter 605-1 to output the first inverted multiplexing signal IMS1 as the first output signal Q1 through the first signal output terminal. The first slave latch tri-state inverter 607-1 may be coupled between an output terminal of the first slave inverter 605-1 and an output terminal of the first transmission gate 604-1. Here, the first slave latch tri-state inverter 607-1 may invert the first multiplexing signal MS1 received from the first slave inverter 605-1 to output the first inverted multiplexing signal IMS1 when the clock signal CK has a logic 'low' level and the inverted clock signal ICK has a logic 'high' level. On the other hand, the first slave latch tri-state inverter 607-1 may separate the output terminal of the first transmission gate 604-1 from the output terminal of the first slave inverter 605-1 when the clock signal CK has a logic 'high' level and the inverted clock signal ICK has a logic 'low' level.

The second flip-flop 600-2 may include a second input tri-state inverter 601-2, a second scan transmission gate 609-2, a second multiplexing transmission gate 608-2, a second master inverter 602-2, a second master latch tri-state inverter 603-2, a second transmission gate 604-2, a second slave inverter 605-2, a second output inverter 606-2, and a second slave latch tri-state inverter 607-2. The second input tri-state inverter 601-2 may be coupled to a second signal input terminal through which the second input signal D2 is input. That is, the second input tri-state inverter 601-2 may be coupled between the second signal input terminal and the second multiplexing transmission gate 608-2. Here, the second input tri-state inverter 601-2 may invert the second input signal D2 to output a second inverted input signal ID2 when the inverted scan enable signal ISE has a logic 'high' level and the scan enable signal SE has a logic 'low' level. On the other hand, the second input tri-state inverter 601-2 may separate the second multiplexing transmission gate 608-2 from the second signal input terminal when the inverted scan enable signal ISE has a logic 'low' level and the scan enable signal SE has a logic 'high' level. The second scan transmission gate 609-2 may receive the first output signal Q1 or the first inverted output signal IQ1. Here, the second scan transmission gate 609-2 may output a connection signal CNS corresponding to the first output signal Q1 or the first inverted output signal IQ1 when the scan enable signal SE has a logic 'high' level and the inverted scan enable signal ISE has a logic 'low' level. On the other hand, the second scan transmission gate 609-2 may not output the connection signal CNS corresponding to the first output signal Q1 or the first inverted output signal IQ1 when the scan enable signal SE has a logic 'low' level and the inverted scan enable signal ISE has a logic 'high' level. The second multiplexing transmission gate 608-2 may be coupled to an output terminal of the second input tri-state inverter 601-2 and an output terminal of the second scan transmission gate 609-2. The second multiplexing transmission gate 608-2 may transmit the second inverted input signal ID2 or the connection signal CNS as a second multiplexing signal MS2 when the clock signal CK has a logic 'low' level and the inverted clock signal ICK has a logic 'high' level. On the other hand, the second multiplexing transmission gate 608-2 may separate the second master inverter 602-2 from the second input tri-state inverter 601-2 and the second scan transmission gate 609-2 when the clock signal CK has a logic 'high' level and the inverted clock signal ICK has a logic 'low' level. The second master inverter 602-2 may be coupled to an output terminal of the second multiplexing transmission gate 608-2. That is, the second master inverter 602-2 may be coupled between the second multiplexing transmission gate 608-2 and the second transmission gate 604-2. Here, the second master inverter 602-2 may invert the second multiplexing signal MS2 received from the second multiplexing transmission gate 608-2 to output a second inverted multiplexing signal IMS2. The second master latch tri-state inverter 603-2 may be coupled between an output terminal of the second master inverter 602-2 and an output terminal of the second multiplexing transmission gate 608-2. Here, the second master latch tri-state inverter 603-2 may invert the second inverted multiplexing signal IMS2 received from the second master inverter 602-2 to output the second multiplexing signal MS2 when the clock signal CK has a logic 'high' level and the inverted clock signal ICK has a logic 'low' level. On the other hand, the second master latch tri-state inverter 603-2 may separate the output terminal of the second multiplexing transmission gate 608-2 from the output terminal of the second master inverter 602-2 when the clock signal CK has a logic 'low' level and the inverted clock signal ICK has a logic 'high' level.

The second transmission gate 604-2 may be coupled to the output terminal of the second master inverter 602-2. That is, the second transmission gate 604-2 may be coupled between the second master inverter 602-2 and the second slave inverter 605-2. The second transmission gate 604-2 may transmit the second inverted multiplexing signal IMS2 received from the second master inverter 602-2 when the clock signal CK has a logic 'high' level and the inverted clock signal ICK has a logic 'low' level. On the other hand, the second transmission gate 604-2 may separate the second slave inverter 605-2 from the second master inverter 602-2 when the clock signal CK has a logic 'low' level and the inverted clock signal ICK has a logic 'high' level. The second slave inverter 605-2 may be coupled to an output terminal of the second transmission gate 604-2. That is, the second slave inverter 605-2 may be coupled between the second transmission gate 604-2 and the second output inverter 606-2. The second slave inverter 605-2 may invert the second inverted multiplexing signal IMS2 received from the second transmission gate 604-2 to output the second multiplexing signal MS2. The second output inverter 606-2 may be coupled to an output terminal of the second slave inverter 605-2. That is, the second output inverter 606-2 may be coupled between the second slave inverter 605-2 and a second signal output terminal through which the second output signal Q2 is output. The second output inverter 606-2 may invert the second multiplexing signal MS2 received from the second slave inverter 605-2 to output the second inverted multiplexing signal IMS2 as the second output signal Q2 through the second signal output terminal. The second slave latch tri-state inverter 607-2 may be coupled between an output terminal of the second slave inverter 605-2 and an output terminal of the second transmission gate 604-2. Here, the second slave latch tri-state inverter 607-2 may invert the second multiplexing signal MS2 received from the second slave inverter 605-2 to output the second inverted multiplexing signal IMS2 when the clock signal CK has a logic 'low' level and the inverted clock signal ICK has a logic 'high' level. On the other hand, the second slave latch tri-state inverter 607-2 may separate the output terminal of the second transmission gate 604-2 from the output terminal of the second slave inverter 605-2 when the clock signal CK has a logic 'high' level and the inverted clock signal ICK has a logic 'low' level. Although it is illustrated in FIG. 17 that the selection inverter 610 is located in the first flip-flop 600-1, in some example embodiments, the selection inverter 610 may be located in the second flip-flop 600-2.

Figure 18:
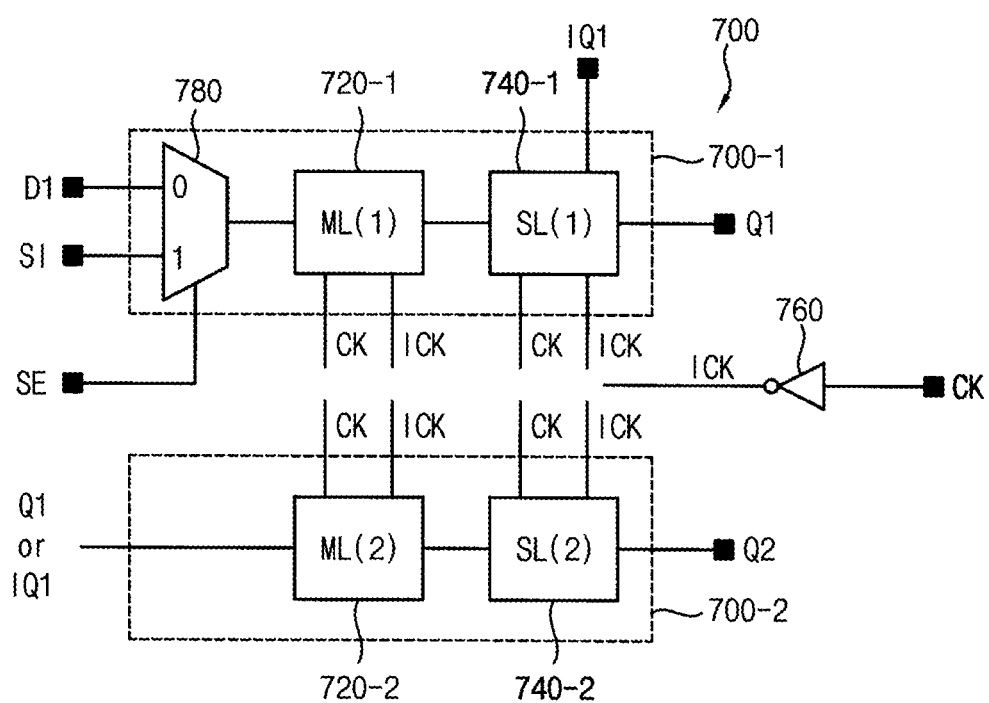
FIG. 18 is a block diagram illustrating still another example of a multi-bit flip-flop block included in the scan chain circuit of the integrated circuit of FIG. 11.

FIG. 18 is a block diagram illustrating still another example of a multi-bit flip-flop block included in the scan chain circuit of the integrated circuit of FIG. 11.

Referring to FIG. 18, the scan chain circuit 430 may include a plurality of multi-bit flip-flop blocks 700. Here, each of the multi-bit flip-flop blocks 700 may include a single inverter 760 and a plurality of flip-flops 700-1 through 700-n. In FIG. 18, only one multi-bit flip-flop block 700 is illustrated. The flip-flops 700-1 through 700-n may be triggered at rising edges of a clock signal CK. For convenience of description, it is illustrated in FIG. 18 that the multi-bit flip-flop block 700 includes the single inverter 760, the first flip-flop 700-1, and the second flip-flop 700-2. As illustrated in FIG. 18, the first flip-flop 700-1 may be coupled to the single inverter 760, and thus the first flip-flop 700-1 may receive the clock signal CK and an inverted clock signal ICK that is generated by inverting the clock signal CK. Here, when a scan enable signal SE has a logic 'low' level, the first flip-flop 700-1 may output a first input signal D1 latched at rising edges of the clock signal CK (i.e., at falling edges of the inverted clock signal ICK) as a first output signal Q1. On the other hand, when the scan enable signal SE has a logic 'high' level, the first flip-flop 700-1 may output a scan test signal SI latched at the rising edges of the clock signal CK (i.e., at the falling edges of the inverted clock signal ICK) as the first output signal Q1. The second flip-flop 700-2 may output the first output signal Q1 or a first inverted output signal IQ1 latched at the rising edges of the clock signal CK (i.e., at the falling edges of the inverted clock signal ICK) as a second output signal Q2. That is, the multi-bit flip-flop block 700 may operate the first flip-flop 700-1 and the second flip-flop 700-2 dependently in a normal operation mode and in a scan test mode by directly coupling the first flip-flop 700-1 to the second flip-flop 700-2 or by coupling the first flip-flop 700-1 to the second flip-flop 700-2 via elements such as a buffer, an inverter, etc. As illustrated in FIG. 18, the first flip-flop 700-1 may include a first master latch part 720-1, a first slave latch part 740-1, and a first multiplexer part 780. The first flip-flop 700-1 may operate the first master latch part 720-1 and the first slave latch part 740-1 based on the clock signal CK and the inverted clock signal ICK. In addition, the second flip-flop 700-2 may include a second master latch part 720-2 and a second slave latch part 740-2. The second flip-flop 700-2 may operate the second master latch part 720-2 and the second slave latch part 740-2 based on the clock signal CK and the inverted clock signal ICK. Since an operation (or, interaction) between the master latch part and the slave latch part in the flip-flops 700-1 through 700-n is described above, duplicated description will not be repeated. In example embodiments, the first and second flip-flops 700-1 and 700-2 may include a reset function and/or a set function. In some example embodiments, the first and second flip-flops 700-1 and 700-2 may further include a retention function.

Figure 19:
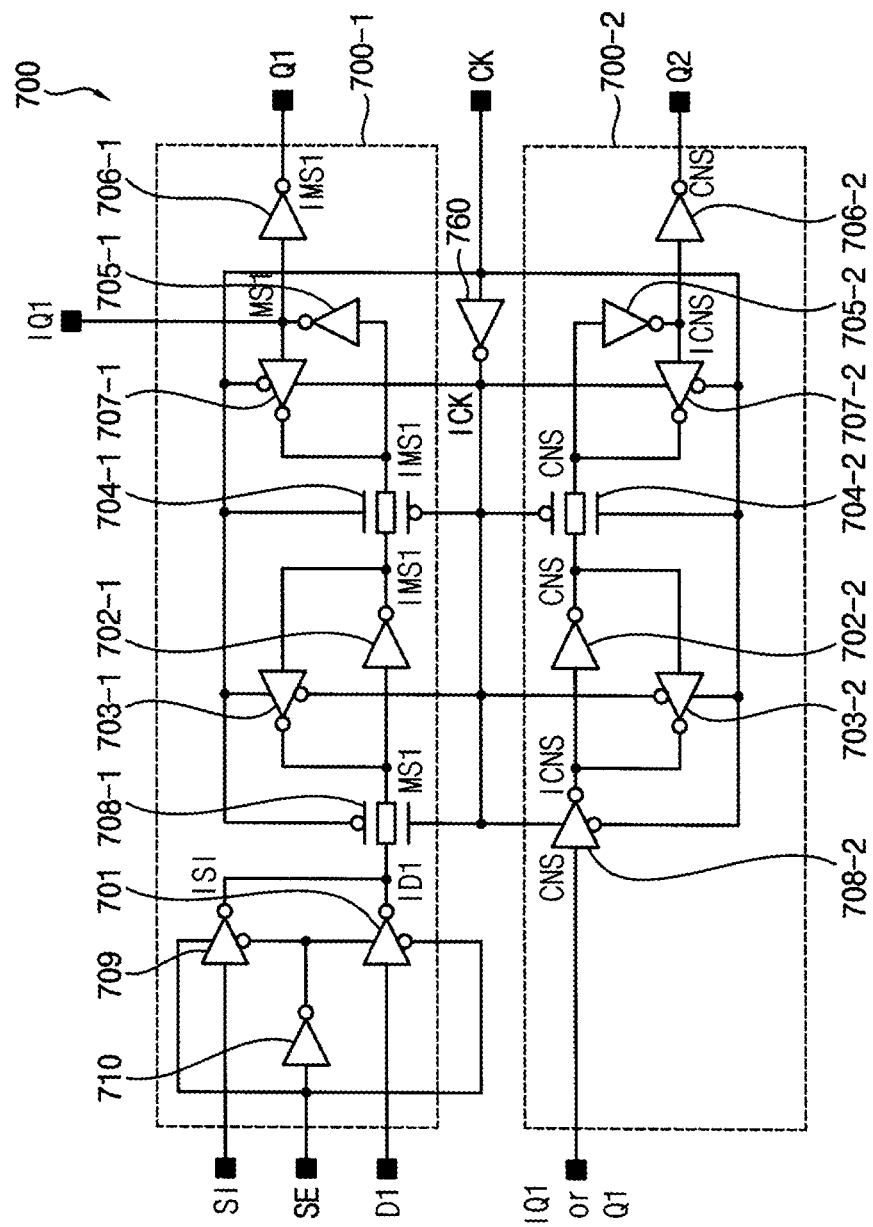
FIG. 19 is a circuit diagram illustrating still another example of a multi-bit flip-flop block included in the scan chain circuit of the integrated circuit of FIG. 11.

FIG. 19 is a circuit diagram illustrating still another example of a multi-bit flip-flop block included in the scan chain circuit of the integrated circuit of FIG. 11.

Referring to FIG. 19, the scan chain circuit 430 may include a plurality of multi-bit flip-flop blocks 700. Here, each of the multi-bit flip-flop blocks 700 may include a single inverter 760, a first flip-flop 700-1, and a second flip-flop 700-2. For convenience of description, only one multi-bit flip-flop block 700 is illustrated in FIG. 19. Here, the first flip-flop 700-1 may latch a first input signal D1 or a scan test signal SI at rising edges of a clock signal CK (i.e., at falling edges of an inverted clock signal ICK) to output the first input signal D1 or the scan test signal SI as a first output signal Q1, and the second flip-flop 700-2 may latch the first output signal Q1 or a first inverted output signal IQ1 at the rising edges of the clock signal CK (i.e., at the falling edges of the inverted clock signal ICK) to output the first output signal Q1 or the first inverted output signal IQ1 as a second output signal Q2. However, since a structure of the multi-bit flip-flop block 700 illustrated in FIG. 19 is an example, a structure of the multi-bit flip-flop block 700 is not limited thereto. Meanwhile, since an operation (or, interaction) between the first master latch part 720-1 and the first slave latch part 740-1 in the first flip-flop 700-1 and an operation between the second master latch part 720-2 and the second slave latch part 740-2 in the second flip-flop 700-2 are described above, duplicated description will not be repeated.

The first flip-flop 700-1 may include a selection inverter 710, a first input tri-state inverter 701, a first scan tri-state inverter 709, a first multiplexing transmission gate 708-1, a first master inverter 702-1, a first master latch tri-state inverter 703-1, a first transmission gate 704-1, a first slave inverter 705-1, a first output inverter 706-1, and a first slave latch tri-state inverter 707-1. The selection inverter 710 may be coupled to a scan enable signal input terminal through which the scan enable signal SE is input. The selection inverter 710 may invert the scan enable signal SE to output an inverted scan enable signal ISE. The first input tri-state inverter 701 may be coupled to a first signal input terminal through which the first input signal D1 is input. That is, the first input tri-state inverter 701 may be coupled between the first signal input terminal and the first multiplexing transmission gate 708-1. Here, the first input tri-state inverter 701 may invert the first input signal D1 to output a first inverted input signal ID1 when the inverted scan enable signal ISE has a logic 'high' level and the scan enable signal SE has a logic 'low' level. On the other hand, the first input tri-state inverter 701 may separate the first multiplexing transmission gate 708-1 from the first signal input terminal when the inverted scan enable signal ISE has a logic 'low' level and the scan enable signal SE has a logic 'high' level. The first scan tri-state inverter 709 may be coupled to the scan input terminal through which the scan test signal SI is input. That is, the first scan tri-state inverter 709 may be coupled between the scan input terminal and the first multiplexing transmission gate 708-1. Here, the first scan tri-state inverter 709 may invert the scan test signal SI to output the inverted scan test signal ISI when the scan enable signal SE has a logic 'high' level and the inverted scan enable signal ISE has a logic 'low' level. On the other hand, the first scan tri-state inverter 709 may separate the first multiplexing transmission gate 708-1 from the scan input terminal when the scan enable signal SE has a logic 'low' level and the inverted scan enable signal ISE has a logic 'high' level. The first multiplexing transmission gate 708-1 may be coupled to an output terminal of the first input tri-state inverter 701 and an output terminal of the first scan tri-state inverter 709. The first multiplexing transmission gate 708-1 may transmit the first inverted input signal ID1 or the inverted scan test signal ISI as a first multiplexing signal MS1 when the clock signal CK has a logic 'low' level and the inverted clock signal ICK has a logic 'high' level. On the other hand, the first multiplexing transmission gate 708-1 may separate the first master inverter 702-1 from the first input tri-state inverter 701 and the first scan tri-state inverter 709 when the clock signal CK has a logic 'high' level and the inverted clock signal ICK has a logic 'low' level. The first master inverter 702-1 may be coupled to an output terminal of the first multiplexing transmission gate 708-1. That is, the first master inverter 702-1 may be coupled between the first multiplexing transmission gate 708-1 and the first transmission gate 704-1. Here, the first master inverter 702-1 may invert the first multiplexing signal MS1 received from the first multiplexing transmission gate 708-1 to output a first inverted multiplexing signal IMS1. The first master latch tri-state inverter 703-1 may be coupled between an output terminal of the first master inverter 702-1 and an output terminal of the first multiplexing transmission gate 708-1. Here, the first master latch tri-state inverter 703-1 may invert the first inverted multiplexing signal IMS1 received from the first master inverter 702-1 to output the first multiplexing signal MS1 when the clock signal CK has a logic 'high' level and the inverted clock signal ICK has a logic 'low' level. On the other hand, the first master latch tri-state inverter 703-1 may separate the output terminal of the first multiplexing transmission gate 708-1 from the output terminal of the first master inverter 702-1 when the clock signal CK has a logic 'low' level and the inverted clock signal ICK has a logic 'high' level.

The first transmission gate 704-1 may be coupled to the output terminal of the first master inverter 702-1. That is, the first transmission gate 704-1 may be coupled between the first master inverter 702-1 and the first slave inverter 705-1. The first transmission gate 704-1 may transmit the first inverted multiplexing signal IMS1 received from the first master inverter 702-1 when the clock signal CK has a logic 'high' level and the inverted clock signal ICK has a logic 'low' level. On the other hand, the first transmission gate 704-1 may separate the first slave inverter 705-1 from the first master inverter 702-1 when the clock signal CK has a logic 'low' level and the inverted clock signal ICK has a logic 'high' level. The first slave inverter 705-1 may be coupled to an output terminal of the first transmission gate 704-1. That is, the first slave inverter 705-1 may be coupled between the first transmission gate 704-1 and the first output inverter 706-1. The first slave inverter 705-1 may invert the first inverted multiplexing signal IMS1 received from the first transmission gate 704-1 to output the first multiplexing signal MS1. The first output inverter 706-1 may be coupled to an output terminal of the first slave inverter 705-1. That is, the first output inverter 706-1 may be coupled between the first slave inverter 705-1 and a first signal output terminal through which the first output signal Q1 is output. The first output inverter 706-1 may invert the first multiplexing signal MS1 received from the first slave inverter 705-1 to output the first inverted multiplexing signal IMS1 as the first output signal Q1 through the first signal output terminal. The first slave latch tri-state inverter 707-1 may be coupled between an output terminal of the first slave inverter 705-1 and an output terminal of the first transmission gate 704-1. Here, the first slave latch tri-state inverter 707-1 may invert the first multiplexing signal MS1 received from the first slave inverter 705-1 to output the first inverted multiplexing signal IMS1 when the clock signal CK has a logic 'low' level and the inverted clock signal ICK has a logic 'high' level. On the other hand, the first slave latch tri-state inverter 707-1 may separate the output terminal of the first transmission gate 704-1 from the output terminal of the first slave inverter 705-1 when the clock signal CK has a logic 'high' level and the inverted clock signal ICK has a logic 'low' level.

The second flip-flop 700-2 may include a second connection tri-state inverter 708-2, a second master inverter 702-2, a second master latch tri-state inverter 703-2, a second transmission gate 704-2, a second slave inverter 705-2, a second output inverter 706-2, and a second slave latch tri-state inverter 707-2. The second connection tri-state inverter 708-2 may receive the first output signal Q1 or the first inverted output signal IQ1. Here, the second connection tri-state inverter 708-2 may invert the connection signal CNS corresponding to the first output signal Q1 or the first inverted output signal IQ1 to output an inverted connection signal ICNS when the clock signal CK has a logic 'low' level and the inverted clock signal ICK has a logic 'high' level. On the other hand, the second connection tri-state inverter 708-2 may not output the inverted connection signal ICNS when the clock signal CK has a logic 'high' level and the inverted clock signal ICK has a logic 'low' level. The second master inverter 702-2 may be coupled to an output terminal of the second connection tri-state inverter 708-2. That is, the second master inverter 702-2 may be coupled between the second connection tri-state inverter 708-2 and the second transmission gate 704-2. Here, the second master inverter 702-2 may invert the inverted connection signal ICNS received from the second connection tri-state inverter 708-2 to output the connection signal CNS. The second master latch tri-state inverter 703-2 may be coupled between an output terminal of the second master inverter 702-2 and an output terminal of the second connection tri-state inverter 708-2. Here, the second master latch tri-state inverter 703-2 may invert the connection signal CNS received from the second master inverter 702-2 to output the inverted connection signal ICNS when the clock signal CK has a logic 'high' level and the inverted clock signal ICK has a logic 'low' level. On the other hand, the second master latch tri-state inverter 703-2 may separate the output terminal of the second connection tri-state inverter 708-2 from the output terminal of the second master inverter 702-2 when the clock signal CK has a logic 'low' level and the inverted clock signal ICK has a logic 'high' level.

The second transmission gate 704-2 may be coupled to the output terminal of the second master inverter 702-2. That is, the second transmission gate 704-2 may be coupled between the second master inverter 702-2 and the second slave inverter 705-2. The second transmission gate 704-2 may transmit the connection signal CNS received from the second master inverter 702-2 when the clock signal CK has a logic 'high' level and the inverted clock signal ICK has a logic 'low' level. On the other hand, the second transmission gate 704-2 may separate the second slave inverter 705-2 from the second master inverter 702-2 when the clock signal CK has a logic 'low' level and the inverted clock signal ICK has a logic 'high' level. The second slave inverter 705-2 may be coupled to an output terminal of the second transmission gate 704-2. That is, the second slave inverter 705-2 may be coupled between the second transmission gate 704-2 and the second output inverter 706-2. The second slave inverter 705-2 may invert the connection signal CNS received from the second transmission gate 704-2 to output the inverted connection signal ICNS. The second output inverter 706-2 may be coupled to an output terminal of the second slave inverter 705-2. That is, the second output inverter 706-2 may be coupled between the second slave inverter 705-2 and a second signal output terminal through which the second output signal Q2 is output. The second output inverter 706-2 may invert the inverted connection signal ICNS received from the second slave inverter 705-2 to output the connection signal CNS as the second output signal Q2 through the second signal output terminal. The second slave latch tri-state inverter 707-2 may be coupled between an output terminal of the second slave inverter 705-2 and an output terminal of the second transmission gate 704-2. Here, the second slave latch tri-state inverter 707-2 may invert the inverted connection signal ICNS received from the second slave inverter 705-2 to output the connection signal CNS when the clock signal CK has a logic 'low' level and the inverted clock signal ICK has a logic 'high' level. On the other hand, the second slave latch tri-state inverter 707-2 may separate the output terminal of the second transmission gate 704-2 from the output terminal of the second slave inverter 705-2 when the clock signal CK has a logic 'high' level and the inverted clock signal ICK has a logic 'low' level. As described above, since each of the multi-bit flip-flop blocks 700 includes the first flip-flop 700-1 and the second flip-flop 700-2 that are directly coupled or that are coupled via at least one buffer, at least one inverter, etc., each of the multi-bit flip-flop blocks 700 may be applied to a synchronizer or a structure including no logical elements other than the buffer or the inverter between the first flip-flop 700-1 and the second flip-flop 700-2. Thus, the scan chain circuit 430 including the multi-bit flip-flop blocks 700 may reduce power consumption. In addition, the scan chain circuit 430 may reduce a chip size (or, a chip area) of an integrated circuit (e.g., system on-chip) including the scan chain circuit 430.

Figure 20:
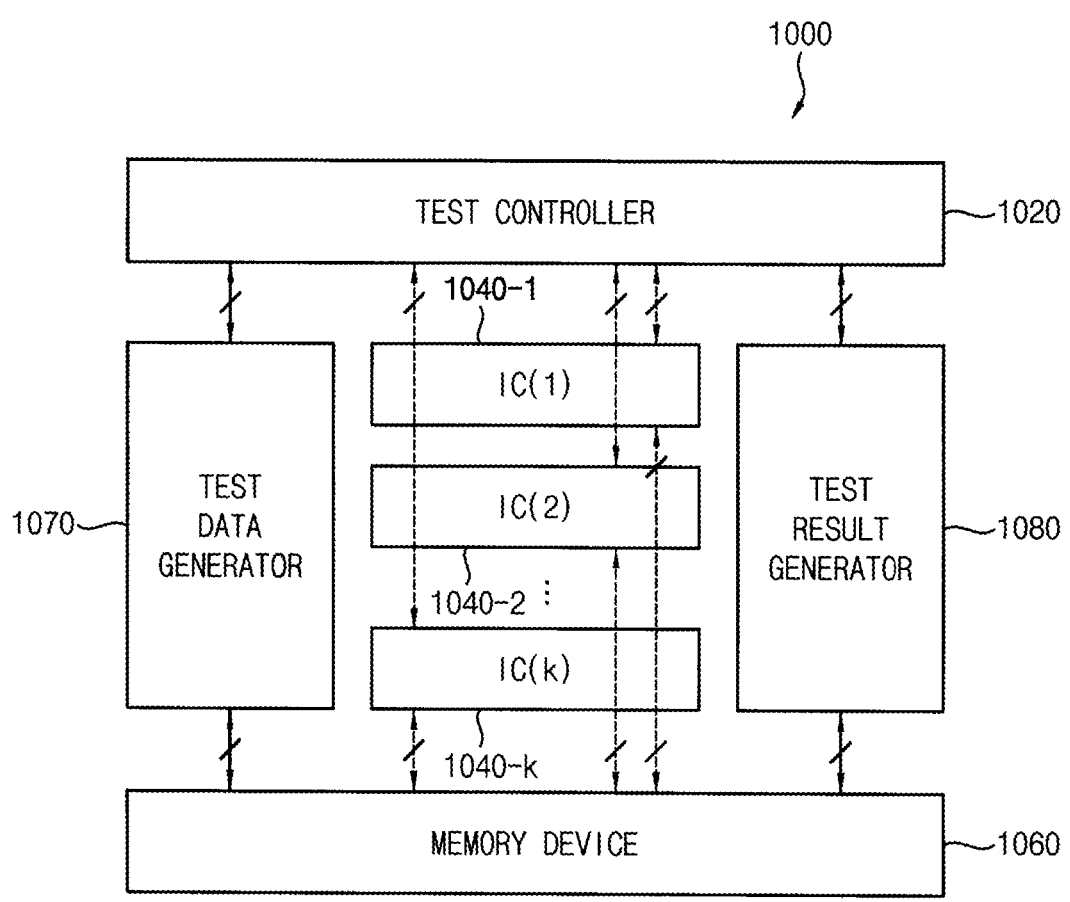
FIG. 20 is a block diagram illustrating an integrated circuit testing system according to example embodiments.

FIG. 20 is a block diagram illustrating an integrated circuit testing system according to example embodiments.

Referring to FIG. 20, the integrated circuit testing system 1000 may include a test controller 1020, first through (k)th integrated circuits 1040-1 through 1040-k, a memory device 1060, a test data generator 1070, and a test result generator 1080, where k is an integer greater than or equal to 1. Each of the first through (k)th integrated circuits 1040-1 through 1040-k may include a combinational logic circuit and a scan chain circuit. Here, the combinational logic circuit may include a plurality of flip-flops, and the flip-flops may form a scan path by being coupled to the combinational logic circuit. In some example embodiments, each of the first through (k)th integrated circuits 1040-1 through 1040-k may be implemented as a system on-chip.

The test controller 1020 may control a scan test for each of the first through (k)th integrated circuits 1040-1 through 1040-k by controlling the first through (k)th integrated circuits 1040-1 through 1040-k, the memory device 1060, the test data generator 1070, and the test result generator 1080. The integrated circuit testing system 1000 may perform the scan test for each of the first through (k)th integrated circuits 1040-1 through 1040-k by performing a shift-in operation that sequentially loads a test pattern on the scan chain circuit, by performing a capture operation that stores an observation value of the combinational logic circuit in the scan chain circuit, where the observation value is generated based on the test pattern loaded on the scan chain circuit, and by performing a shift-out operation that sequentially outputs the observation value stored in the scan chain circuit. The scan chain circuit included in each of the first through (k)th integrated circuits 1040-1 through 1040-k may include a plurality of multi-bit flip-flop blocks that share a clock signal. Each of the multi-bit flip-flop blocks may include a plurality of flip-flops and a single inverter that provides the clock signal and an inverted clock signal for driving the flip-flops, where the inverted clock signal is generated by inverting the clock signal. Here, the flip-flops of the scan chain circuit included in each of the first through (k)th integrated circuits 1040-1 through 1040-k may be triggered at rising edges of the clock signal (i.e., at falling edges of the inverted clock signal). Since these operations and structures are described above, duplicated description will not be repeated.

In the integrated circuit testing system 1000, the memory device 1060 may store data for the scan test. Specifically, the memory device 1060 may store the test pattern that is generated by the test data generator 1070 and that is applied to the scan chain circuit included in each of the first through (k)th integrated circuits 1040-1 through 1040-k, the observation value of the combinational logic circuit that is generated based on the test pattern, a reference pattern that is compared with the observation value, a test result (i.e., a comparison result between the observation value and the reference pattern) that is output from the test result generator 1080, etc. For example, the memory device 1060 may include a volatile semiconductor memory device such as a dynamic random access memory (DRAM) device, a static random access memory (SRAM) device, a mobile DRAM device, etc., and/or a non-volatile semiconductor memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc. In some example embodiments, the integrated circuit testing system 1000 may further include a storage device such as a solid state drive (SSD) device, a hard disk drive (HDD) device, a CD-ROM device, etc.

The test data generator 1070 may generate the test pattern that is applied to the scan chain circuit included in each of the first through (k)th integrated circuits 1040-1 through 1040-k. The test result generator 1080 may generate the test result by comparing the observation value output from each of the first through (k)th integrated circuits 1040-1 through 1040-k with the reference pattern. As described above, the observation value may be generated by performing the shift-in operation that sequentially loads the test pattern on the scan chain circuit, by performing the capture operation that stores the observation value of the combinational logic circuit in the scan chain circuit, and by performing the shift-out operation that sequentially outputs the observation value stored in the scan chain circuit. For example, when the observation value is consistent with the reference pattern, the test result generator 1080 may output the test result indicating that no defect exists in the combinational logic circuit. On the other hand, when the observation value is inconsistent with the reference pattern, the test result generator 1080 may output the test result indicating that a defect exists in the combinational logic circuit. In some example embodiments, to obtain a more accurate test result, the integrated circuit testing system 1000 may perform the scan test for each of the first through (k)th integrated circuits 1040-1 through 1040-k several times. Although a multi-bit flip-flop, a scan chain circuit, and an integrated circuit testing system according to example embodiments are described with reference to FIGS. 1 through 20, the multi-bit flip-flop, the scan chain circuit, and the integrated circuit testing system are not limited thereto. That is, many modifications of the multi-bit flip-flop, the scan chain circuit, and the integrated circuit testing system are possible without materially departing from the novel teachings and advantages of the present inventive concepts.

The present inventive concepts may be applied to a multi-bit flip-flop, a scan chain circuit, and an integrated circuit (e.g., a system on-chip, etc.) including the multi-bit flip-flop and the scan chain circuit. For example, the present inventive concepts may be applied to various integrated circuits included in a computer, a workstation, a laptop, a game console, a cellular phone, a smart phone, a smart pad, a tablet PC, a personal digital assistants (PDA), a portable multimedia player (PMP), an MP3 player, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A device comprising:
   a plurality of multi-bit flip-flop blocks, each of the plurality of multi-bit flip-flop blocks including,
      a single inverter configured to receive a clock signal and to generate an inverted clock signal, and
      a plurality of flip-flops configured to operate based on the clock signal and the inverted clock signal, each of the plurality of flip-flops including a master latch, a slave latch, and a transmission gate, each master latch included in the plurality of multi-bit flip-flop blocks configured to directly receive the clock signal, and each slave latch included in the plurality of multi-bit flip-flop blocks configured to directly receive the clock signal, the master latch including a master latch tri-state inverter, the slave latch including a slave latch tri-state inverter, the transmission gate coupled between the master latch tri-state inverter and the slave latch tri-state inverter, wherein
      each of the plurality of multi-bit flip-flop block includes only one inverter that receives the clock signal and generates the inverted clock signal, and
      the master latch tri-state inverter, the slave latch tri-state inverter, and the transmission gate are controlled by the inverted clock signal generated from the single inverter.

2. The device of claim 1, wherein
   each master latch included in the plurality of multi-bit flip-flop blocks directly receives the inverted clock signal, and
   each slave latch included in the plurality of multi-bit flip-flop blocks directly receives the inverted clock signal.

3. The device of claim 1, wherein
   each master latch included in the plurality of multi-bit flip-flop blocks directly receives the clock signal that does not pass through the single inverter, and
   each slave latch included in the plurality of multi-bit flip-flop blocks directly receives the clock signal that does not pass through the single inverter.

4. The device of claim 1, wherein the device is applied to a chip having low power and high performance.

5. The device of claim 1, wherein each of the plurality of flip-flops includes a multiplexer.

6. The device of claim 1, wherein
   the plurality of flip-flops includes a first flip-flop and a second flip-flop,
   the first flip-flop includes a multiplexer, and
   the second flip-flop does not include a multiplexer.

7. The device of claim 1, wherein
   the plurality of flip-flops includes a first flip-flop and a second flip-flop, and
   the first flip-flop is directly coupled to the second flip-flop, or is coupled to the second flip-flop via at least one buffer or at least one inverter located between the first flip-flop and the second flip-flop.

8. A device comprising:
   a single inverter configured to receive a clock signal, and to generate an inverted clock signal;
   a first flip-flop configured to operate based on the clock signal and the inverted clock signal, the first flip-flop including a first master latch, a first slave latch, and a first transmission gate, the first slave latch configured to directly receive the clock signal, the first master latch including a first master latch tri-state inverter, the first slave latch including a first slave latch tri-state inverter, and the first transmission gate coupled between the first master latch tri-state inverter and the first slave latch tri-state inverter such that the first master latch tri-state inverter, the first slave latch tri-state inverter, and the first transmission gate are controlled by the inverted clock signal generated from the single inverter; and
   a second flip-flop configured to operate based on the clock signal and the inverted clock signal, the second flip-flop including a second master latch, a second slave latch, and a second transmission gate, the second slave latch configured to directly receive the clock signal, the second master latch including a second master latch tri-state inverter, the second slave latch including a second slave latch tri-state inverter, the second transmission gate coupled between the first master latch tri-state inverter and the first slave latch tri-state inverter such that the second master latch tri-state inverter, the second slave latch tri-state inverter, and the second transmission gate are controlled by the inverted clock signal generated from the single inverter.

9. The device of claim 8, wherein
   each of the first master latch and the second master latch directly receives the inverted clock signal, and
   each of the first slave latch and the second slave latch directly receives the inverted clock signal.

10. The device of claim 8, wherein
    each of the first master latch and the second master latch directly receives the clock signal that does not pass through the single inverter, and
    each of the first slave latch and the second slave latch directly receives the clock signal that does not pass through the single inverter.

11. The device of claim 8, wherein the device is applied to a chip having low power and high performance.

12. The device of claim 8, wherein each of the first flip-flop and the second flip-flop includes a multiplexer.

13. The device of claim 8, wherein
    the first flip-flop includes a multiplexer, and
    the second flip-flop does not include a multiplexer.

14. A device comprising:
    a single inverter configured to receive a clock signal, and to generate an inverted clock signal;
    a first flip-flop configured to operate based on the clock signal and the inverted clock signal, the first flip-flop including a first master latch, a first slave latch, a first transmission gate, and a first multiplexer, the first master latch including a first master latch tri-state inverter, the first slave latch including a first slave latch tri-state inverter, the first transmission gate coupled between the first master latch tri-state inverter and the first slave latch tri-state inverter such that the first master latch tri-state inverter, the first slave latch tri-state inverter, and the first transmission gate are controlled by the inverted clock signal generated from the single inverter; and
    a second flip-flop configured to operate based on the clock signal and the inverted clock signal, the second flip-flop including a second master latch, a second slave latch, and a second transmission gate, the second master latch including a second master latch tri-state inverter, the second slave latch including a second slave latch tri-state inverter, the second transmission gate coupled between the second master latch tri-state inverter and the second slave latch tri-state inverter such that the second master latch tri-state inverter, the second slave latch tri-state inverter, and the second transmission gate are controlled by the inverted clock signal generated from the single inverter.

15. The device of claim 14, wherein the second flip-flop does not include a multiplexer.

16. The device of claim 14, wherein the second flip-flop includes a second multiplexer.

17. The device of claim 14, wherein the device is applied to a semiconductor chip.

18. The device of claim 14, wherein
each of the first master latch and the second master latch directly receives the clock signal, and
each of the first slave latch and the second slave latch directly receives the clock signal.

19. The device of claim 14, wherein
each of the first master latch and the second master latch directly receives the inverted clock signal, and
each of the first slave latch and the second slave latch directly receives the inverted clock signal.

* * * * *